(12) United States Patent
Yanagita et al.

(10) Patent No.: US 6,521,078 B2
(45) Date of Patent: Feb. 18, 2003

(54) SAMPLE SEPARATING APPARATUS AND METHOD, AND SUBSTRATE MANUFACTURING METHOD

(75) Inventors: Kazutaka Yanagita, Yokohama (JP); Takao Yonehara, Atsugi (JP); Kazuaki Omi, Yokohama (JP); Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/151,527

(22) Filed: May 20, 2002

(65) Prior Publication Data

US 2002/0134504 A1 Sep. 26, 2002

Related U.S. Application Data

(62) Division of application No. 09/211,757, filed on Dec. 15, 1998, now Pat. No. 6,418,999.

(30) Foreign Application Priority Data

Dec. 26, 1997 (JP) .............................. 9-361012
Dec. 26, 1997 (JP) .............................. 9-361016
Feb. 26, 1998 (JP) .......................... 10-045308

(51) Int. Cl.⁷ ..................... B32B 35/00; H01L 21/425
(52) U.S. Cl. .................. 156/344; 156/584; 269/21; 438/458; 83/177; 29/426.4
(58) Field of Search ................ 156/239, 344, 156/529, 584; 83/177; 29/426.4, 426.5, 762; 438/455, 458

(56) References Cited

U.S. PATENT DOCUMENTS 4,466,852 A  8/1984  Beltz et al.
5,131,968 A  7/1992  Wells et al. ................ 156/153
5,213,451 A  5/1993  Frank et al.

(List continued on next page.)

FOREIGN PATENT DOCUMENTS

| DE | 4341870 A1 | 6/1994 |
| EP | 0757377 A2 | 2/1997 |
| EP | 0 793 263 | 9/1997 |
| EP | 0 867 917 | 9/1998 |
| EP | 0 867 920 | 9/1998 |
| JP | 2-106300 | 4/1990 |
| JP | 06246576 A | 9/1994 |
| JP | 06285845 A | 10/1994 |
| JP | 7122529 A | 5/1995 |
| JP | 9-167724 | 6/1997 |
| WO | WO 81/02948 | 10/1981 |
| WO | WO 98/52216 | 11/1998 |

OTHER PUBLICATIONS

European Search Report, dated Apr. 27, 1999.
Communication from Austrian Patent Office Service and Information Sector (TRF): cover sheet, General Observations, Search Report (three sheets), and Examination Report.
Chinese Office Action dated Sep. 20, 2002.
Translation of Chinese Office Action dated Sep. 20, 2002.

*Primary Examiner*—Mark A. Osele
(74) *Attorney, Agent, or Firm*—Morgan & Finnegan, LLP

(57) ABSTRACT

This invention is to provide an apparatus for separating a substrate having a porous layer at the porous layer. A bonded substrate stack (101) having a porous layer (10*b*) is supported by substrate holding portions (120, 150) while being rotated. High-speed, high-pressure water (jet) is ejected from a nozzle (102), so the jet is injected into the bonded substrate stack (101). The substrate holding portions (120, 150) hold the bonded substrate stack (101) such that the bonded substrate stack (101) can expand at its central portion due to the pressure of the injected water. This efficiently applies a force (separation force) that acts outward from the inside of the bonded substrate stack (101).

40 Claims, 36 Drawing Sheets

U.S. PATENT DOCUMENTS

| | | |
|---|---|---|
| 5,371,037 A | 12/1994 | Yonehara |
| 5,374,564 A | 12/1994 | Bruel |
| 5,417,607 A | 5/1995 | Raghavan |
| 5,447,596 A | 9/1995 | Hayase ................ 156/584 |
| 5,783,022 A | 7/1998 | Cha et al. ............ 156/344 |
| 5,811,348 A | 9/1998 | Matsushita et al. |
| 5,856,229 A | 1/1999 | Sakaguchi et al. |
| 5,863,830 A | 1/1999 | Bruel et al. |
| 5,961,053 A | 10/1999 | Raghavan |
| 5,966,620 A | 10/1999 | Sakaguchi et al. |
| 5,994,207 A | 11/1999 | Henley et al. |
| 6,019,298 A | 2/2000 | Raghavan |
| 6,100,166 A | 8/2000 | Sakaguchi et al. |
| 6,133,112 A | 10/2000 | Iwane et al. |
| 6,294,478 B1 * | 9/2001 | Sakaguchi et al. ......... 148/33.2 |
| 6,382,292 B1 * | 5/2002 | Ohmi et al. ............... 156/239 |
| 6,427,747 B1 * | 8/2002 | Omi et al. ................ 134/137 |

\* cited by examiner

FIG. 47
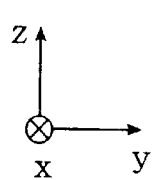
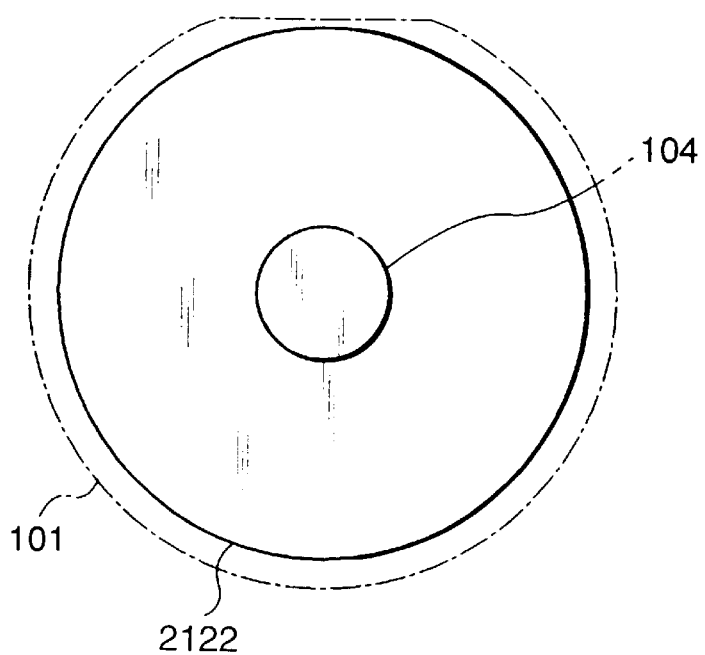
FIG. 48
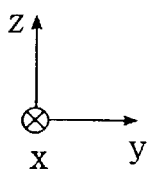
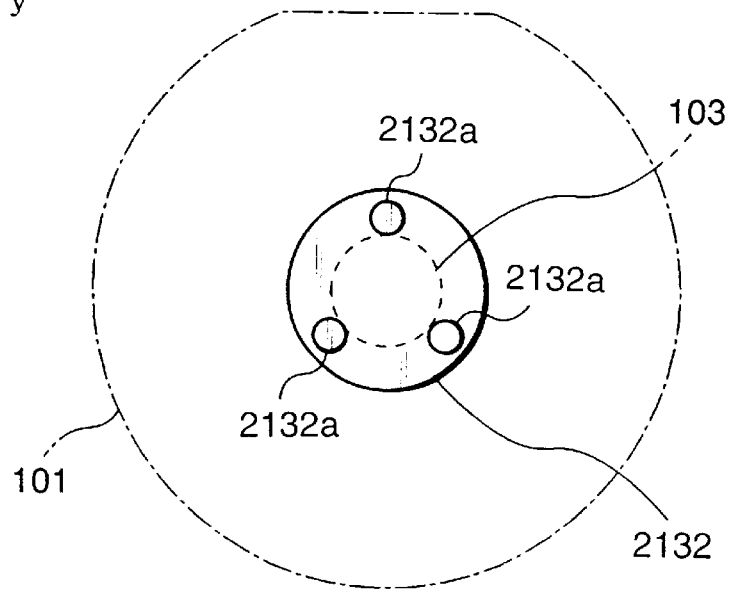

SAMPLE SEPARATING APPARATUS AND METHOD, AND SUBSTRATE MANUFACTURING METHOD

This application is a divisional of U.S. Ser. No. 09/211,757 filed Dec. 15, 1998, now U.S. Pat. No. 6,418,999.

BACKGROUND OF THE INVENTION

1. Field of the Invention

The present invention relates to a sample separating apparatus and method, and a substrate manufacturing method and, for example, to an apparatus and method of separating a plate-like sample having an internal fragile layer at the fragile layer, a sample support apparatus used in the separating apparatus, and a substrate manufacturing method using the separating apparatus.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.
(2) The radiation resistance can be increased.
(3) The operating speed of the device can be increased because the stray capacitance is small.
(4) No well step is necessary.
(5) Latch-up can be prevented.
(6) A completely depleted field-effect transistor can be formed by thin film formation.

Since an SOI structure has the above various advantages, researches have been made on its formation method for several decades.

As one SOI technology, an SOS (Silicon On Sapphire) technology by which Si is heteroepitaxially grown on a single-crystal sapphire substrate by CVD (Chemical Vapor Deposition) has been known for a long time. This SOS technology was once recognized as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Various SOI technology appeared following the SOS technology. For these SOI technologies, various methods have been examined aiming at reducing crystal defects or manufacturing cost. There are a method of implanting oxygen ions into a substrate to form a buried oxide layer, a method of bonding two wafers via an oxide film and polishing or etching one of the wafers to leave a thin single-crystal Si layer on the oxide film, and a method of implanting hydrogen ions to a predetermined depth from the surface of an Si substrate having an oxide film, bonding the Si substrate to the other substrate, and peeling the latter substrate (the other substrate) by a heat treatment while leaving a thin single-crystal Si layer on the oxide film.

The present applicant has disclosed a new SOI technology in Japanese Patent Laid-Open No. 5-21338. In this technology, a first substrate obtained by forming a non-porous single-crystal layer (including a single-crystal Si layer) on a single-crystal semiconductor substrate having a porous layer is bonded to a second substrate via an insulating layer ($SiO_2$), and the two substrates are separated from the porous layer to transfer the non-porous single-crystal layer to the second substrate. This technology is advantageous in that the SOI layer has high film thickness uniformity, the crystal defect density in the SOI layer can be decreased, the SOI layer has high surface planarity, no expensive special fabrication apparatus is necessary, and SOI substrates having SOI films about a few hundred ~ to 10 $\mu$m thick can be fabricated by the same fabrication apparatus.

In addition, the present applicant has disclosed another technology in Japanese Patent Laid-Open No. 7-302889 in which, after the first and second substrates described above are bonded, the first substrate is separated from the second substrate without breaking, and the separated first substrate is reused by smoothening the surface and again forming a porous layer. Since the first substrate can be economically used, this technology has the advantages that the fabrication cost can be largely reduced and the fabrication process is also simple.

In the above technologies, however, when the two bonded substrates are separated it is necessary to prevent damages to the substrates and protect the fabrication apparatus and the like from contamination caused by the generation of particles.

SUMMARY OF THE INVENTION

The present invention has been made in consideration of the above situation, and has as its object to provide a separating apparatus and method suitable to separate a sample such as a substrate, a sample support apparatus used in this separating apparatus, and a substrate manufacturing method using the separating apparatus.

According to the present invention, there is provided a separating apparatus for separating a plate-like sample having an internal fragile layer at the fragile layer, characterized by comprising a jet unit for ejecting a fluid to the sample, and a pair of holding portions opposing each other to sandwich and hold the sample, wherein the pair of holding portions hold the sample to allow the sample to expand at a vicinity of a central portion due to a pressure of the fluid ejected from the jet unit and injected into the sample.

According to the present invention, there is also provided a separating apparatus for separating a plate-like sample having an internal fragile layer at the fragile layer, characterized by comprising a jet unit for ejecting a fluid to the sample, and a pair of holding portions opposing each other to sandwich and hold the sample, wherein the pair of holding portions hold the sample which can corrugate due to a pressure of the fluid ejected from the jet unit and injected into the sample.

In the separating apparatus, preferably, at least one of the pair of holding portions has a hollow contact portion, and the sample is held by bringing the contact portion into contact with the sample. The contact portion may comprise a multiple of contact portions.

In the separating apparatus, preferably, at least one of the pair of holding portions has an annular contact portion, and the sample is held by bringing the contact portion into contact with the sample. The contact portion may comprise a multiple of contact portions.

In the separating apparatus, preferably, at least one of the pair of holding portions has one or a plurality of stripe-shaped contact portions, and the sample is held by bringing the contact portion into contact with the sample.

In the separating apparatus, preferably, at least one of the pair of holding portions has one or a plurality of arcuated contact portions, and the sample is held by bringing the contact portion into contact with the sample.

In the separating apparatus, preferably, at least one of the pair of holding portions has one or a plurality of projecting contact portions on a main body surface, and the sample is held by bringing the contact portion into contact with the sample.

In the separating apparatus, preferably, at least one of the pair of holding portions has a radial contact portion, and the sample is held by bringing the contact portion into contact with the sample.

In the separating apparatus, preferably, at least one of the pair of holding portions has a contact portion which comes into contact with a peripheral portion of the sample, and the sample is held by bringing the contact portion into contact with the sample. Preferably, the contact portion can contact the whole peripheral portion of the sample.

The separating apparatus preferably further comprises a rotary mechanism for rotating the holding portion about a shaft perpendicular to a surface of the sample.

The separating apparatus preferably further comprises an adjustment mechanism for adjusting an interval between the pair of holding portions.

In the separating apparatus, preferably, in separating the sample by the fluid, the adjustment mechanism presses the sample to adjust the interval between the pair of holding portions.

In the separating apparatus, preferably, in separating the sample by the fluid, the adjustment mechanism maintains a substantially constant interval between the pair of holding portions.

In the separating apparatus, preferably, each of the pair of holding portions has a chuck mechanism for vacuum-chucking the sample.

The separating apparatus is suitable for processing of separating a substrate having a porous layer as the fragile layer.

According to the present invention, there is also provided a support apparatus for supporting a sample, which is used in a separating apparatus for separating a plate-like sample having an internal fragile layer at the fragile layer, characterized by comprising a pair of holding portions opposing each other to sandwich and hold the sample, wherein the pair of holding portions hold the sample to allow the sample to expand at a vicinity of a central portion due to a pressure of a fluid ejected from a jet unit arranged in the separating apparatus and injected into the sample.

According to the present invention, there is also provided a support apparatus for supporting a sample, which is used in a separating apparatus for separating a plate-like sample having an internal fragile layer at the fragile layer, characterized by comprising a pair of holding portions opposing each other to sandwich and hold the sample, wherein the pair of holding portions hold the sample to allow the sample to corrugate due to a pressure of a fluid ejected from a jet unit arranged in the separating apparatus and injected into the sample.

In the support apparatus, preferably, at least one of the pair of holding portions has a hollow contact portion, and the sample is held by bringing the contact portion into contact with the sample. The contact portion may comprise a multiple of contact portions.

In the support apparatus, preferably, at least one of the pair of holding portions has an annular contact portion, and the sample is held by bringing the contact portion into contact with the sample. The contact portion may comprise a multiple of contact portions.

In the support apparatus, preferably, at least one of the pair of holding portions has one or a plurality of stripe-shaped contact portions, and the sample is held by bringing the contact portion into contact with the sample.

In the support apparatus, preferably, at least one of the pair of holding portions has one or a plurality of arcuated contact portions, and the sample is held by bringing the contact portion into contact with the sample.

In the support apparatus, preferably, at least one of the pair of holding portions has one or a plurality of projecting contact portions on a main body surface, and the sample is held by bringing the contact portion into contact with the sample.

In the support apparatus, preferably, at least one of the pair of holding portions has a radial contact portion, and the sample is held by bringing the contact portion into contact with the sample.

In the support apparatus, preferably, at least one of the pair of holding portions has a contact portion which comes into contact with a peripheral portion of the sample, and the sample is held by bringing the contact portion into contact with the sample. Preferably, the contact portion can contact the whole peripheral portion of the sample.

The support apparatus preferably further comprises a rotary mechanism for rotating the holding portion about a shaft perpendicular to a surface of the sample.

The support apparatus preferably further comprises an adjustment mechanism for adjusting an interval between the pair of holding portions.

In the support apparatus, preferably, in separating the sample by the fluid, the adjustment mechanism presses the sample to adjust the interval between the pair of holding portions.

In the support apparatus, preferably, in separating the sample by the fluid, the adjustment mechanism maintains a substantially constant interval between the pair of holding portions.

In the support apparatus, preferably, each of the pair of holding portions has a chuck mechanism for vacuum-chucking the sample.

The support apparatus is suitable as a support apparatus for supporting a substrate having a porous layer as the fragile layer during separation processing.

According to the present invention, there is also provided a sample separating method characterized by comprising separating a sample having a fragile layer using the above separating apparatus.

In the separating method, preferably, water is used as the fluid to be ejected from the jet unit.

According to the present invention, there is also provided a separating method of separating a substrate at a porous layer, the substrate being formed by bonding a non-porous layer side of a first substrate, in which the porous layer and the non-porous layer are sequentially formed on one surface, to a second substrate, characterized in that the above separating apparatus is used for separation.

According to the present invention, there is also provided a substrate manufacturing method characterized by comprising the step of bonding a non-porous layer side of a first substrate, in which a porous layer and the non-porous layer are sequentially formed on one surface, to a second substrate, and separating the bonded substrates at the porous layer, wherein the above separating apparatus is used in the separation step.

According to the present invention, there is also provided a separating apparatus for separating a plate-like sample having an internal fragile layer at the fragile layer, characterized by comprising a jet unit for ejecting a fluid to the sample, and a pair of holding portions opposing each other to sandwich and hold the sample, wherein the pair of holding portions allow the sample to warp as the sample is divided into two parts by a pressure of the fluid ejected from the jet unit and injected into the sample and simultaneously limit a warp amount.

In the separating apparatus, preferably, at least one of the pair of holding portions has a smooth convex support surface, and the sample is held by the support surface.

In the separating apparatus, the support surface preferably substantially comprises part of a spherical surface.

In the separating apparatus, the support surface preferably comprises a surface formed by a cone with a convex vertex.

In the separating apparatus, the support surface preferably substantially comprises a surface formed by a frustum of a cone.

In the separating apparatus, the support surface preferably comprises a smooth convex surface formed by a stack of several frustums.

In the separating apparatus, the support surface preferably comprises a convex surface formed by a stack of several columns.

In the separating apparatus, at least one of the pair of holding portions preferably includes an elastic member and deforms due to a force inflicted by the sample.

In the separating apparatus, preferably, at least one of the holding portions has a support portion partially consisting of an elastic material, and the sample is held by the support portion.

In the separating apparatus, at least one of the holding portions preferably has an elastic member at a portion which can contact the sample.

In the separating apparatus, at least one of the holding portions preferably has an annular support portion consisting of an elastic member.

In the separating apparatus, at least one of the holding portions preferably has a support portion coupled to a main body via an elastic member.

The separating apparatus preferably further comprises a rotary mechanism for rotating the holding portion about a shaft perpendicular to a surface of the sample.

The separating apparatus preferably further comprises an adjustment mechanism for adjusting an interval between the pair of holding portions.

In the separating apparatus, preferably, in separating the sample by the fluid, the adjustment mechanism presses the sample to adjust the interval between the pair of holding portions.

In the separating apparatus, preferably, in separating the sample by the fluid, the adjustment mechanism maintains a substantially constant interval between the pair of holding portions.

In the separating apparatus, each of the pair of holding portions preferably has a chuck mechanism for vacuum-chucking the sample.

The separating apparatus is suitable for processing of separating a substrate having a porous layer as the fragile layer.

According to the present invention, there is also provided a support apparatus for supporting a sample, which is used in a separating apparatus for separating a plate-like sample having an internal fragile layer at the fragile layer, characterized by comprising a pair of holding portions for sandwiching and holding the sample, wherein the pair of holding portions allow the sample to warp as the sample is divided into two parts by a pressure of the fluid ejected from a jet unit arranged in the separating apparatus and injected into the sample and simultaneously limit a warp amount.

In the support apparatus, preferably, at least one of the pair of holding portions has a smooth convex support surface, and the sample is held by the support surface.

In the support apparatus, the support surface preferably substantially comprises part of a spherical surface.

In the support apparatus, the support surface preferably comprises a surface formed by a cone with a convex vertex.

In the support apparatus, the support surface preferably substantially comprises a surface formed by a frustum of a cone.

In the support apparatus, the support surface preferably comprises a smooth convex surface formed by a stack of several frustums.

In the support apparatus, the support surface preferably comprises a convex surface formed by a stack of several columns.

In the support apparatus, at least one of the pair of holding portions preferably includes an elastic member and deforms due to a force inflicted by the sample.

In the support apparatus, preferably, at least one of the holding portions has a support portion partially consisting of an elastic material, and the sample is held by the support portion.

In the support apparatus, at least one of the holding portions preferably has an elastic member at a portion which can contact the sample.

In the support apparatus, at least one of the holding portions preferably has an annular support portion consisting of an elastic member.

In the support apparatus, at least one of the holding portions preferably has a support portion coupled to a main body via an elastic member.

The support apparatus preferably further comprises a rotary mechanism for rotating the holding portion about a shaft perpendicular to a surface of the sample.

The support apparatus preferably further comprises an adjustment mechanism for adjusting an interval between the pair of holding portions.

In the support apparatus, preferably, in separating the sample by the fluid, the adjustment mechanism presses the sample to adjust the interval between the pair of holding portions.

In the support apparatus, preferably, in separating the sample by the fluid, the adjustment mechanism maintains a substantially constant interval between the pair of holding portions.

In the support apparatus, each of the pair of holding portions preferably has a chuck mechanism for vacuum-chucking the sample.

The support apparatus is suitable as a support apparatus for supporting a substrate having a porous layer as the fragile layer during separation processing.

According to the present invention, there is also provided a sample separating method characterized by comprising separating a sample having a fragile layer using the above separating apparatus.

In the separating method, water is preferably used as the fluid to be ejected from the jet unit.

According to the present invention, there is also provided a separating method of separating a substrate at a porous layer, the substrate being formed by bonding a non-porous layer side of a first substrate, in which the porous layer and the non-porous layer are sequentially formed on one surface, to a second substrate, characterized in that the above separating apparatus is used for separation.

According to the present invention, there is also provided a substrate manufacturing method characterized by comprising the step of bonding a non-porous layer side of a first substrate, in which a porous layer and the non-porous layer are sequentially formed on one surface, to a second substrate, and separating the bonded substrates at the porous layer, wherein the above separating apparatus is used in the separation step.

The present invention has been made in consideration of the above situation, and has as its object to provide a separating apparatus and method suitable to separate a plate-like sample represented by a substrate such as a bonded substrate stack, and a substrate manufacturing method to which the apparatus or method is applied.

According to the present invention, there is provided a separating apparatus for separating a plate-like sample, characterized by comprising a jet unit for ejecting a fluid for separating the sample to the sample, and first and second holding portions for sandwiching and holding the sample, wherein the first and second holding portions have holding surfaces with different shapes.

In the separating apparatus, preferably, the first holding portion holds one surface of the sample to make a deflection amount of the one surface due to a pressure of the fluid injected into the sample relatively small, and the second holding portion holds the other surface of the sample to make a deflection amount of the other surface due to the pressure of the fluid relatively large.

In the separating apparatus, preferably, the first holding portion holds one surface of the sample not to cause the one surface to deflect due to a pressure of the fluid injected into the sample, and the second holding portion holds the other surface of the sample to cause the other surface to deflect due to the pressure of the fluid.

In the separating apparatus, the holding surface of the first holding portion and the holding surface of the second holding portion preferably have different areas.

In the separating apparatus, preferably, the first holding portion has a holding surface for wholly holding one surface of the sample, and the second holding portion has a holding surface for partially holding the other surface of the sample.

In the separating apparatus, the holding surface of the first holding portion preferably comprises a flat surface.

In the separating apparatus, the holding surface of the first holding portion preferably comprises a curved surface.

In the separating apparatus, the holding surface of the second holding portion is preferably annular.

In the separating apparatus, preferably, the second holding portion has a plurality of projecting members, and the sample is held by tips of the plurality of projecting members.

In the separating apparatus, the second holding portion preferably has a shape allowing the sample to deflect while expanding at a central portion on a side of the second holding portion due to the pressure of the fluid injected into the sample.

In the separating apparatus, the second holding portion preferably has a shape allowing the sample to deflect and corrugate on a side of the second holding portion due to the pressure of the fluid injected into the sample.

The separating apparatus preferably further comprises a rotary mechanism for rotating at least one of the first and second holding portions about a shaft perpendicular to the holding surface to rotate the sample.

In the separating apparatus, preferably, the sample to be processed comprises a substrate formed by bonding first and second substrates, and the first and second substrates have different strengths.

According to the present invention, there is also provided a separating method of separating a plate-like sample, characterized by comprising holding the sample by sandwiching the sample by a pair of holding portions having holding surfaces with different shapes, and ejecting a fluid to a predetermined position in a direction of thickness of the sample, thereby separating the sample.

In the separating method, preferably, the sample to be separated has an internal fragile layer, and in separating the sample, the fluid is ejected to the fragile layer.

According to the present invention, there is also provided a separating method of separating a plate-like sample having an internal fragile layer at the fragile layer, characterized by comprising the separation step of ejecting a fluid to the fragile layer of the sample to separate the sample, wherein in the separation step, one surface of the sample is held to make a deflection amount due to a pressure of the fluid injected into the sample relatively small and the other surface of the sample is held to make a deflection amount due to the pressure of the fluid injected into the sample relatively large.

According to the present invention, there is also provided a separating method of separating a plate-like sample having an internal fragile layer at the fragile layer, characterized by comprising the separation step of ejecting a fluid to the fragile layer of the sample to separate the sample, wherein in the separation step, one surface of the sample is held to limit deflection due to a pressure of the fluid injected into the sample and the other surface of the sample is held to allow deflection due to the pressure of the fluid injected into the sample.

The separating method preferably further comprises rotating the sample about a shaft perpendicular to a major surface of the sample in separating the sample by the fluid.

In the separating method, preferably, the sample to be processed comprises a sample formed by bonding first and second substrates, and the first and second substrates have different strengths.

According to the present invention, there is also provided a separating method of separating a composite substrate which has a fragile layer between a first substrate having a relatively low strength and a second substrate having a relatively high strength, at the fragile layer, characterized by comprising the separation step of ejecting a fluid to the fragile layer to separate the composite substrate, wherein in the separation step, the first substrate is held to make a deflection amount due to a pressure of the fluid injected into the composite substrate relatively small and the second substrate is held to make a deflection amount due to the pressure of the fluid injected into the composite substrate relatively large.

According to the present invention, there is also provided a separating method of separating a composite substrate which has a fragile layer between a first substrate having a relatively low strength and a second substrate having a relatively high strength, at the fragile layer, characterized by comprising the separation step of ejecting a fluid to the fragile layer to separate the composite substrate, wherein in the separation step, the first substrate is held to limit deflection due to a pressure of the fluid injected into the composite substrate and the second substrate is held to allow deflection due to the pressure of the fluid injected into the composite substrate.

According to the present invention, there is also provided a substrate manufacturing method characterized by comprising the step of bonding a non-porous layer side of a first substrate, in which a porous layer and the non-porous layer are sequentially formed on one surface, to a second substrate, and separating the bonded substrates at the porous layer, wherein any one of the above separating apparatuses is used in the separation step.

According to the present invention, there is also provided a substrate manufacturing method characterized by comprising bonding a non-porous layer side of a first substrate, in which a porous layer and the non-porous layer are sequentially formed on one surface, to a second substrate, and separating the bonded substrates at the porous layer, wherein the separation step is executed using any one of the above methods.

According to the present invention, there is also provided a holding apparatus for holding a sample in ejecting a fluid to a predetermined position in a direction of thickness of the sample to separate the sample, characterized in that the sample is held by a pair of holding portions whose holding surfaces for holding the sample have different shapes.

Further objects, features and advantages of the present invention will become apparent from the following detailed description of embodiments of the present invention with reference to the accompanying drawings.

BRIEF DESCRIPTION OF THE DRAWINGS

FIG. 47 is a view showing the schematic arrangement of a substrate holding portion (on the first substrate side) of the third modification; and FIG. 48 is a view showing the schematic arrangement of the other substrate holding portion (on the second substrate side) of the third modification.

DETAILED DESCRIPTION OF THE PREFERRED EMBODIMENTS

Preferred embodiments of the present invention will be described below with reference to the accompanying drawings.

FIGS. 1A to 1E are views for explaining a method of manufacturing an SOI substrate according to a preferred embodiment of the present invention.

Figure 1A:
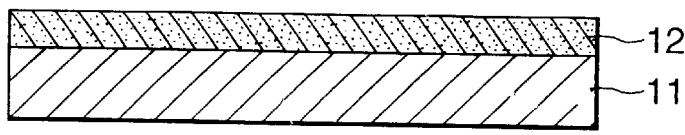
FIGS. 1A to 1E are views for explaining a method of manufacturing an SOI substrate according to the first embodiment of the present invention.
Figure 1B:
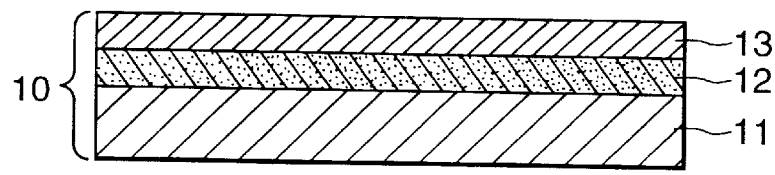

Referring to FIG. 1A, a single-crystal Si substrate 11 is prepared, and a porous Si layer 12 is formed on the surface of the single-crystal Si substrate 11 by anodizing. Referring to FIG. 1B, a non-porous single-crystal Si layer 13 is epitaxially grown on the porous Si layer 12. With this process, a first substrate 10 is formed.

Figure 1C:
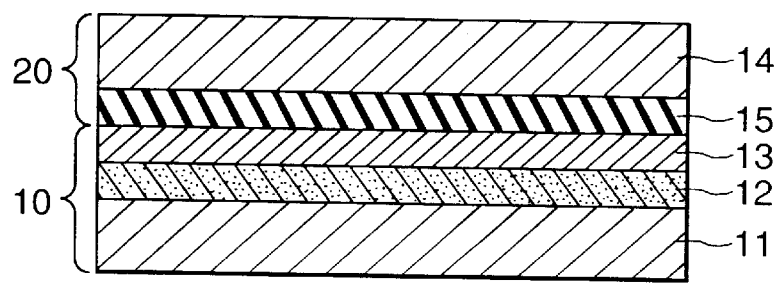

Referring to FIG. 1C, a second substrate 20 having an insulating layer (e.g., an $SiO_2$ layer) 15 formed on the surface of a single-crystal Si substrate 14 is prepared. The first substrate 10 and the second substrate 20 are brought into contact with each other at room temperature such that the non-porous single-crystal Si layer 13 opposes the insulating layer 15. After this, the first substrate 10 and the second substrate 20 are bonded by anode bonding, pressing, heating, or a combination thereof. With this process, the non-porous single-crystal Si layer 13 and the insulating layer 15 are firmly bonded. The insulating layer 15 may be formed on the single-crystal Si substrate 14 side, as described above, on the non-porous single-crystal Si layer 13 as will be described later, or on both the single-crystal Si substrate 14 and the non-porous single-crustal Si layer 13 sides as far as the state shown in FIG. 1C is obtained by bringing the first and second substrates into contact.

Figure 1D:
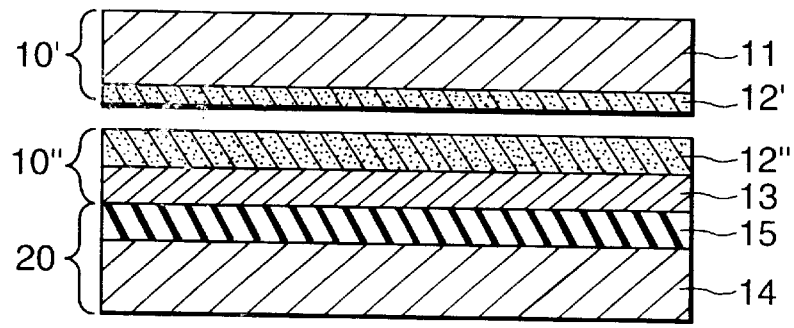

Referring to FIG. 1D, the two substrates bonded to each other are separated at the porous Si layer 12. The second substrate side (10"+20) has a multilayered structure of a porous Si layer 12", single-crystal Si layer 13, insulating layer 15, and single-crystal Si substrate 14. On the first substrate side (10'), a porous Si layer 12' is formed on the single-crystal Si substrate 11.

After separation, the remaining porous Si layer 12'is removed from the substrate 101. The surface of the substrate 10' is planarized, as needed, so the substrate 10' is used again as a single-crystal Si substrate 11 for forming a first substrate 10.

Figure 1E:
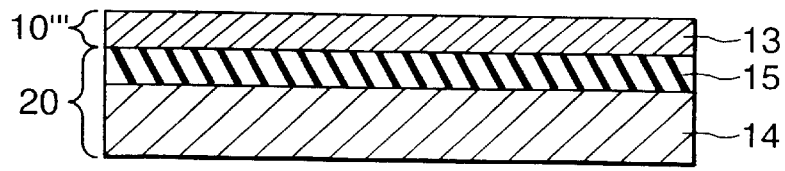

After the bonded substrate stack is separated, in FIG. 1E, the porous layer 12" on the second substrate side (10"+20) is selectively removed with this process, a substrate having a multilayered structure of the single-crystal Si layer 13, insulating layer 15, and single-crystal Si substrate 14, i.e., an SOI structure is obtained.

FIGS. 41A to 41E are views for explaining another method of manufacturing an SOI substrate according to the preferred embodiment of the present invention.

Figure 41A:
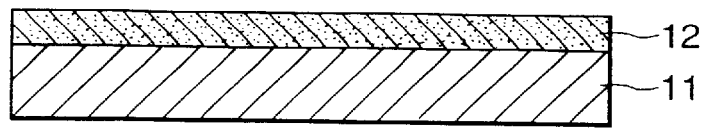
FIGS. 41A to 41E are views showing for explaining another method of manufacturing an SOI substrate according to the preferred embodiment of the present invention.
Figure 41B:
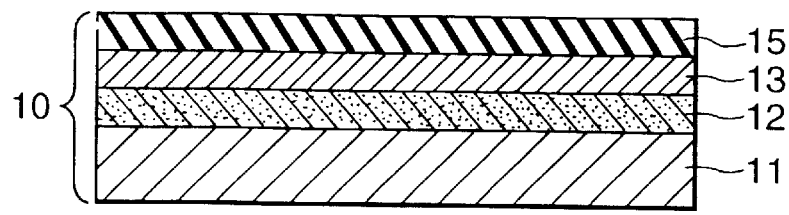

Referring to FIG. 41A, a single-crystal Si substrate 11 is prepared, and a porous Si layer 12 is formed on the surface of the single-crystal Si substrate 11 by anodizing. Referring to FIG. 41B, a single-crystal Si layer 13 as a non-porous layer is epitaxially grown on the porous Si layer 12. After this, the surface of the single-crystal Si layer 13 is oxidized to form an $SiO_2$ layer 15. With this process, a first substrate 10 is formed.

Figure 41C:
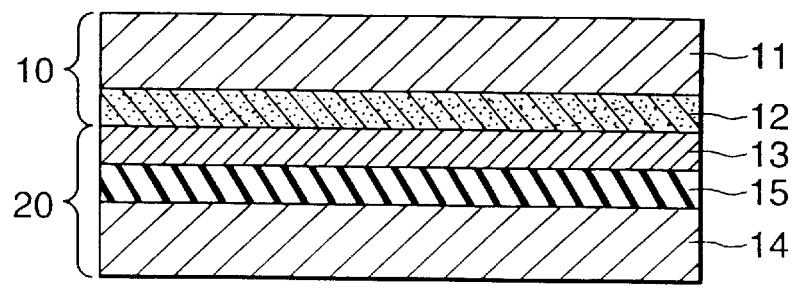

Referring to FIG. 41C, a single-crystal Si substrate 14 is prepared as a second substrate 20. The first substrate 10 and the second substrate 20 are brought into contact with each other at room temperature such that the $SiO_2$ layer 15 of the first substrate 10 opposes the second substrate 20. The first substrate 10 and the second substrate 20 are bonded by anode bonding, pressing, heating, or a combination thereof. With this process, the second substrate 20 and the $SiO_2$ layer 15 are firmly bonded. The $SiO_2$ layer 15 may be formed on the single-crystal Si substrate 11 side, on the second substrate 20, as described above, or on both the single-crystal Si substrate 11 and the second substrate 20 sides as far as the state shown in FIG. 41C is obtained by bringing the first and second substrates into contact.

Figure 41D:
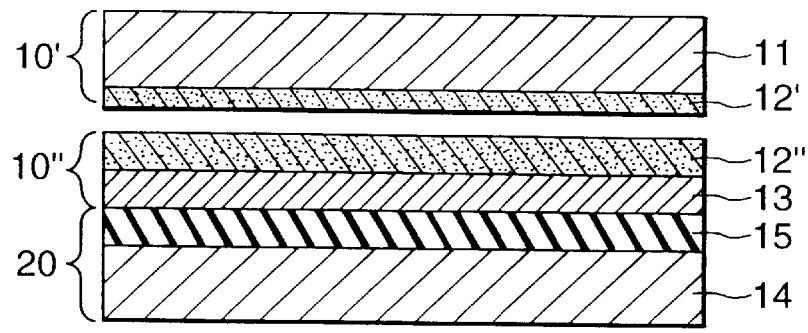

Referring to FIG. 41D, the two substrates bonded to each other are separated at the porous Si layer 12. The second substrate side has a multilayered structure of a porous Si layer 12", single-crystal Si layer 13, $SiO_2$ layer 15, and single-crystal Si substrate 14. On the first substrate 10' side, the porous Si layer 12' is formed on the single-crystal.Si substrate 11.

After separation, the remaining porous Si layer 12' is removed from the substrate 10'. The surface of the substrate 10' is planarized, as needed, so the substrate 10' is used again as a single-crystal Si substrate 11 for forming a first substrate 10.

Figure 41E:
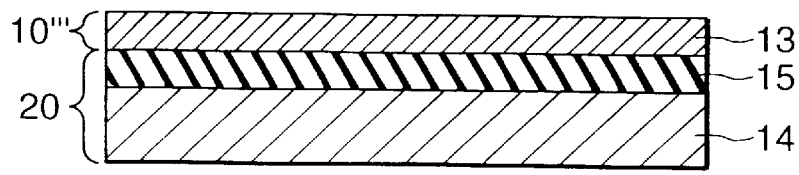

After the bonded substrate stack is separated, in FIG. 41E, the porous layer 12" on the second substrate side (10"+20) is selectively removed. With this process, a substrate having a multilayered structure of the single-crystal Si layer 13, insulating layer 15, and single-crystal Si substrate 14, i.e., an SOI structure is obtained.

As the second substrate, in addition to a single-crystal Si substrate, an insulating substrate (e.g., a substrate of silica glass) or a transparent substrate (e.g., a substrate of silica glass) can be used.

In this embodiment, to facilitate processing of bonding two substrates and separating them, a porous Si layer 12 having a fragile structure is formed in the separation region. In place of the porous layer, a microcavity layer may be formed. A microcavity layer can be formed by, e.g., implanting ions into a semiconductor substrate.

The substrate manufactured by the above manufacturing method can be applied not only to manufacture a semiconductor device but also to manufacture a microstructure.

In this embodiment, in the step shown in FIG. 1D or 41D, i.e., in the step of separating the two substrates bonded to each other (to be referred to as a bonded substrate stack hereinafter), a separating apparatus for selectively ejecting a high-pressure liquid or gas (fluid) to the porous Si layer as a separation region is used to separate the substrate stack into two substrates at the separation region.

First Embodiment

[Basic Arrangement of Separating Apparatus]

This separating apparatus uses the water jet method. Generally, the water jet method ejects a high-speed, high-pressure stream of water (when a hard object is to be cut, an abrasive is added to water) upon an object to, e.g., cut or process a ceramic, a metal, a concrete, a resin, a rubber, or a wood member, remove a coating film from the surface, or clean the surface ("Water Jet", Vol. 1, No. 1, page 4, (1984)). Conventionally, the water jet method is used to perform the above-described cutting, processing, remove a coating film, or clean the surface mainly by partially removing the material.

This separating apparatus ejects a high-speed, high-pressure stream of fluid to the porous layer (separation region) of the bonded substrate stack as a fragile structure portion in the direction of substrate surface to selectively break the porous layer, thereby separating the substrate at the porous layer. The stream will be referred to as a "jet" hereinafter. The fluid forming a jet will be referred to as a "jet medium". As the jet medium, it is possible to use an organic solvent such as water or alcohol, an acid such as fluoric acid or nitric acid, an alkali such as potassium hydroxide, a gas such as air, nitrogen gas, carbonic acid gas, rare gas, or an etching gas, or a plasma.

When this separating apparatus is to be applied to manufacture a semiconductor device, e.g., separate a bonded substrate stack, pure water with minimum impurity metals or particles is preferably used as the jet medium. However, since separation processing is a perfect low-temperature process, water with high purity need not always be used as the jet medium, and the substrate may be cleaned after completion of separation processing.

In this separating apparatus, a jet is ejected to the porous layer (separation region) exposed to the side surface of the bonded substrate stack, thereby removing the porous layer from the peripheral portion to the central portion. With this process, the bonded substrate stack is separated into two substrates by removing only the separation region with low mechanical strength without damaging the main body. Even when the side surface of the bonded substrate stack is covered with some thin layer, and the porous layer is not exposed, the thin layer can be removed by the jet, so the bonded substrate stack can be separated by the above-described method.

To separate the bonded substrate stack only by the cutting force of jet, a high pressure of several thousand kgf/cm$^2$ or more must be applied to the jet medium. In this case, the outer peripheral portion of the bonded substrate stack may be damaged, or the internal pressure of the separation region may increase to break the bonded substrate stack.

To avoid this situation, the pressure to be applied to the jet medium is preferably set to be as low as about 500 kgf/cm$^2$ When such a low-pressure jet is employed, the bonded substrate stack is separated by injecting the jet medium into the bonded substrate stack to expand and split it into two substrates rather than by colliding the jet against the porous layer to cut the porous layer by impact. Therefore, offcut is rarely produced, and damages to substrates decrease. In addition, the jet medium need contain no abrasive.

Figures 27A, 27B:
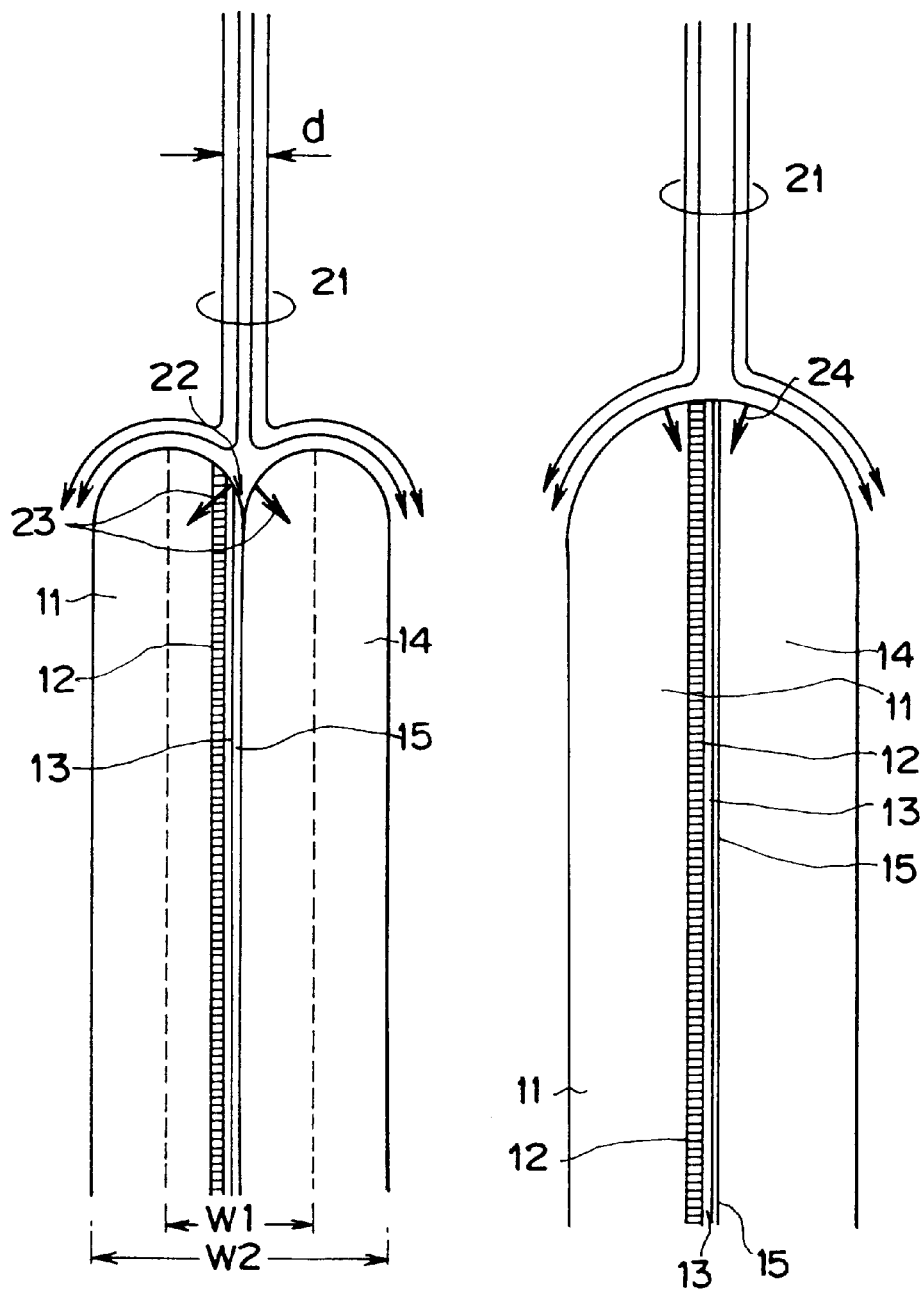
FIGS. 27A and 27B are views showing a force acting on a bonded substrate stack in the presence and absence of a V-shaped groove.

At the peripheral portion of the bonded substrate stack, the effect for splitting the bonded substrate stack into two substrates effectively acts when a V-shaped (concave) groove is formed in the bonded substrate stack along the side surface. FIGS. 27A and 27B are views showing a force acting on the bonded substrate stack in the presence and absence of a V-shaped groove. FIG. 27A shows a bonded substrate stack having a V-shaped groove 22. FIG. 27B shows a bonded substrate stack having no V-shaped groove.

As shown in FIG. 27A, in the bonded substrate stack having the V-shaped groove 22, a force (to be referred to as a separation force hereinafter) is applied outward from the center of the bonded substrate stack, as indicated by an arrow 23. On the other hand, as shown in FIG. 27B, in the bonded substrate stack with a convex side surface, a force is applied inward from the side surface of the bonded substrate stack, as indicated by an arrow 24. In the bonded substrate stack having a convex side surface, the separation force does not act unless the side surface of the porous layer 12 as the separation region is removed by a jet 21.

Even when a thin film is formed on the side surface of the bonded substrate stack, the separation force acts on the bonded substrate stack as far as the bonded substrate stack has the V-shaped groove 22, as shown in FIG. 27A, so the thin layer can be easily broken.

To prevent damages to the substrates, the separation force in the axial direction of the bonded substrate stack is preferably set to be several hundred gf/cm$^2$.

To effectively use the jet, a width W1 of the V-shaped groove 22 is preferably equal to or larger than a diameter d of the jet 21. For example, assume that each of the first substrate (10) and the second substrate (20) has a thickness of about 1 mm, and the bonded substrate stack has a thickness of about 2 mm. Since the width W1 of the V-shaped groove 22 is normally around 1 mm, the diameter of the jet is preferably 1 mm or less. Since a general water jet apparatus uses a jet with a diameter of approximately 0.1 to 0.5 mm, such a general water jet apparatus (e.g., a water jet nozzle) can be used.

The nozzle for ejecting a jet can have not only a circular shape but any other shapes. For example, when a slit-like nozzle is employed to eject a jet having a long rectangular section, the jet can be efficiently injected into the separation region (inserted between the two substrates).

The jet ejection conditions are determined in accordance with the type of separation region (e.g., a porous layer) or the shape of the side surface of the bonded substrate stack. Important parameters as the jet ejection conditions are the pressure applied to the jet medium, the jet scanning speed, the width or diameter of the nozzle (the nozzle diameter is almost the same as the jet diameter), the nozzle shape, the distance between the nozzle and the separation region, and the flow rate of the jet medium.

The following techniques are used to separate the bonded substrate stack. 1) The jet is injected into the bonding interface parallel to the bonding interface while the nozzle is scanned along the bonding interface. 2) The jet is injected into the bonding interface parallel to the bonding interface while the bonded substrate stack is scanned. 3) The jet is injected into the bonding interface parallel to the bonding interface and simultaneously scanned in a fan shape at a pivot near the nozzle. 4) The jet is injected into the bonding interface parallel to the bonding interface while the bonded substrate stack is rotated about nearly the center of the bonded substrate stack (this technique is particularly effective when the bonded substrate stack has a disk shape). The jet need not always be ejected to be perfectly parallel to the bonding interface.

Figure 2:
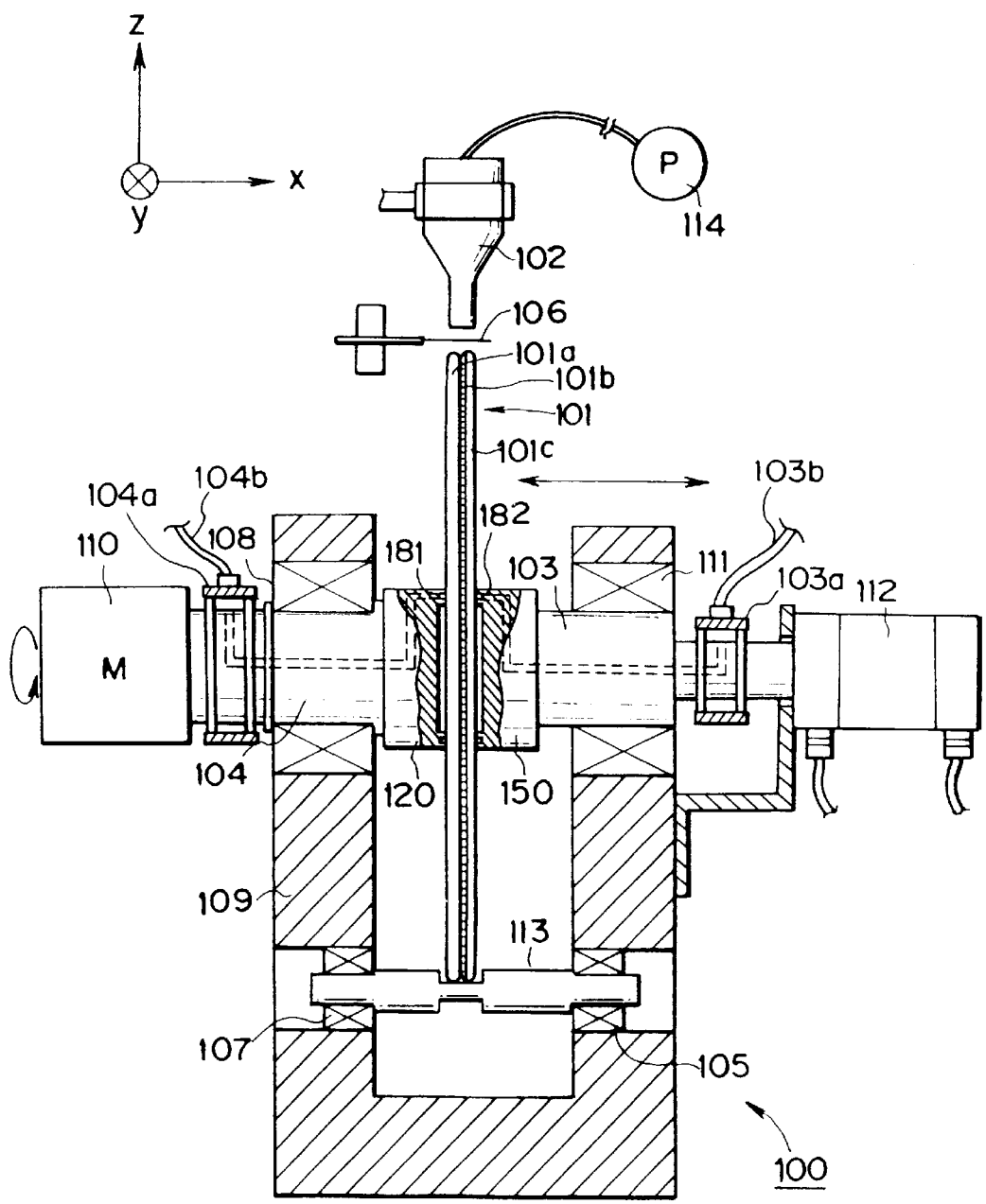
FIG. 2 is a view showing the schematic arrangement of a separating apparatus according to the first embodiment of the present invention.

FIG. 2 is a view showing the schematic arrangement of a separating apparatus according to the first embodiment of the present invention. To separate a bonded substrate stack by a low-pressure jet, a separating apparatus 100 supports the bonded substrate stack such that the separation force efficiently acts on the bonded substrate stack. As a specific example, the separating apparatus 100 supports a bonded substrate stack such that the bonded substrate stack can expand at its central portion by the pressure of the jet medium injected into the bonded substrate stack. As another example, the separating apparatus 100 supports a bonded substrate stack such that the bonded substrate stack can corrugate by the pressure of the jet medium injected into the bonded substrate stack.

The separating apparatus 100 has substrate holding portions 120 and 150 having vacuum chuck mechanisms. A bonded substrate stack 101 is sandwiched by the substrate holding portions 120 and 150 and held. The bonded substrate stack 101 has a porous layer 101b as an internal fragile structure and is separated into two substrates 101a and 101c at the porous layer 101b by the separating apparatus 100. In this separating apparatus 100, the bonded substrate stack is set such that the substrate 101a is placed on the first substrate (10') side in FIG. 1D or 41D and the substrate 101c is placed on the second substrate (10"+20) side in FIG. 1D or 41D.

The substrate holding portions 120 and 150 are present on the same rotary axis. The substrate holding portion 120 is coupled to one end of a rotary shaft 104 which is rotatably axially supported by a support base 109 through a bearing 108. The other end of the rotary shaft 104 is coupled to the rotary shaft of a motor 110. The rotational force generated by the motor 110 rotates the bonded substrate stack 101 vacuum-chucked by the substrate holding portion 120. In separating the bonded substrate stack 101, the motor 110 rotates the rotary shaft 104 at a designated rotation speed in accordance with an instruction from a controller (not shown).

The substrate holding portion 150 is coupled to one end of a rotary shaft 103 which is rotatably and slidably axially supported by the support base 109 through a bearing 111. The other end of the rotary shaft 103 is coupled to an air cylinder 112 fixed on the support base 109. When the air cylinder 112 pushes the rotary shaft 103, the bonded substrate stack 101 is pressed by the substrate holding portion 150.

The substrate holding portions 120 and 150 can be detached from the rotary shafts 104 and 103, respectively. The substrate holding portions 120 and 150 have one or a plurality of suction holes 181 and 182 as vacuum chuck mechanisms, respectively. The suction holes 181 and 182 communicate with rotary seal portions 104a and 103a through the rotary shafts 104 and 103, respectively. The rotary seal portions 104a and 103a are coupled to vacuum lines 104b and 103b, respectively. These vacuum lines 104b and 103b have solenoid valves. By controlling the solenoid valves, setting/removal of the bonded substrate stack 101 can be controlled.

The substrate holding portions 120 and 150 hold the bonded substrate stack 101 such that the separation force efficiently acts on the bonded substrate stack 101 in separation processing. Specific arrangements of the substrate holding portions 120 and 150 will be described later.

Substrate separation processing using this separating apparatus 100 will be described below.

To set the bonded substrate stack 101 in the separating apparatus 100, first, the rotary shaft 103 is retracted by the air cylinder 112 to set a predetermined interval between the chucking surfaces of the substrate holding portions 120 and 150. After the bonded substrate stack 101 is mounted on an alignment shaft 113, the air cylinder 112 pushes the rotary shaft 103, so the bonded substrate stack 101 is pressed and held (the state shown in FIG. 2). The alignment shaft 113 is rotatably axially supported by the support base 109 through bearings 105 and 107.

In this embodiment, the bonded substrate stack 101 is held not by vacuum chucking but by the pressing force of the air cylinder 112. The pressing force is preferably about 100 to 2000 gf. The bonded substrate stack 101 may be vacuum-chucked, as a matter of course. In separation processing, the air cylinder 112 is preferably controlled to maintain a predetermined interval between the substrate holding portions 120 and 150.

A jet medium (e.g., water) is sent from a pump 114 to a nozzle 102, and processing waits until the jet ejected from the nozzle 102 stabilizes. When the jet stabilizes, a shutter 106 is opened to inject the jet into the separation region of the bonded substrate stack 101. At this time, the bonded substrate stack 101 is rotated by the motor 110. The rotary shaft 104, substrate holding portion 120, bonded substrate stack 101, substrate holding portion 150, and rotary shaft 103 integrally rotate.

When the jet is injected, a separation force due to the pressure of the jet medium continuously injected into the porous layer 101b as a fragile structure acts on the bonded substrate stack 101 to break the porous layer 101b which connects the substrates 101a and 101c. With this processing, the bonded substrate stack 101 is separated into two substrates in about 2 min.

When the bonded substrate stack 101 is separated into two substrates, the shutter 106 is closed, and the operation of pump 114 is stopped. By stopping rotation of the motor 110 and controlling the above-described electromagnetic valves, the separated substrates are vacuum-chucked by the substrate holding portions 120 and 150.

When the air cylinder 112 retracts the rotary shaft 103, the surface tension of the jet medium (e.g., water) is cut off to split the two physically separated substrates to both sides.

When the separation force is to efficiently act on the bonded substrate stack 101, the structure of the substrate holding portions 120 and 150 must be optimized. In this embodiment, the separation force is efficiently used by ensuring a space in which the bonded substrate stack deflects in separation processing. Preferable arrangements of substrate holding portions will be listed below. In the following examples, the substrate holding portions 120 and 150 have a symmetrical structure. However, the substrate holding portions 120 and 150 may have independent structures.

[First Example of Substrate Holding Portion]

Figure 3:
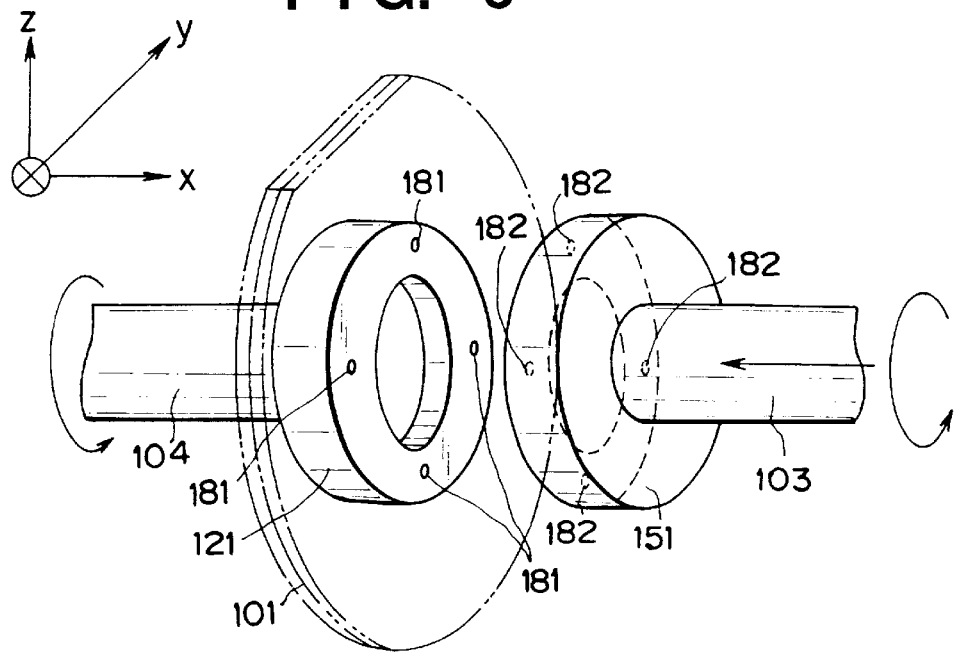
FIG. 3 is a perspective view of substrate holding portions according to the first example of the first embodiment.
Figure 4:
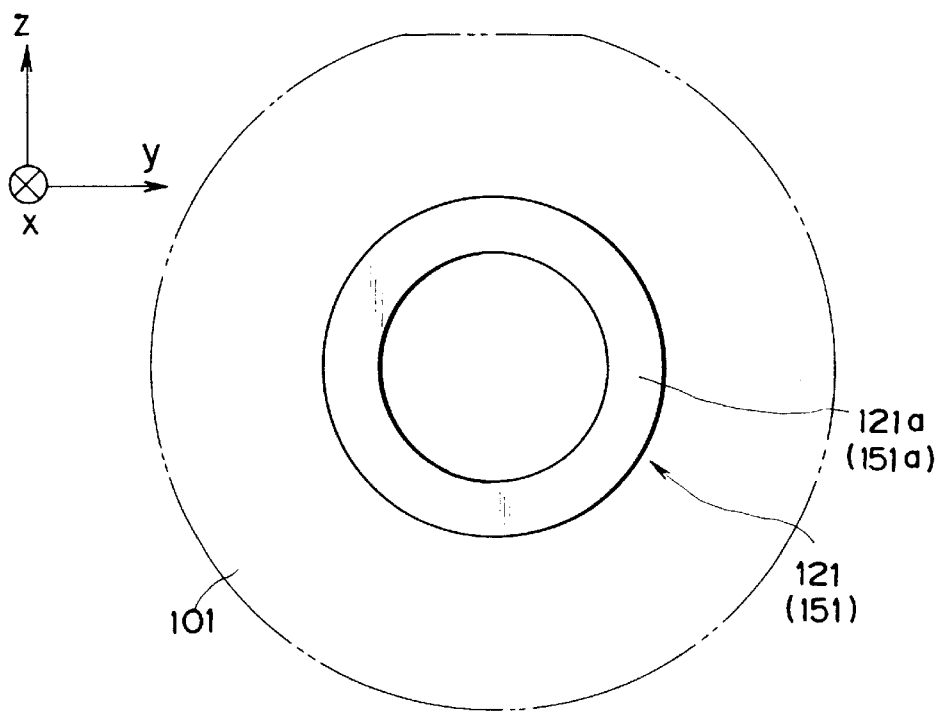
FIG. 4 is a front view of the substrate holding portion according to the first example of the first embodiment.
Figure 5:
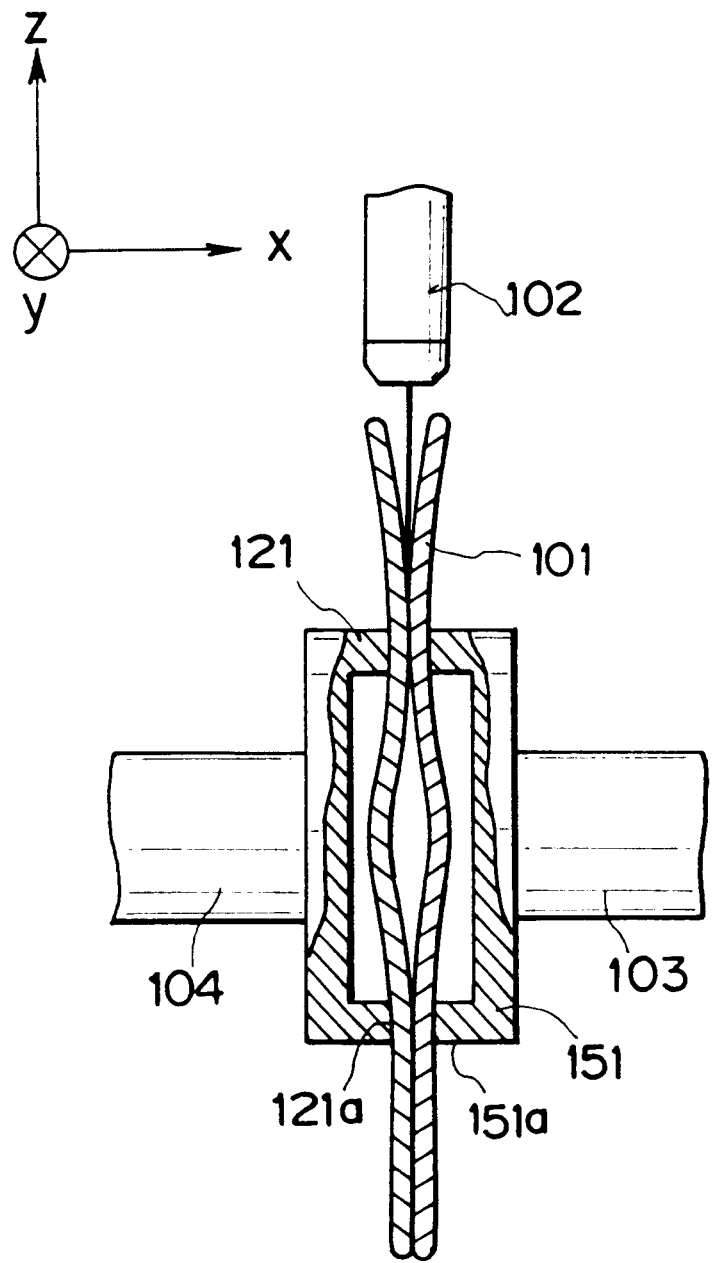
FIG. 5 is a sectional view of the substrate holding portions according to the first example of the first embodiment.

FIGS. 3 to 5 are views showing the arrangement of substrate holding portions according to the first example of the present invention. FIG. 3 is a perspective view, FIG. 4 is a front view, and FIG. 5 is a sectional view. Substrate holding portions 121 and 151 shown in FIGS. 3 to 5 are examples of the substrate holding portions 120 and 150 shown in FIG. 2, respectively.

The substrate holding portions 121 and 151 of the first example have annular contact portions 121a and 151a which come into contact with the bonded substrate stack 101. With this structure, the bonded substrate stack 101 can deflect having "nodes" at a portion sandwiched by the contact portions 121a and 151a and "antinodes" near the central and peripheral portions of the bonded substrate stack 101. In other words, the substrate holding portions 121 and 151 have a structure in which the central portion of the bonded substrate stack 101 can expand in separation processing or a structure in which the bonded substrate stack 101 can corrugate in separation processing. When the substrate holding portions 121 and 151 having this structure are employed, the separation force can efficiently act inside the bonded substrate stack 101.

With the use of the substrate holding portions 121 and 151, separation progresses from the side surface portion of the bonded substrate stack 101 to the vicinity of the contact portions 121a and 115a in about 30 sec after the start of jet injection into the bonded substrate stack 101 (separation processing). In about 2 min after the start of separation processing, the bonded substrate stack 101 warps outward at its central portion to form "antinodes" and is completely separated.

The outer diameter of each of the contact portions 121a and 151a is preferably, e.g., 30 to 50 mm. The inner diameter of each of the contact portions 121a and 151a can be smaller than the outer diameter by, e.g., approximately 10 mm. However, for easy deflection of the substrate stack to be separated, the inner diameter of each of the contact portions 121a and 151a is preferably close to the outer diameter.

Figure 6:
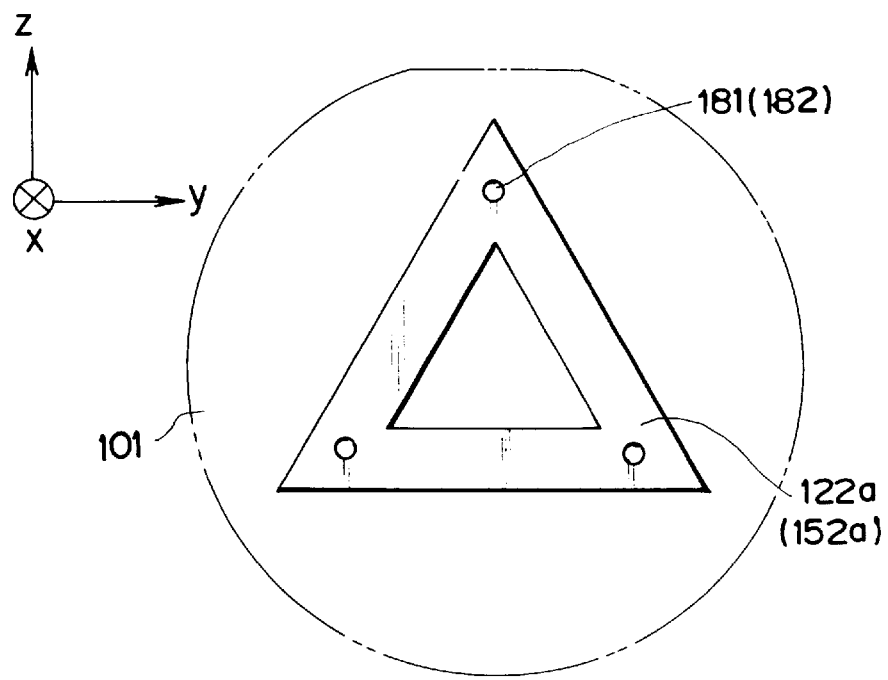
FIG. 6 is a view showing a modification of the substrate holding portion according to the first example of the first embodiment.
Figure 7:
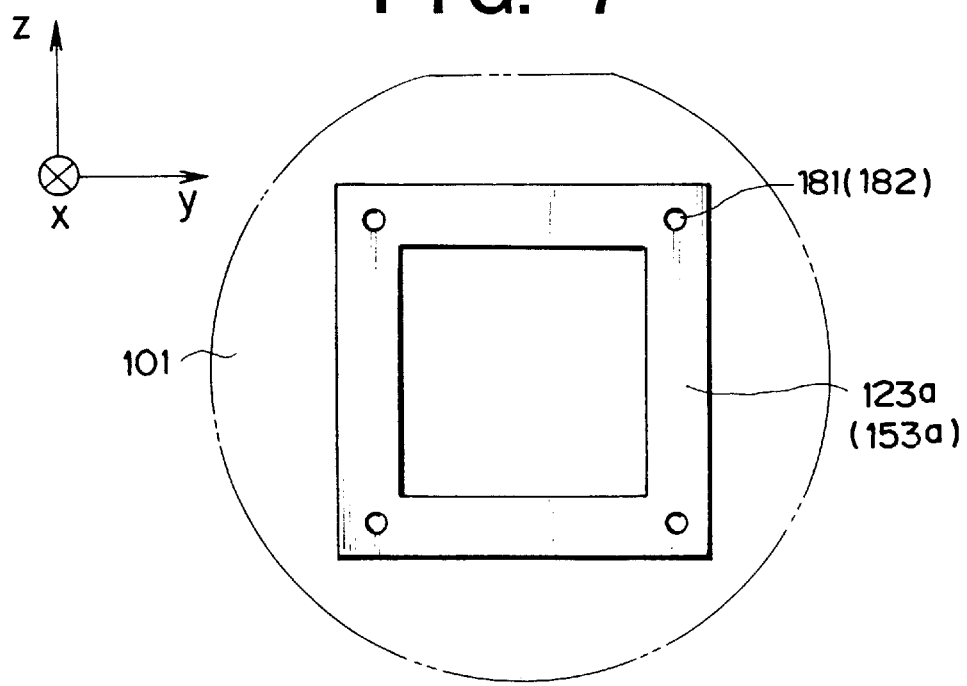
FIG. 7 is a view showing another modification of the substrate holding portion according to the first example of the first embodiment.
Figure 8:
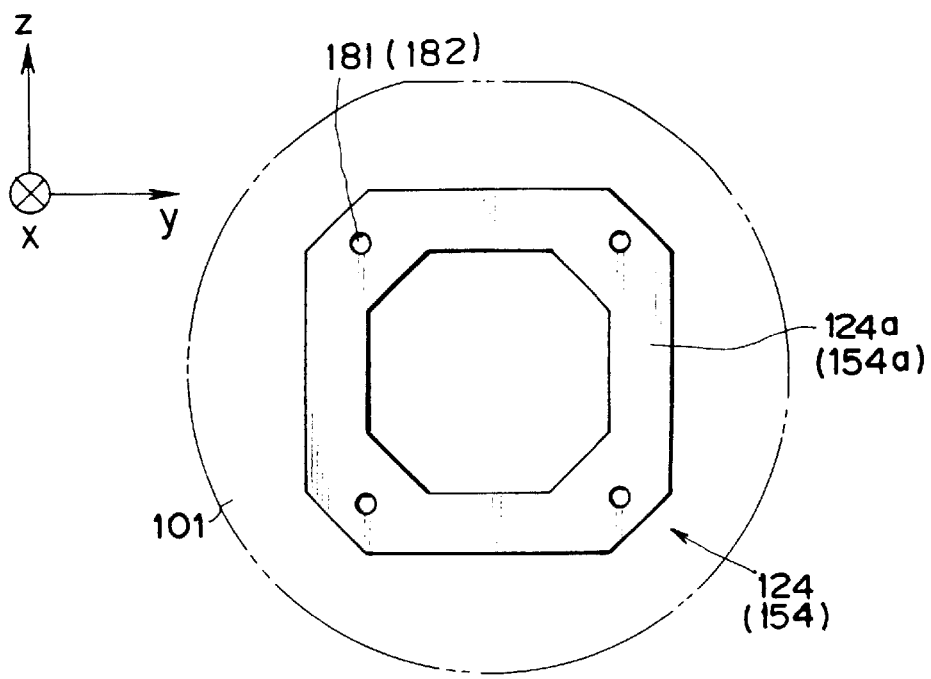
FIG. 8 is a view showing still another modification of the substrate holding portion according to the first example of the first embodiment.
Figure 9:
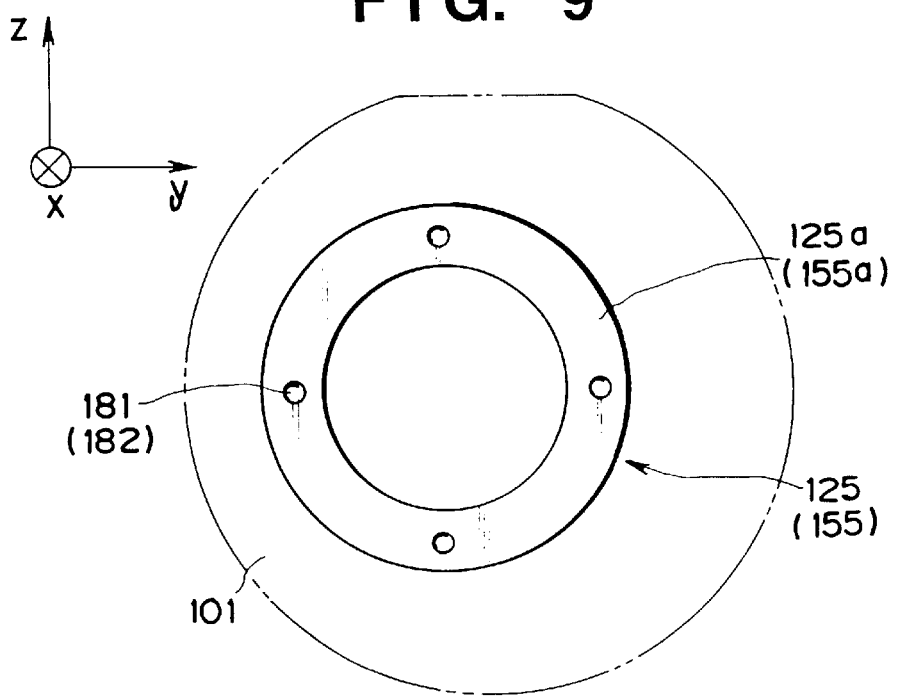
FIG. 9 is a view showing still another modification of the substrate holding portion according to the first example of the first embodiment.

Any other substrate holding portion can provide the same effect as described above as far as it allows the bonded substrate stack 101 to deflect forming "nodes" and "antinodes". FIGS. 6 to 9 are front views showing modifications of the substrate holding portion according to the first example. Reference numerals 122a, 152a, 123a, 153a, 124a, 154a, 125a, and 155a denote contact portions at which the substrate holding portions are in contact with the bonded substrate stack 101. FIGS. 6 to 8 show examples of a contact portion having a polygonal shape with a hollow center. FIG. 9 shows an example of contact portion whose center is shifted from the center of the bonded substrate stack 101. These are examples of a stripe-shaped contact portion.

[Second Example of Substrate Holding Portion]

Figure 10:
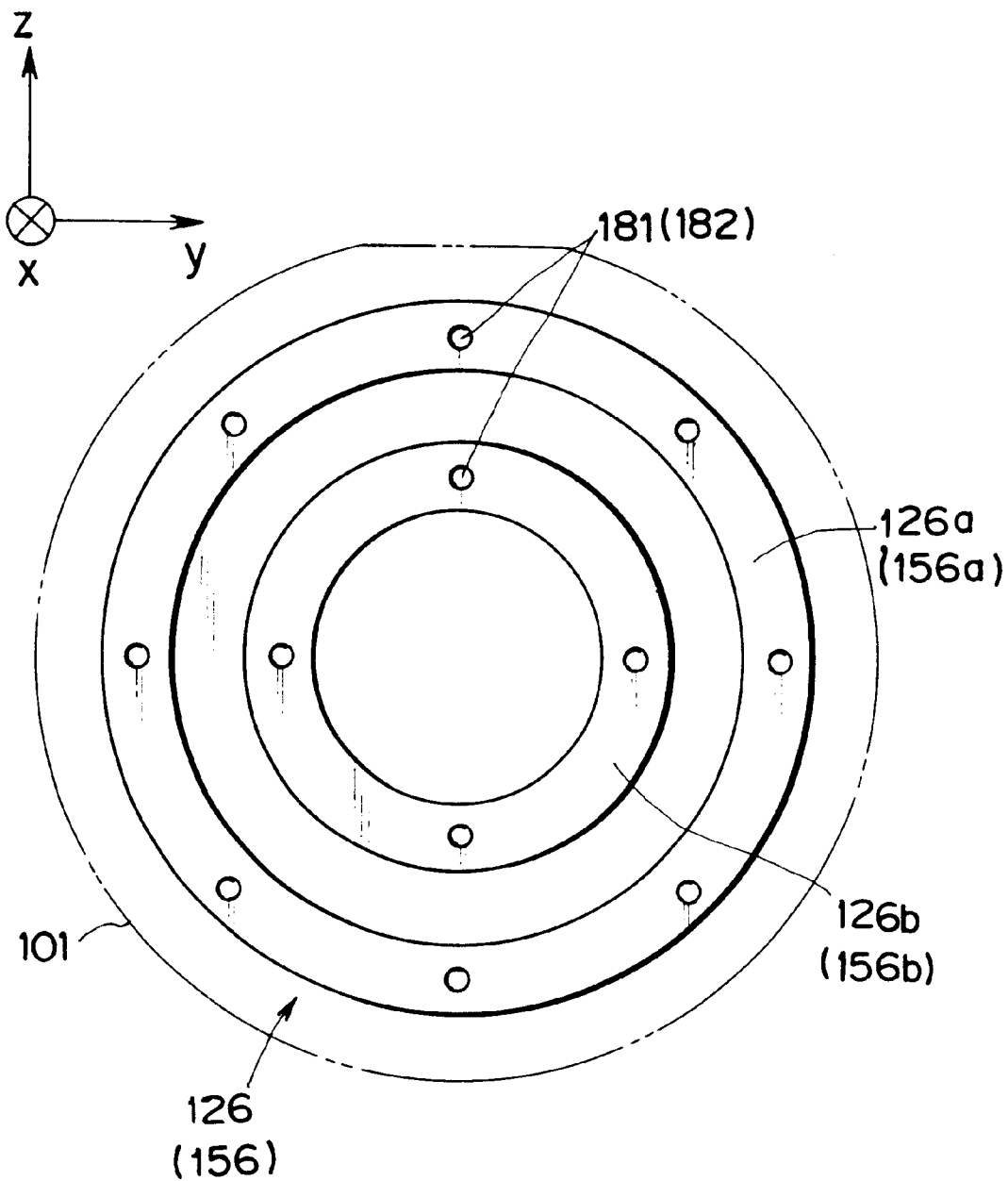
FIG. 10 is a front view of a substrate holding portion according to the second example of the first embodiment.
Figure 11:
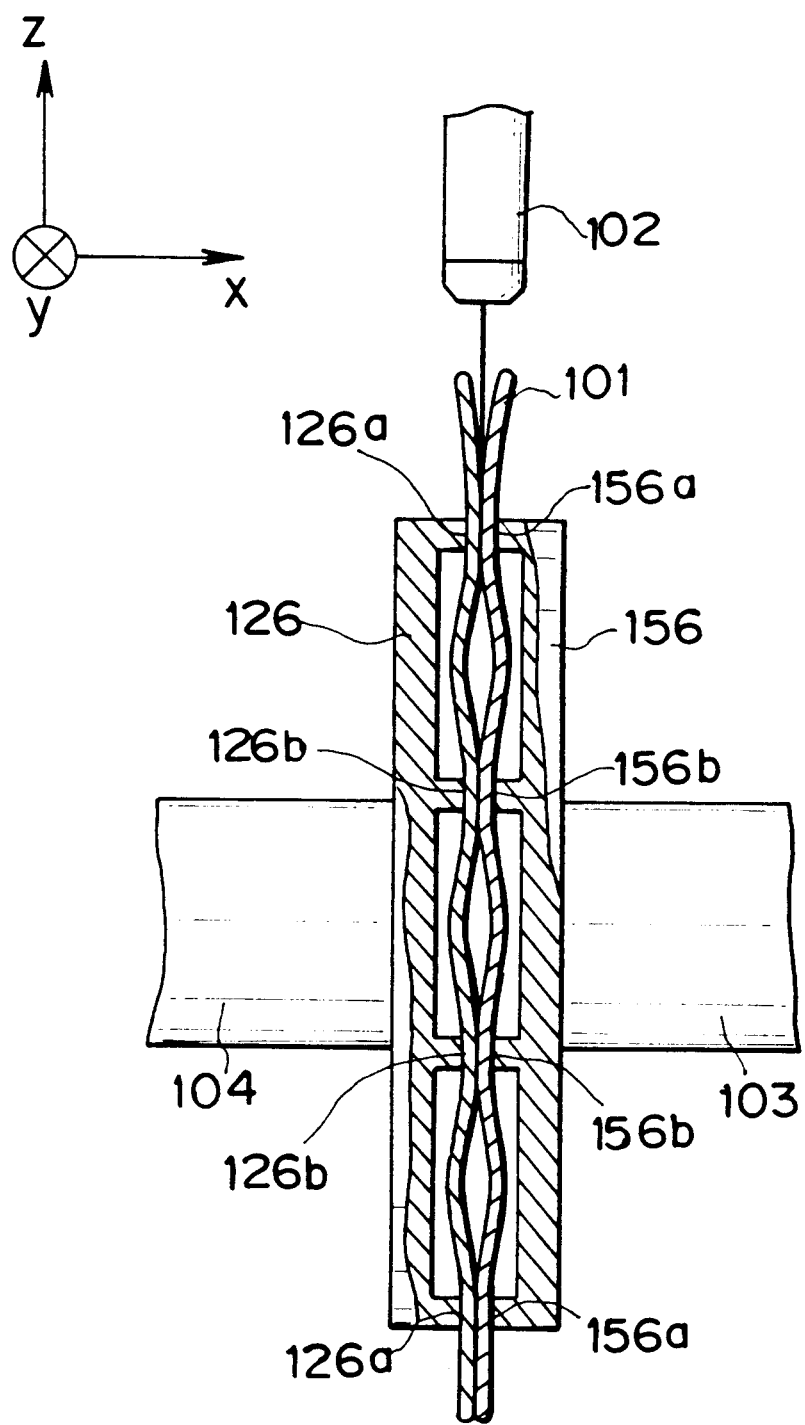
FIG. 11 is a sectional view of the substrate holding portions according to the second example of the first embodiment.

FIGS. 10 and 11 are views showing the arrangement of substrate holding portions according to the second example of the present invention. FIG. 10 is a front view, and FIG. 11 is a sectional view. Substrate holding portions 126 and 156 shown in FIGS. 10 and 11 are examples of the substrate holding portions 120 and 150 shown in FIG. 2, respectively.

The substrate holding portion 126 of this example has two annular contact portions 126a and 126b which come into contact with the bonded substrate stack 101. The substrate holding portion 156 has two annular contact portions 156a and 156b which come into contact with the bonded substrate stack 101. The substrate holding portions 126 and 156 of this example are particularly suitable to process a substrate stack with a large size (e.g., 8 inches or more).

With these substrate holding portions 126 and 156, the bonded substrate stack 101 can deflect having "nodes" at a circumferential portion sandwiched by the contact portions 126a and 156a and a portion sandwiched by the contact portions 126b and 156b, and "antinodes" near the intermediate portion between the contact portions and the peripheral portion of the bonded substrate stack 101.

When the substrate holding portions 126 and 156 having a structure in which the bonded substrate stack 101 deflects while corrugating or expanding near the central portion are employed, the separation force can efficiently act inside the bonded substrate stack 101.

With the use of the substrate holding portions 126 and 156, separation progresses from the side surface of the bonded substrate stack 101 to the vicinity of the outer contact portions 126a and 156a in about 30 sec after the start of jet injection into the bonded substrate stack 101 (separation processing). In about 30 sec after this, the bonded substrate stack 101 is separated to the outer contact portions 126b and 156b. In about 3 min after the start of separation processing, the bonded substrate stack 101 warps to form "nodes" and "antinodes" and is completely separated.

The widths of the contact portions (diameter difference) can be arbitrarily determined. However, for easy deflection of the substrate stack to be separated, the width of each contact portion is preferably small.

In this example, two sets of contact portions are formed. However, three or more sets of contact portions may be arranged.

[Third Example of Substrate Holding Portion]

Figure 12:
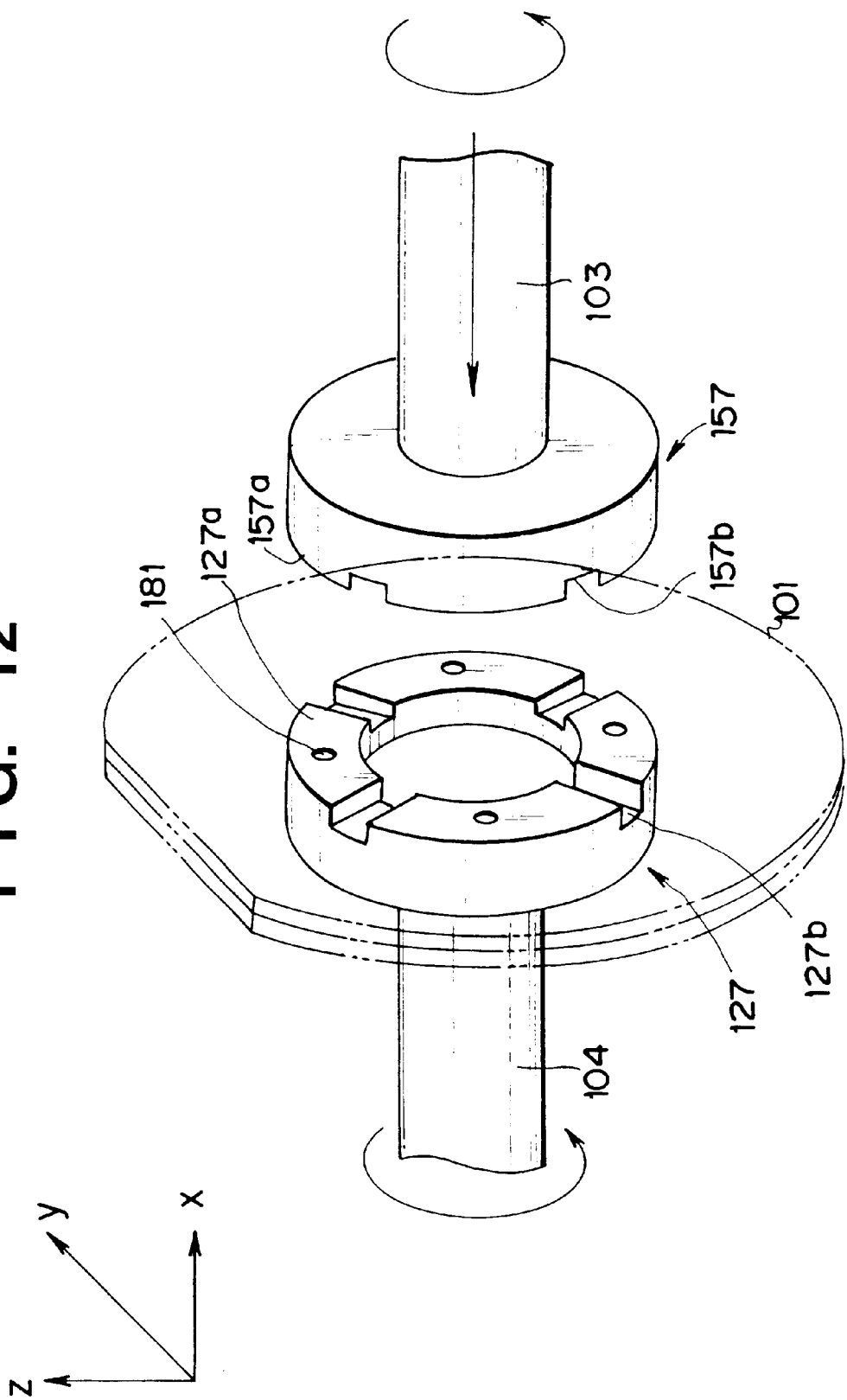
FIG. 12 is a perspective view of substrate holding portions according to the third example of the first embodiment.

FIG. 12 is a perspective view showing the arrangement of substrate holding portions according to the third example of the present invention. Substrate holding portions 127 and 157 shown in FIG. 12 are examples of the substrate holding portions 120 and 150 shown in FIG. 2, respectively.

The substrate holding portions 127 and 157 of this example have a plurality of contact portions 127a and 157a which come into contact with the bonded substrate stack 101, respectively. Stated differently, this structure has annular contact portions 121a and 151a of the first example with grooves 127b and 157b which divide the contact portions 121a and 151a, respectively.

The grooves 127b and 157b prevent the separation force from excessively acting in the vicinity of the central portion of the bonded substrate stack 101. More specifically, when the grooves 127b and 157b are formed, the jet medium injected into the central portion of the bonded substrate stack 101 can be appropriately discharged, so the jet medium pressure can be prevented from excessively increasing near the vicinity of the central portion. Therefore, the bonded substrate stack 101 can be prevented from breaking because of a portion of the porous layer, where the mechanical strength is locally high and separation progresses slowly.

With the use of the substrate holding portions 127 and 157, separation progresses from the side surface of the bonded substrate stack 101 to the vicinity of the contact portions 127a and 157a in about 30 sec after the start of jet injection into the bonded substrate stack 101 (separation processing). In about 2 min after the start of separation processing, the bonded substrate stack 101 warps outward at its central portion to form "antinodes" and is completely separated.

Figure 13:
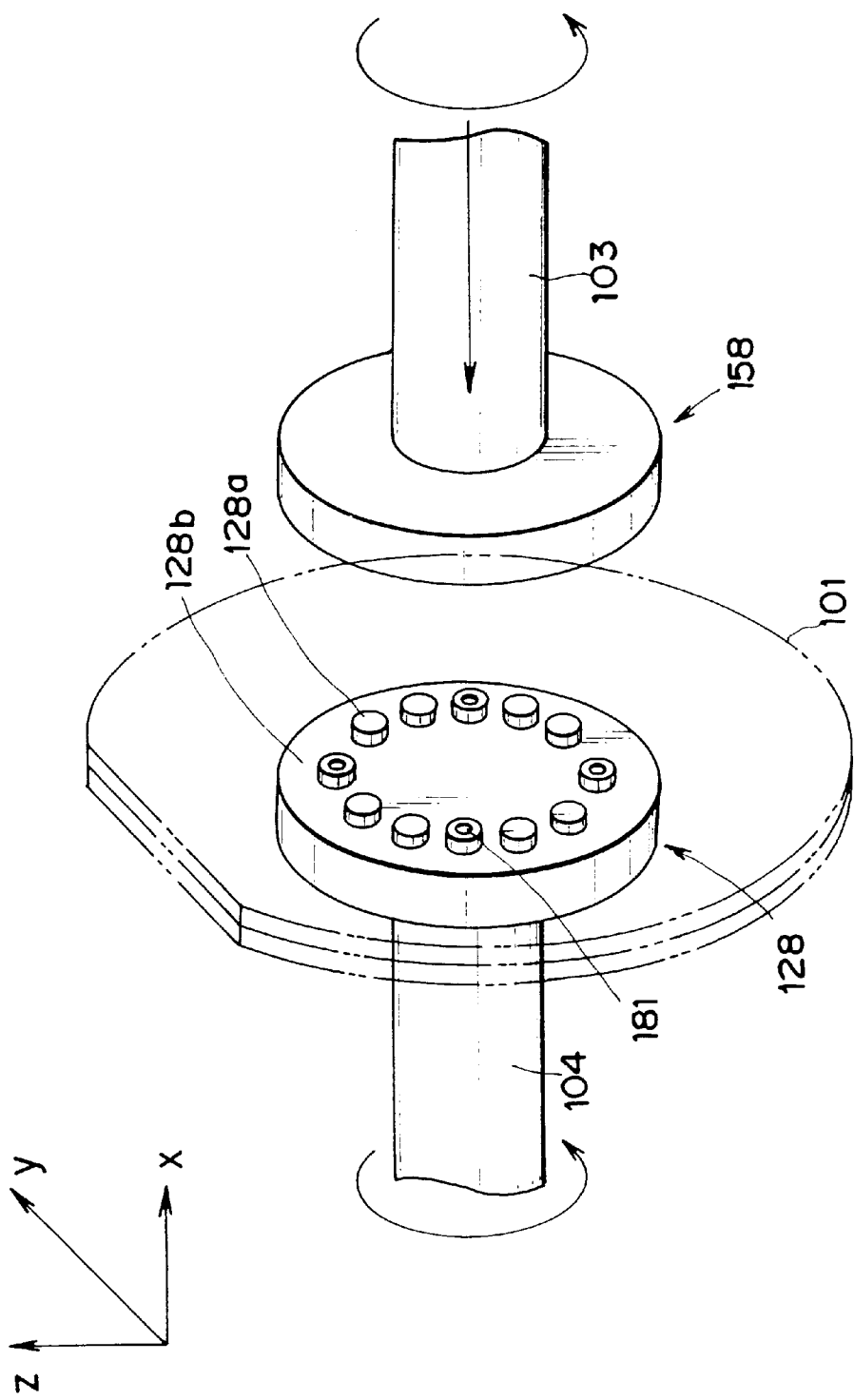
FIG. 13 is a perspective view showing a modification of the substrate holding portions according to the third example of the first embodiment.

FIG. 13 is a perspective view showing a modification of the substrate holding portions shown in FIG. 12. Substrate holding portions 128 and 158 shown in FIG. 13 are examples of the substrate holding portions 120 and 150 shown in FIG. 2, respectively.

The substrate holding portion 128 of this modification has a plurality of columnar contact portions 128a forming a circle on a main body 128b. The substrate holding portion 158 has the same arrangement as that of the substrate holding portion 128. With the substrate holding portions 128 and 158 as well, the jet medium pressure can be prevented from excessively increasing inside the bonded substrate stack 101, so the bonded substrate stack 101 can be prevented from breaking.

[Fourth Example of Substrate Holding Portion]

Figure 14:
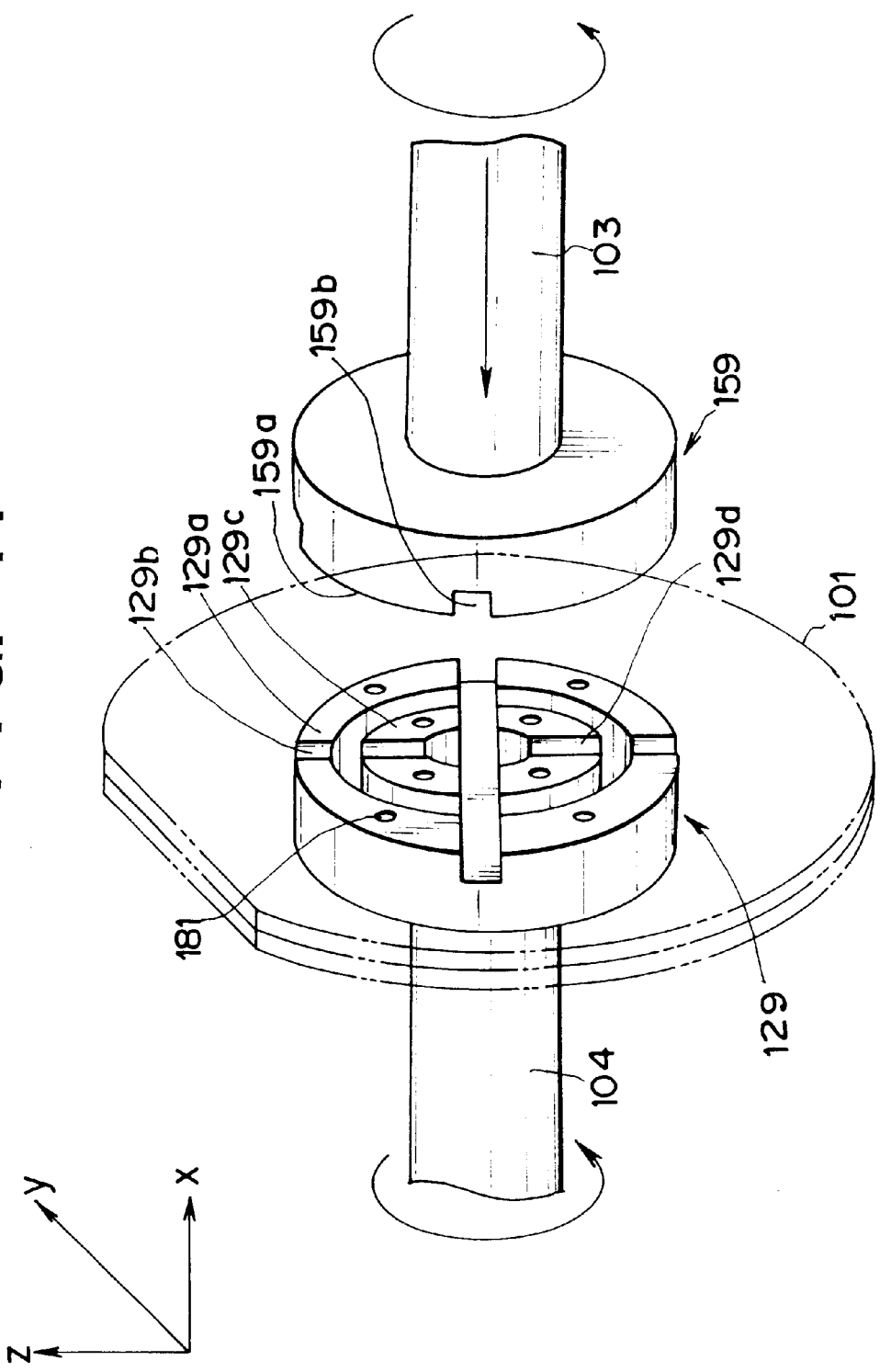
FIG. 14 is a perspective view of substrate holding portions according to the fourth example of the first embodiment.

FIG. 14 is a perspective view showing the arrangement of substrate holding portions according to the fourth example of the present invention. Substrate holding portions 129 and 159 shown in FIG. 14 are examples of the substrate holding portions 120 and 150 shown in FIG. 2, respectively.

The substrate holding portion 129 of this example has two types of arcuated contact portions 129a and 129c which come into contact with the bonded substrate stack 101. To put it differently, the structure has the annular contact portions 126a and 126b of the second example with grooves 128b and 128d which divide the contact portions 126a and 126b, respectively. The substrate holding portion 159 has the same arrangement as that of the substrate holding portion 129.

With the use of the substrate holding portions 129 and 159, separation progresses from the side surface of the bonded substrate stack 101 to the vicinity of the outer contact portion 129a in about 30 sec after the start of jet injection into the bonded substrate stack 101 (separation processing). In about 30 sec after this, the bonded substrate stack 101 is separated to the vicinity of the inner contact portion 129c. In about 3 min after the start of separation processing, the bonded substrate stack 101 is completely separated while corrugating to form "nodes" and "antinodes".

By forming grooves 129b and 129d in the arcuated contact portions 129a and 129c, respectively (this also applies to the substrate holding portion 159), the jet medium pressure can be prevented from excessively increasing inside the bonded substrate stack 101. Hence, the bonded substrate stack 101 can be prevented from breaking because of a portion of the porous layer, where the mechanical strength is locally high and separation progresses slowly.

Figure 15:
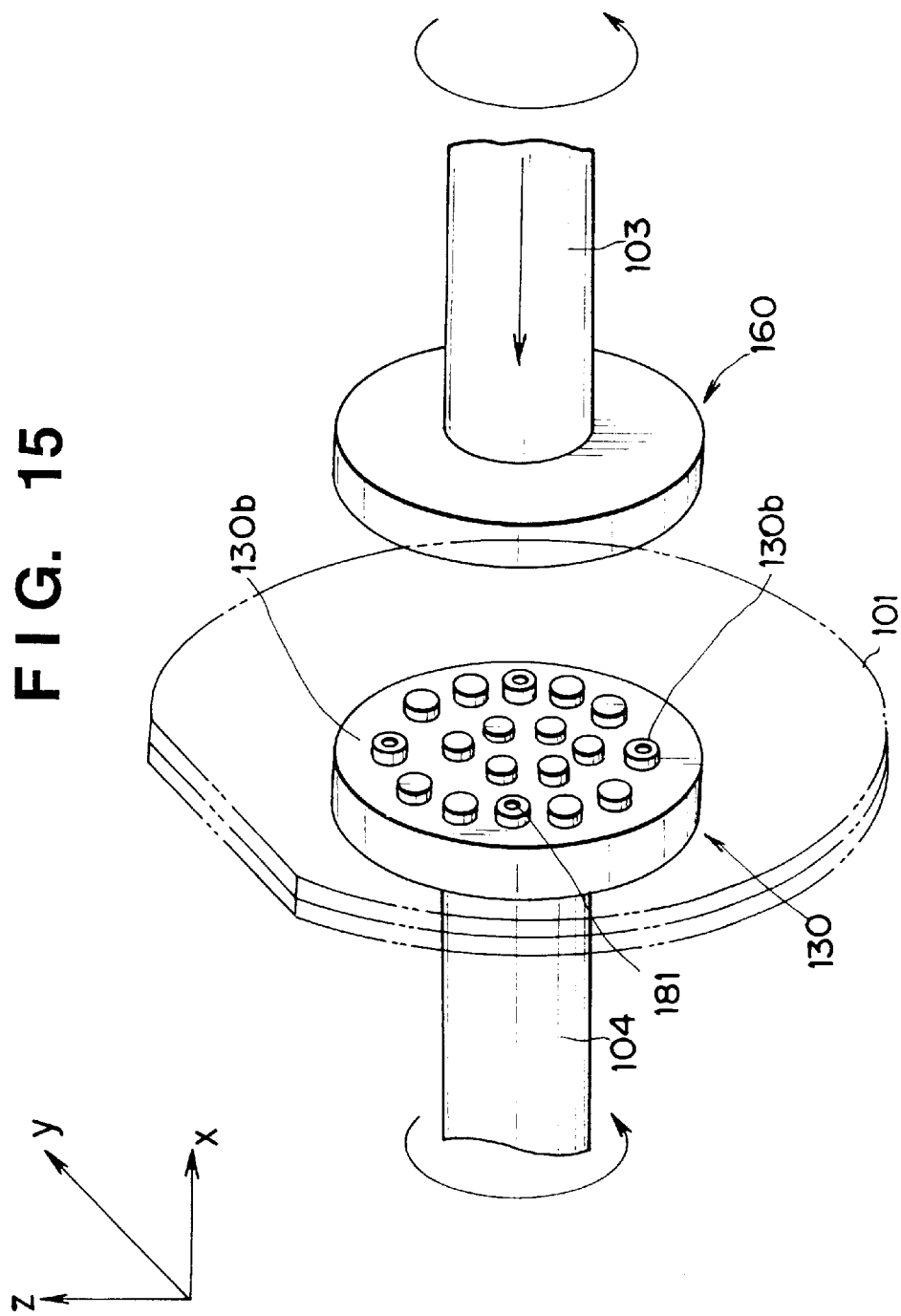
FIG. 15 is a perspective view showing a modification of the substrate holding portions according to the fourth example of the first embodiment.

FIG. 15 is a perspective view showing a modification of the substrate holding portions shown in FIG. 14. Substrate holding portions 130 and 160 shown in FIG. 15 are examples of the substrate holding portions 120 and 150 shown in FIG. 2, respectively.

The substrate holding portion 130 of this modification has a plurality of columnar contact portions 130a forming double circles on a main body 130b. The substrate holding portion 160 has the same arrangement as that of the substrate holding portion 130. With the substrate holding portions 130 and 160 as well, the jet medium pressure can be prevented from excessively increasing inside the bonded substrate stack 101, so the bonded substrate stack 101 can be prevented from breaking.

[Fifth Example of Substrate Holding Portion]

Figure 16:
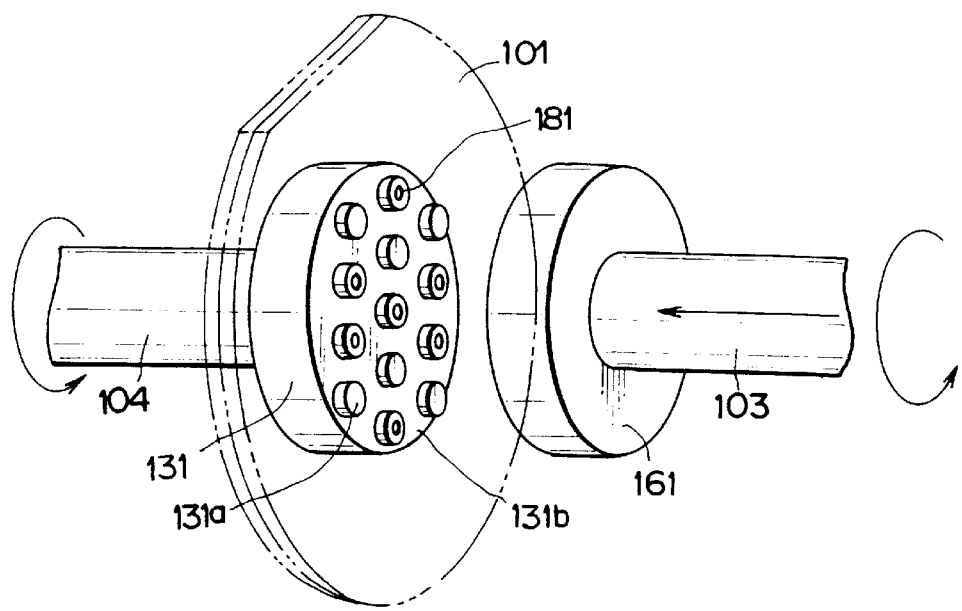
FIG. 16 is a perspective view of substrate holding portions according to the fifth example of the first embodiment.
Figure 17:
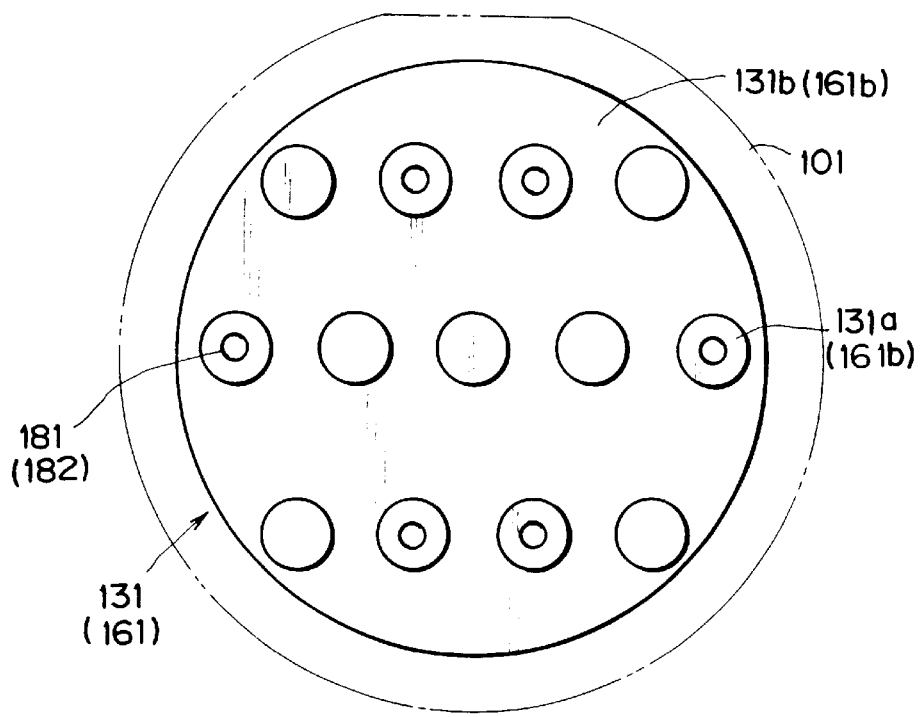
FIG. 17 is a front view of the substrate holding portion according to the fifth example of the first embodiment.

FIGS. 16 and 17 are views showing the arrangement of substrate holding portions according to the fifth example of the present invention. FIG. 16 is a perspective view, and FIG. 17 is a front view. Substrate holding portions 131 and 161 shown in FIGS. 16 and 17 are examples of the substrate holding portions 120 and 150 shown in FIG. 2, respectively.

The substrate holding portions 131 and 161 of this modification has a plurality of columnar contact portions 131a and 161a on main bodies 131b and 161b, respectively. With the substrate holding portions 131 and 161, the bonded substrate stack 101 can deflect and corrugate having "nodes" at a portion sandwiched by the contact portions 131a and 161a, so the separation force can efficiently act inside the bonded substrate stack 101. In addition, since the jet medium discharge path is ensured, the jet medium pressure can be prevented from excessively increasing inside the bonded substrate stack 101. As a consequence, the bonded substrate stack 101 can be prevented from breaking because of a portion of the porous layer, where the mechanical strength is locally high and separation progresses slowly.

With the use of the substrate holding portions 131 and 161, the bonded substrate stack 101 is completely separated in about 2 min after the start of jet injection into the bonded substrate stack 101 (separation processing).

[Sixth Example of Substrate Holding Portion]

Figure 18:
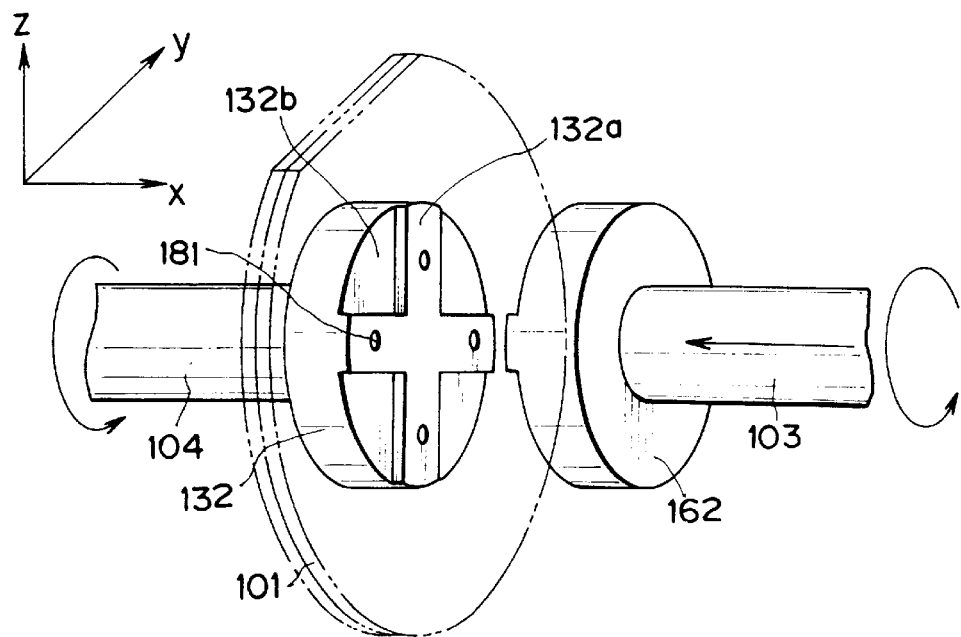
FIG. 18 is a perspective view of substrate holding portions according to the sixth example of the first embodiment.
Figure 19:
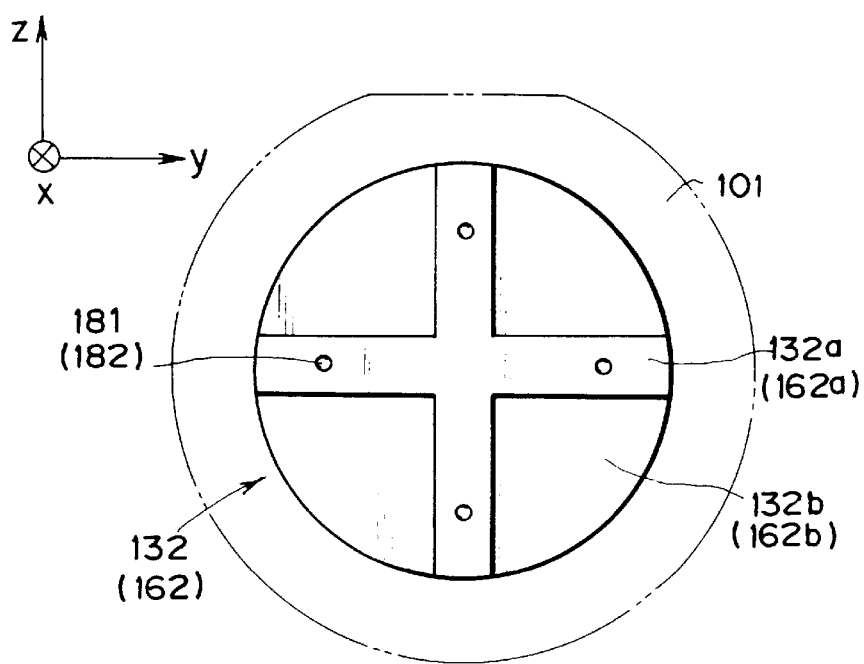
FIG. 19 is a front view of the substrate holding portion according to the sixth example of the first embodiment.

FIGS. 18 and 19 are views showing the arrangement of substrate holding portions according to the sixth example of the present invention. FIG. 18 is a perspective view, and FIG. 19 is a front view. Substrate holding portions 132 and 162 shown in FIGS. 18 and 19 are examples of the substrate holding portions 120 and 150 shown in FIG. 2, respectively.

The substrate holding portions 132 and 162 of this example have cross-shaped (radial) contact portions 132a and 162a which come into contact with the bonded substrate stack 101, on main bodies 132b and 162b, respectively. With the substrate holding portions 132 and 162, the bonded substrate stack 101 can deflect and corrugate forming "nodes" at a portion sandwiched by the contact portions 132a and 162a, so the separation force efficiently acts on the bonded substrate stack 101. In addition, since the jet medium discharge path is ensured, the jet medium pressure can be prevented from excessively increasing inside the bonded substrate stack 101. Therefore, the bonded substrate stack 101 can be prevented from breaking because of a portion of the porous layer, where the mechanical strength is locally high and separation progresses slowly.

With the use of the substrate holding portions 132 and 162, the bonded substrate stack 101 is completely separated in about 80 sec after the start of jet injection into the bonded substrate stack 101 (separation processing).

FIGS. 20 to 24 are perspective views showing modifications of the substrate holding portions shown in FIG. 19. These substrate holding portions are examples of the substrate holding portions 120 and 150 shown in FIG. 2.

Figure 20:
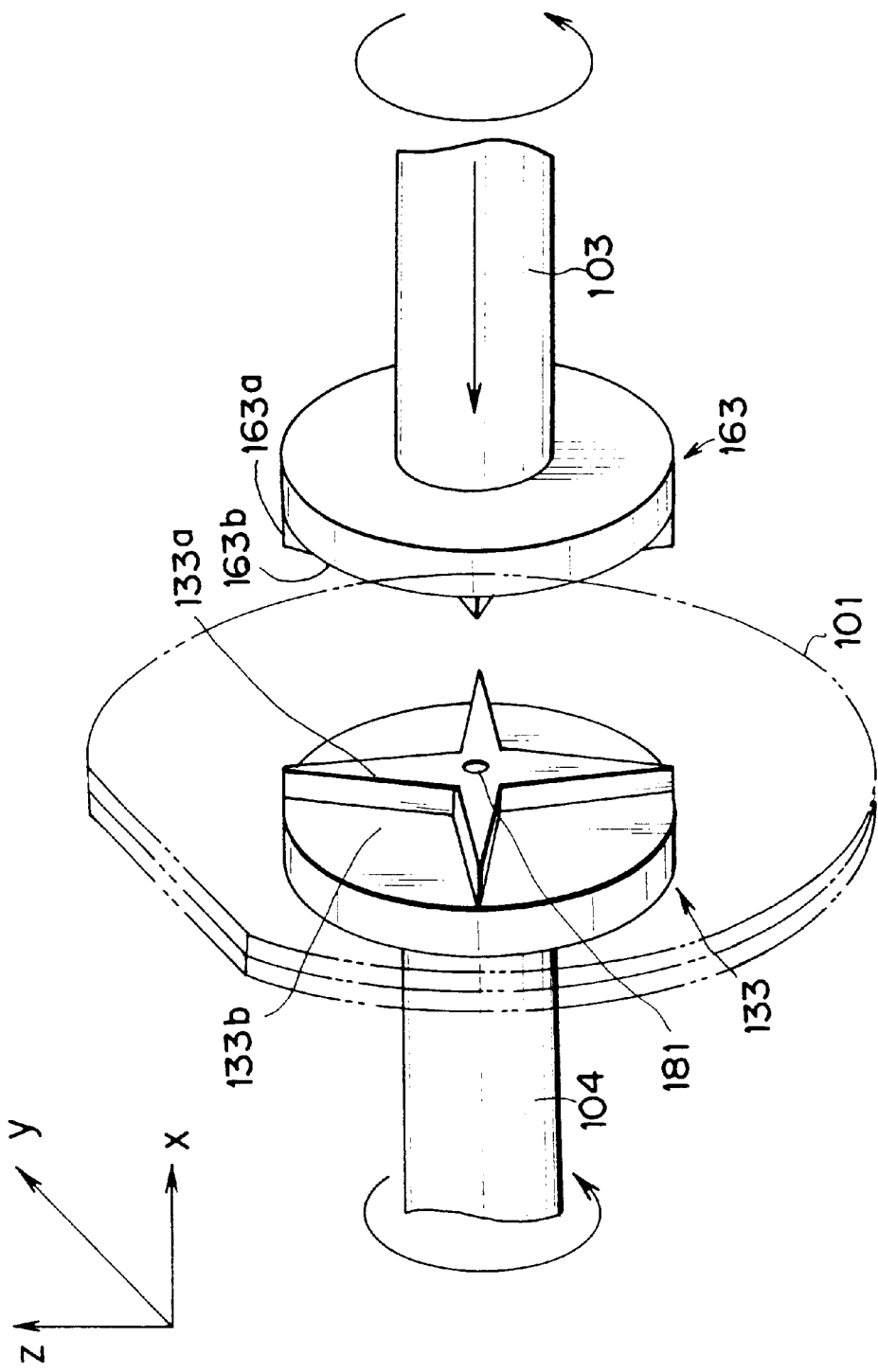
FIG. 20 is a perspective view showing a modification of the substrate holding portions according to the sixth example of the first embodiment.
Figure 21:
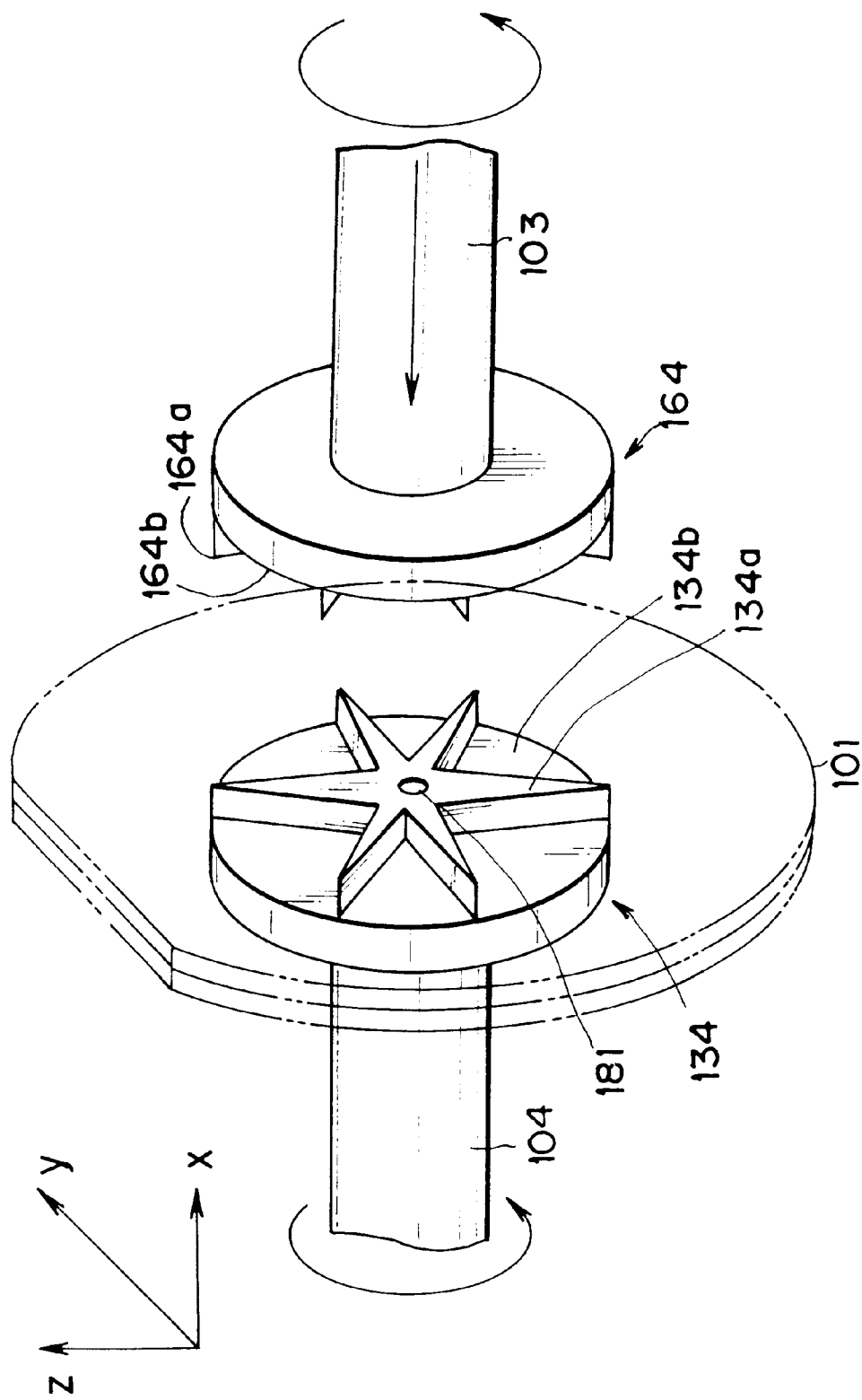
FIG. 21 is a perspective view showing another modification of the substrate holding portions according to the sixth example of the first embodiment.
Figure 22:
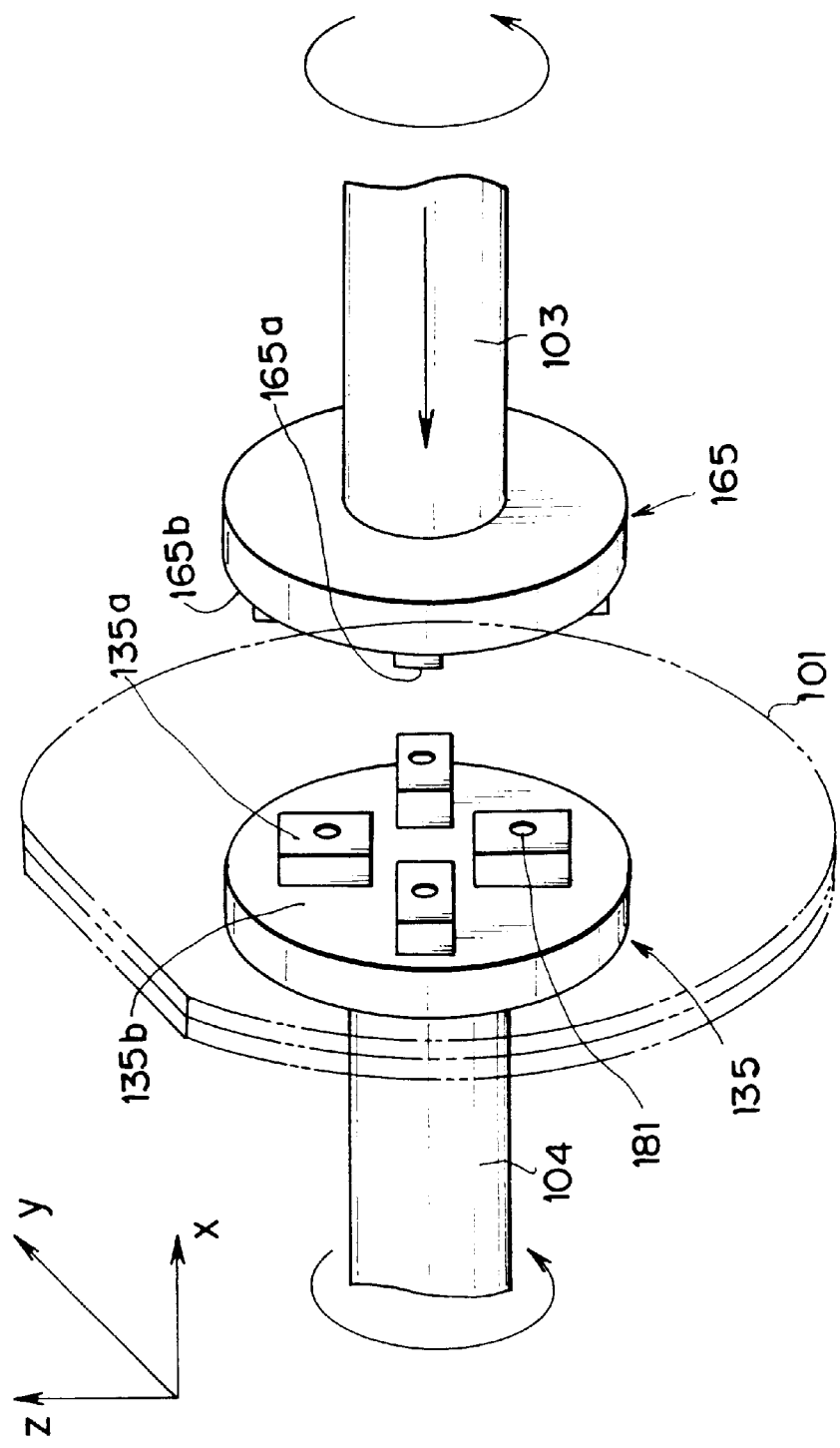
FIG. 22 is a perspective view showing still another modification of the substrate holding portions according to the sixth example of the first embodiment.
Figure 23:
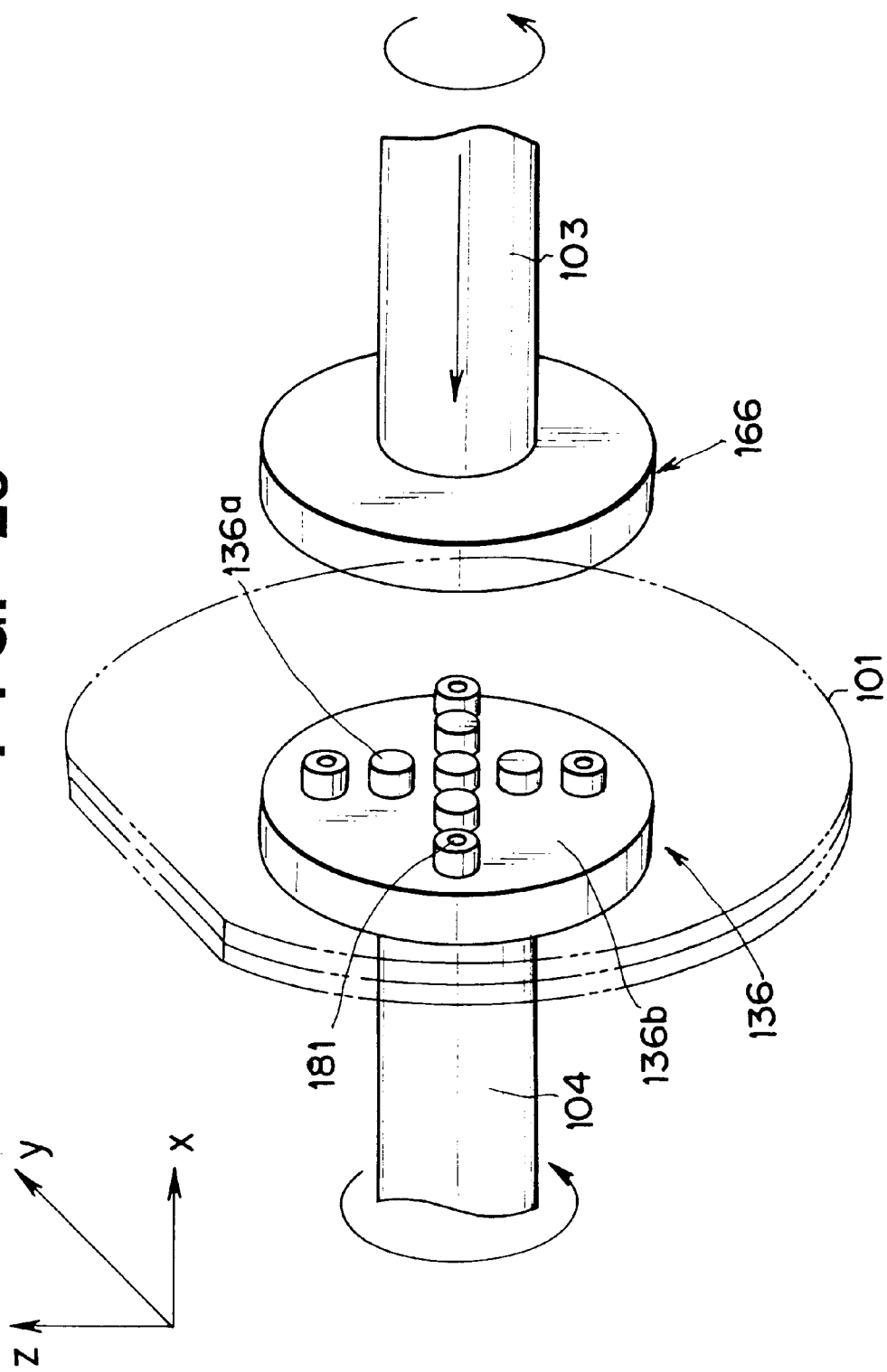
FIG. 23 is a perspective view showing still another modification of the substrate holding portions according to the sixth example of the first embodiment.
Figure 24:
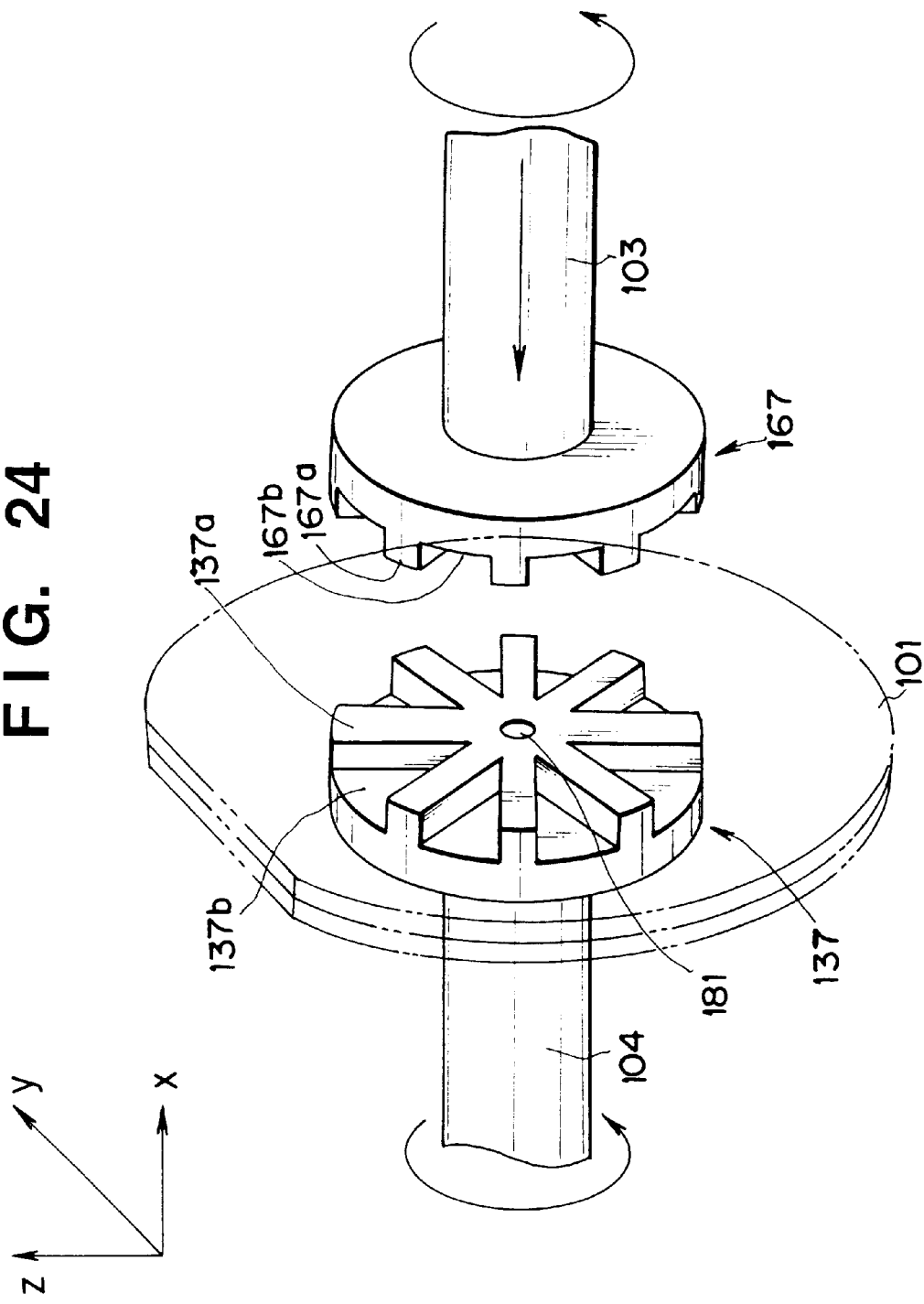
FIG. 24 is a perspective view showing still another modification of the substrate holding portions according to the sixth example of the first embodiment.

Substrate holding portions 133 and 163 shown in FIG. 20 have star-shaped contact portions 133a and 163a which come into contact with the bonded substrate stack 101, on main bodies 133b and 163b, respectively. Substrate holding portions 134 and 164 shown in FIG. 21 also have star-shaped contact portions 134a and 164a which come into contact with the bonded substrate stack 101, on main bodies 134b and 164b, respectively. Substrate holding portions 135 and 165 shown in FIG. 22 have, on main bodies 135b and 165b, contact portions 135a and 165a which come into contact with the bonded substrate stack 101, respectively. Each of the contact portions 135a and 165a is separated into four parts at its central portion and form a cross. A substrate holding portion 136 shown in FIG. 23 has columnar contact portions 136a which come into contact with the bonded substrate stack 101, on a main body 136b. A substrate holding portion 166 has the same arrangement as that of the substrate holding portion 136. Substrate holding portions 137 and 167 shown in FIG. 24 have radial contact portions 137a and 167a which come into contact with the bonded substrate stack 101, on main bodies 137b and 167b, respectively.

[Seventh Example of Substrate Holding Portion]

Figure 25:
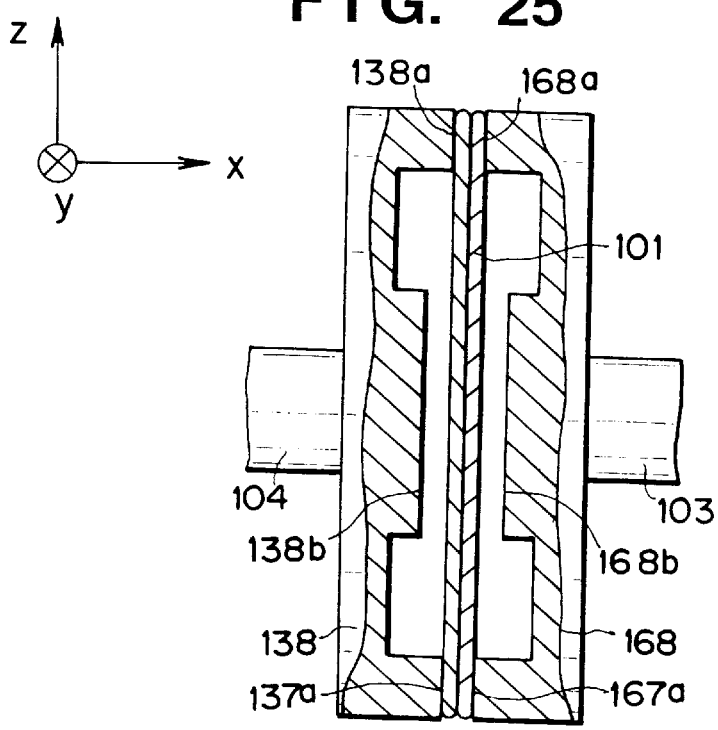
FIG. 25 is a sectional view of substrate holding portions according to the seventh example of the first embodiment.
Figure 26:
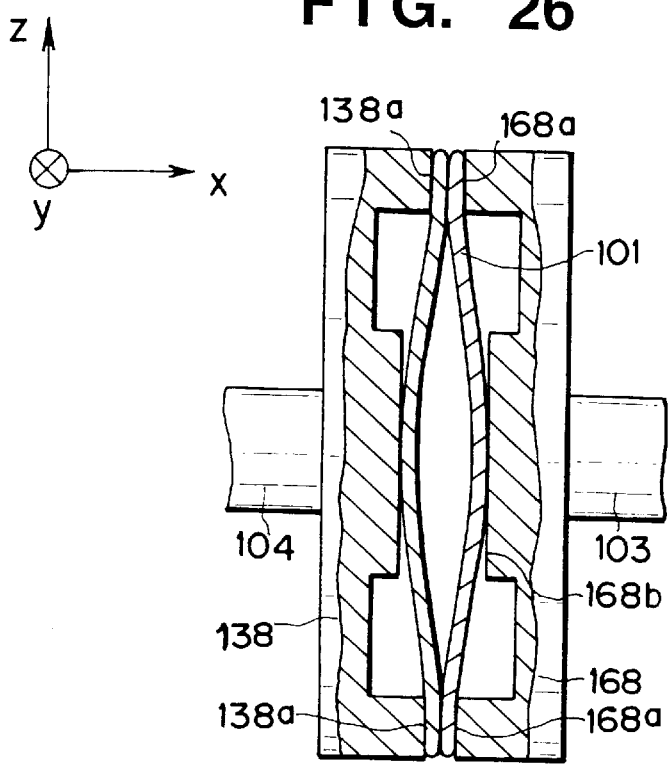
FIG. 26 is a sectional view of the substrate holding portions according to the seventh example of the first embodiment.

FIGS. 25 and 26 are sectional views showing the arrangement of substrate holding portions according to the seventh example of the present invention. FIG. 25 shows a state before the bonded substrate stack 101 is separated. FIG. 26 shows a state after the bonded substrate stack 101 is separated. Substrate holding portions 138 and 168 shown in FIGS. 25 and 26 are examples of the substrate holding portions 120 and 150 shown in FIG. 2, respectively.

The substrate holding portions 138 and 168 of this example have, as contact portions to the bonded substrate stack 101, contact portions 138a and 168a which come into contact with the peripheral portions of the bonded substrate stack 101, respectively. With the substrate holding portions 138 and 168, the bonded substrate stack 101 can deflect while expanding at its central portion having "nodes" at a portion sandwiched by the contact portions 138a and 168a and "antinodes" near the central portion of the bonded substrate stack 101, so the separation force can efficiently act on the bonded substrate stack 101.

The substrate holding portions 138 and 168 have, at their central portions, limit portions 137b and 167b for limiting the deflection amount of the bonded substrate stack 101. Since the deflection amounts of the separated substrates are limited by the limit portions 137b and 167b, the substrates can be prevented from breaking.

In the first to sixth examples, the surface of the main body of each substrate holding portion can also function as a deflection amount limit portion. In each example, the projection height of the contact portion to the bonded substrate stack is determined in accordance with the diameter and thickness of the bonded substrate stack and the jet medium pressure.

The above separating apparatus can be used to separate not only a semiconductor substrate such as a bonded substrate stack but also various samples.

According to the preferred embodiment of the present invention, the efficiency of separation processing can be increased while preventing damages to the sample to be separated.

In addition, according to the preferred embodiment of the present invention, a satisfactory substrate can be manufactured.

Second Embodiment

Figure 28:
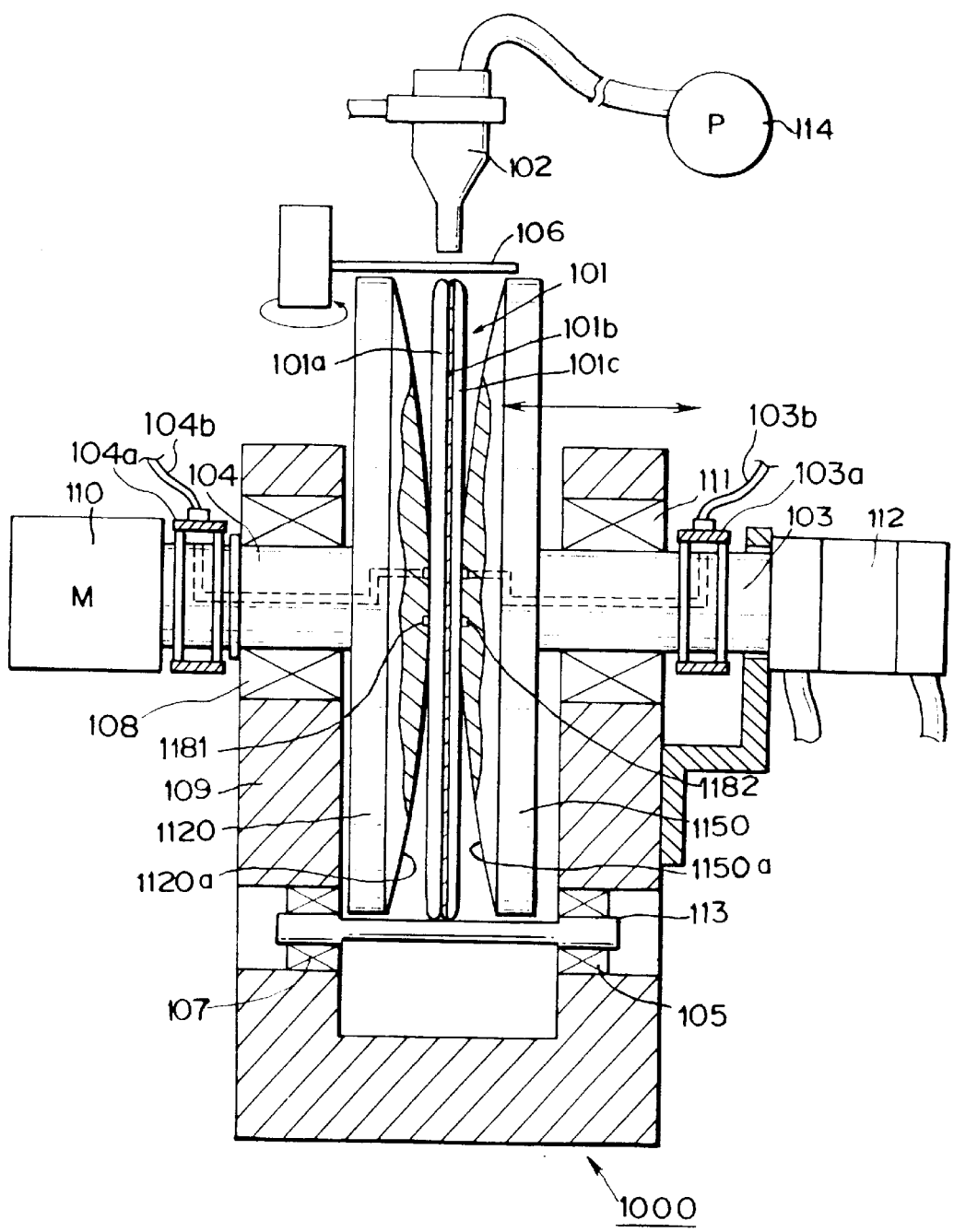
FIG. 28 is a view showing the schematic arrangement of a separating apparatus according to the second embodiment of the present invention.

FIG. 28 is a view showing the schematic arrangement of a separating apparatus according to the second embodiment of the present invention. In a separating apparatus 1000, the separation force is efficiently applied to a bonded substrate stack to separate the bonded substrate stack using a low-pressure jet. At the same time, the bonded substrate stack is supported to prevent the bonded substrate stack from breaking due to the separation force. More specifically, the separating apparatus 1000 supports the bonded substrate stack while allowing it to warp due to the pressure of the jet medium injected into the bonded substrate stack, and also limiting the warp amount.

The separating apparatus 1000 has substrate holding portions 1120 and 1150 having vacuum chuck mechanisms. A bonded substrate stack 101 is sandwiched by the substrate holding portions 1120 and 1150 and held. The bonded substrate stack 101 has a porous layer 101b as an internal fragile structure and is separated into two substrates 101a and 101c at the porous layer 101b by the separating apparatus 1000. In this separating apparatus 1000, the bonded substrate stack is set such that the substrate 111a is placed on the first substrate (10') side in FIG. 1D or 41D and the substrate 101c is placed on the second substrate (10"+20) side in FIG. 1D or 41D.

The substrate holding portions 1120 and 1150 are present on the same rotary axis. The substrate holding portion 1120 is coupled to one end of a rotary shaft 104 which is rotatably axially supported by a support base 109 through a bearing 108. The other end of the rotary shaft 104 is coupled to the rotary shaft of a motor 110. The rotational force generated by the motor 110 rotates the bonded substrate stack 101 vacuum-chucked by the substrate holding portion 1120. In separating the bonded substrate stack 101, the motor 110 rotates the rotary shaft 104 at a designated rotation speed in accordance with an instruction from a controller (not shown).

The substrate holding portion 1150 is coupled to one end of a rotary shaft 103 which is rotatably and slidably axially supported by the support base 109 through a bearing 111. The other end of the rotary shaft 103 is coupled to an air cylinder 112 fixed on the support base 109. When the air cylinder 112 pushes the rotary shaft 103, the bonded substrate stack 101 is pressed by the substrate holding portion 1150.

The substrate holding portions 1120 and 1150 can be detached from the rotary shafts 104 and 103, respectively. The substrate holding portions 1120 and 1150 have one or a plurality of suction portions (e.g., annular grooves) 1181 and 1182 as vacuum chuck mechanisms, respectively. The suction portions 1181 and 1182 communicate with rotary seal portions 104a and 103a through the rotary shafts 104 and 103, respectively. The rotary seal portions 104a and 103a are coupled to vacuum lines 104b and 103b, respectively. These vacuum lines 104b and 103b have solenoid valves. By controlling the solenoid valves, setting/removal of the bonded substrate stack 101 can be controlled.

The substrate holding portions 1120 and 1150 hold the bonded substrate stack 101 such that the separation force efficiently acts on the bonded substrate stack 101 in separation processing. Specific arrangements of the substrate holding portions 1120 and 1150 will be described later.

Substrate separation processing using this separating apparatus 1000 will be described below.

To set the bonded substrate stack 101 in the separating apparatus 1000, first, the rotary shaft 103 is retracted by the air cylinder 112 to set a predetermined interval between the chucking surfaces of the substrate holding portions 1120 and 1150. After the bonded substrate stack 101 is mounted on an alignment shaft 113, the air cylinder 112 pushes the rotary shaft 103, so the bonded substrate stack 101 is pressed and held (the state shown in FIG. 28). The alignment shaft 113 is rotatably axially supported by the support base 109 through bearings 105 and 107.

In this embodiment, the bonded substrate stack 101 is held not by vacuum chucking but by the pressing force of the air cylinder 112. The pressing force is preferably about 100 to 2000 gf. The bonded substrate stack 101 may be vacuum-chucked, as a matter of course. In separation processing, the air cylinder 112 is preferably controlled to maintain a predetermined interval between the substrate holding portions 1120 and 1150.

A jet medium (e.g., water) is sent from a pump 114 to a nozzle 102, and processing waits until the jet ejected from the nozzle 102 stabilizes. When the jet stabilizes, a shutter 106 is opened to inject the jet into the separation region of the bonded substrate stack 101. At this time, the bonded substrate stack 101 is rotated by the motor 110. The rotary shaft 104, substrate holding portion 1120, bonded substrate stack 101, substrate holding portion 1150, and rotary shaft 103 integrally rotate.

When the jet is injected, a separation force due to the pressure of the jet medium continuously injected into the porous layer 101b as a fragile structure acts on the bonded substrate stack 101 to break the porous layer 101b which connects the substrates 101a and 101c. With this processing, the bonded substrate stack 101 is separated into two substrates in about 2 min.

When the bonded substrate stack 101 is separated into two substrates, the shutter 106 is closed, and the operation of pump 114 is stopped. By stopping rotation of the motor 110 and controlling the above-described electromagnetic valves, the separated substrates are vacuum-chucked by the substrate holding portions 1120 and 1150.

When the air cylinder 112 retracts the rotary shaft 103, the surface tension of the jet medium (e.g., water) is cut off to split the two physically separated substrates to both sides.

When the separation force is to efficiently act on the bonded substrate stack 101 while preventing the bonded substrate stack 101 from breaking, the structure of the substrate holding portions 1120 and 1150 must be optimized. In this embodiment, the separation force is efficiently applied by ensuring a space in which the bonded substrate stack warps in separation processing, and simultaneously, the warp amount is limited to prevent the bonded substrate stack 101 from breaking.

Preferable arrangements of the substrate holding portions will be listed below. In the following examples, a pair of substrate holding portions that oppose each other have a symmetrical structure. However, the substrate holding portions may have independent structures.

[First Example of Substrate Holding Portion]

Figure 29:
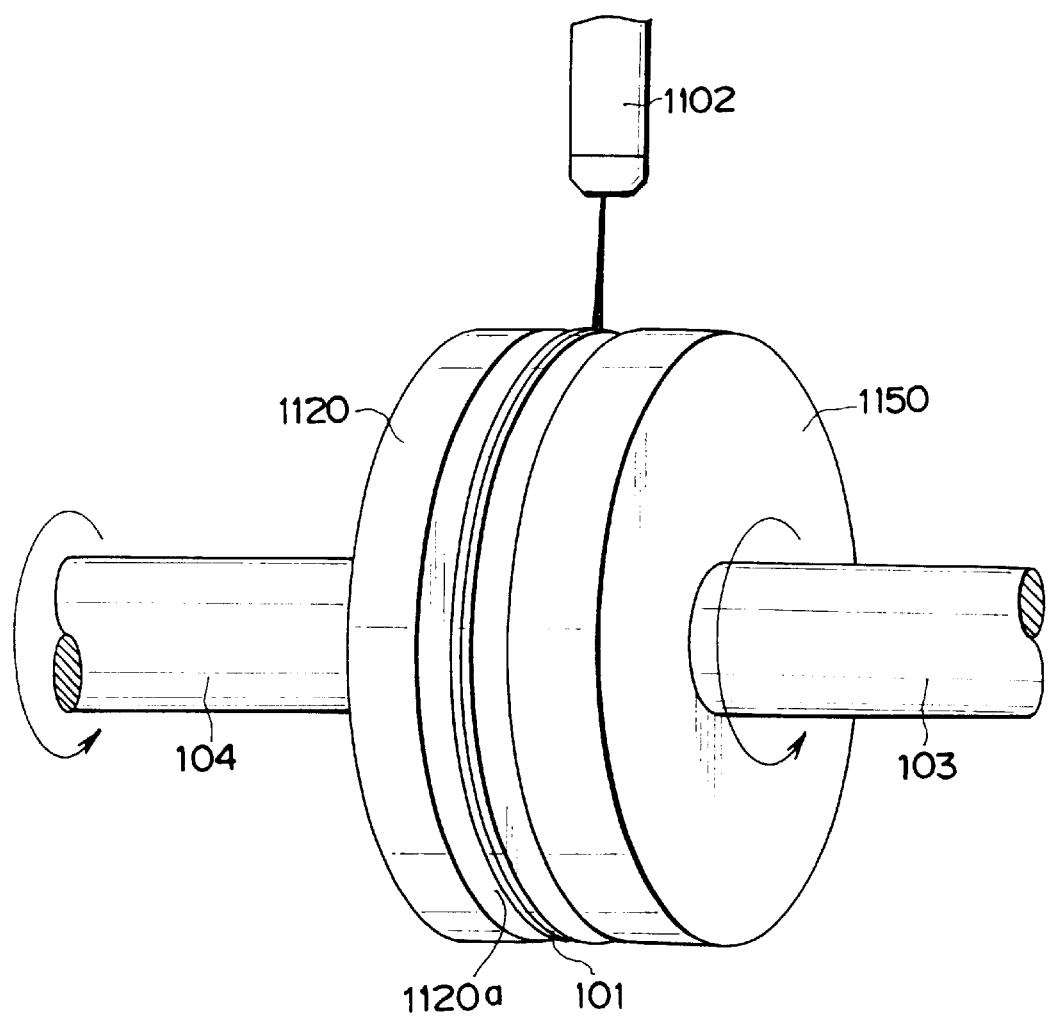
FIG. 29 is a perspective view of substrate holding portions according to the first example of the second embodiment.
Figure 30:
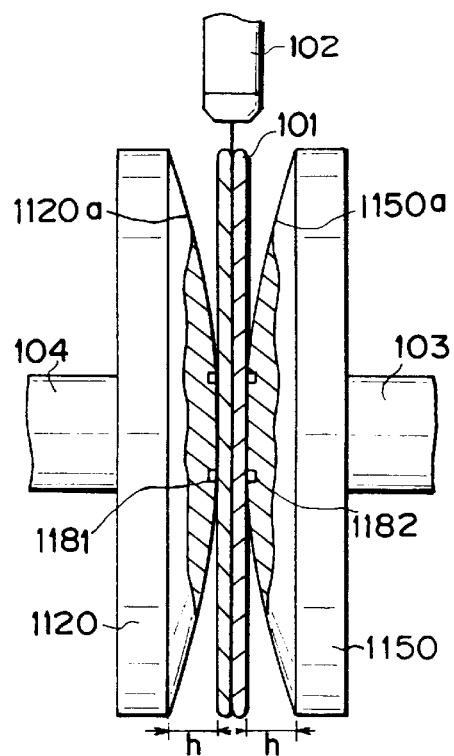
FIG. 30 is a sectional view of the substrate holding portions according to the first example of the second embodiment.
Figure 31:
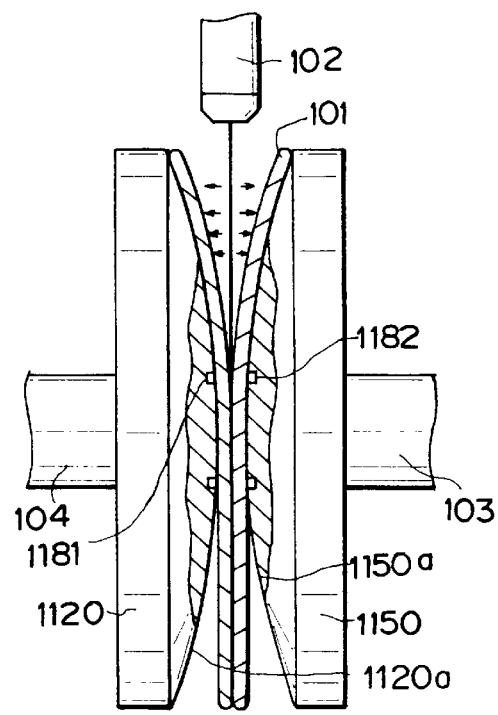
FIG. 31 is a sectional view of the substrate holding portions according to the first example of the second embodiment.
Figure 32:
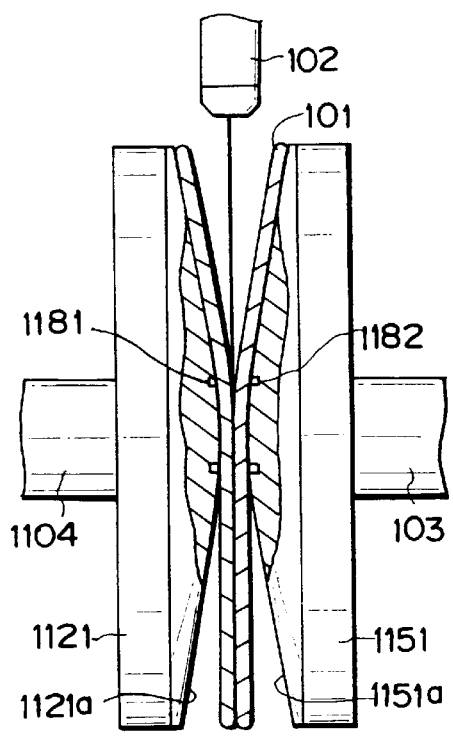
FIG. 32 is a sectional view showing a modification of the substrate holding portions according to the first example of the second embodiment.
Figure 33:
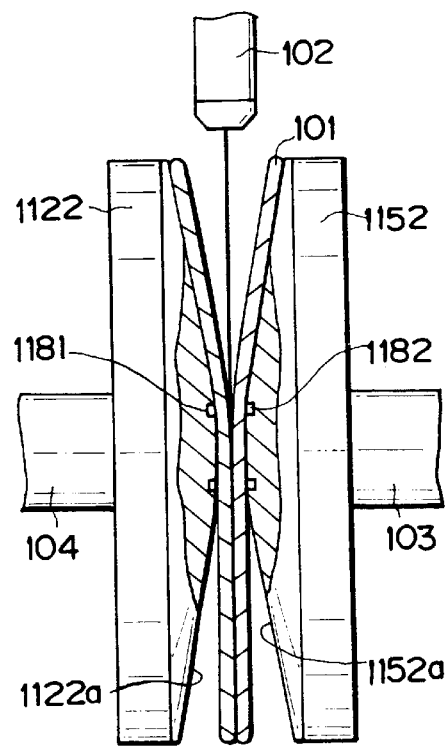
FIG. 33 is a sectional view showing another modification of the substrate holding portions according to the first example of the second embodiment.
Figure 34:
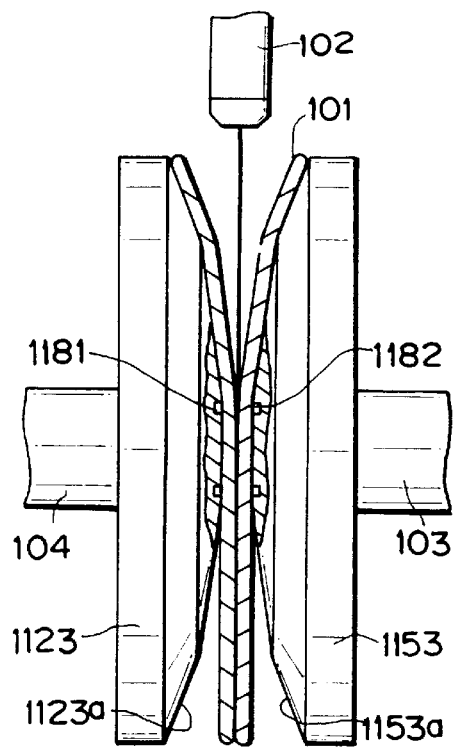
FIG. 34 is a sectional view showing still another modification of the substrate holding portions according to the first example of the second embodiment.
Figure 35:
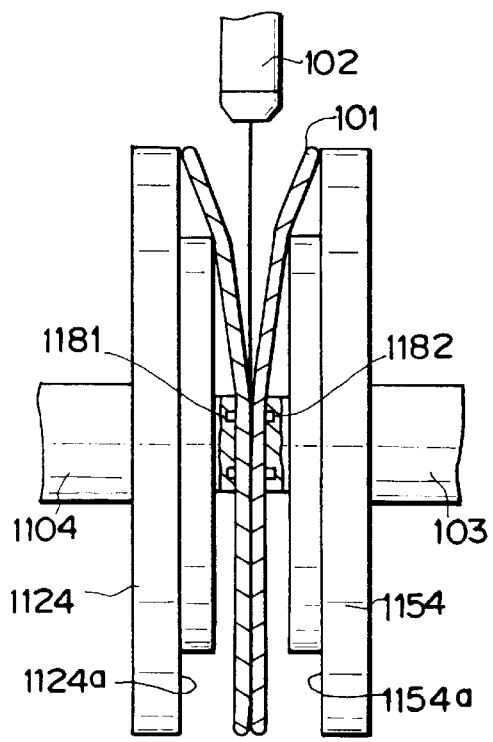
FIG. 35 is a sectional view showing still another modification of the substrate holding portions according to the first example of the second embodiment.

FIGS. 29 to 31 are views showing the arrangement of the substrate holding portions 1120 and 1150 according to the first example of the second embodiment of the present invention. FIG. 29 is a perspective view, FIG. 30 is a sectional view showing a state before separation processing, and FIG. 31 is a sectional view showing a state during separation processing.

The substrate holding portions 1120 and 1150 of this example have convex support surfaces 1120a and 1150a each formed from part of a spherical surface. The support surfaces 1120a and 1150a support the bonded substrate stack 101 while allowing it to warp and also limit excessive warp of the bonded substrate stack 101 in separation processing. A warp amount h is preferably set to be around 0.1 to 0.5 mm.

With the use of the separating apparatus 1000 having the substrate holding portions 1120 and 1150, separation progress from the side surface of the bonded substrate stack 101 to the vicinity of the center of the support surfaces 1120a and 1150a in about 30 sec after the start of jet injection into the bonded substrate stack 101 (separation processing). Two portions separated from the bonded substrate stack 101 are pressed against the support surfaces 1120a and 1150a by the pressure (separation force) of the jet medium injected into the bonded substrate stack 101, as shown in FIG. 31. As separation processing further progresses, the bonded substrate stack 101 is completely separated in about 2 min after the start of separation processing.

When the bonded substrate stack 101 is held as it is capable of warping, the separation force can be efficiently applied, so separation processing can be efficiently performed. In addition, when the warp amount of the bonded substrate stack 101 is limited, the separated substrates can be prevented from excessively warping, and the bonded substrate stack 101 can be prevented from breaking.

To distribute stress acting on the bonded substrate stack 101, the support surfaces 1120a and 1150a are preferably spherical. However, the contact surfaces need not always be spherical. As a modification of the substrate holding portions 1120 and 1150 of the first example, substrate holding portions each having a smooth convex surface will be described.

FIGS. 32 to 35 are sectional views showing modifications of the substrate holding portions 1120 and 1150. Substrate holding portions 1121 and 1151 shown in FIG. 32 have support surfaces 1121a and 1151a each made of a cone having a convex vertex. Substrate holding portions 1122 and 1152 shown in FIG. 33 have support surfaces 1122a and 1152a each made of a frustum of a cone. Substrate holding portions 1123 and 1153 shown in FIG. 34 have support surfaces 1123a and 1153a each made of several frustums forming a convex surface as a whole. Substrate holding portions 1124 and 1154 shown in FIG. 35 have support surfaces 1124a and 1154a each made of several columns forming a convex surface as a whole.

As shown in FIGS. 29 to 35, the substrate holding portion preferably has a diameter with which it can support the entire surface of the bonded substrate stack 101. When the diameter of the substrate holding portion is ⅔ that of the bonded substrate stack 101 or more, a satisfactory effect can be obtained. However, the present invention does not exclude a substrate holding portion having a diameter smaller than ½ that of the bonded substrate stack.

The substrate holding portion preferably has a disk shape. However, any other shape such as a radial or matrix shape may be used.

[Second Example of Substrate Holding Portion]

Figure 36:
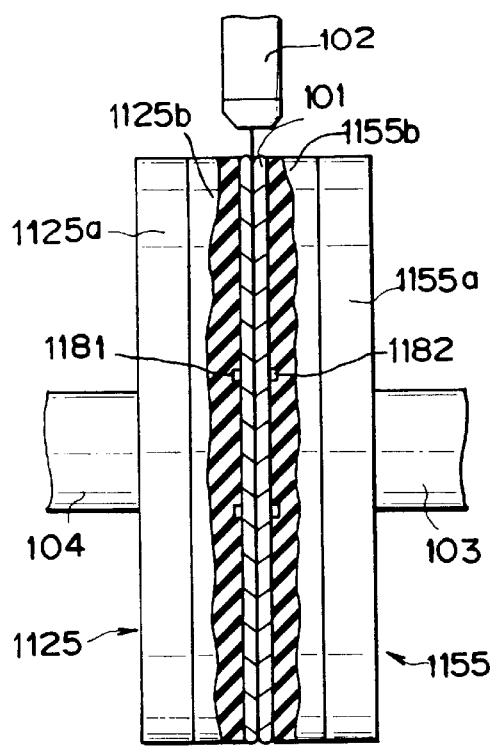
FIG. 36 is a sectional view showing a modification of substrate holding portions according to the second example of the second embodiment.
Figure 37:
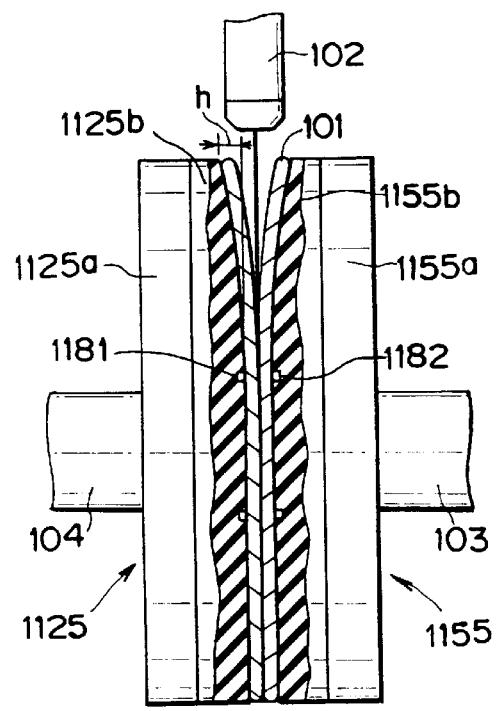
FIG. 37 is a sectional view showing another modification of the substrate holding portions according to the second example of the second embodiment.

FIGS. 36 and 37 are sectional views showing the arrangement of substrate holding portions according to the second example of the second embodiment of the present invention. FIG. 36 shows a state before separation processing. FIG. 37 shows a state during separation processing. Substrate holding portions 1125 and 1155 shown in FIGS. 36 and 37 replace the substrate holding portions 1120 and 1150 shown in FIG. 28, respectively.

In the substrate holding portions 1125 and 1155 of this example, disk-like support portions 1125b and 1155b of an elastic material (e.g., a rubber) are bonded to disk-like main bodies 1125a and 1155a, respectively. The support portions 1125b and 1155b support the bonded substrate stack 101 while allowing it to warp and also limit excessive warp of the bonded substrate stack 101 in separation processing. The warp amount h is preferably set to be around 0.1 to 0.5 mm.

With the use of the separating apparatus 1000 having the substrate holding portions 1125 and 1155, separation progress from the side surface of the bonded substrate stack 101 to the vicinity of the central portion in about 30 sec after the start of jet injection into the bonded substrate stack 101 (separation processing). Two portions separated from the bonded substrate stack 101 open to form a V shape due to the pressure (separation force) of the jet medium injected into the bonded substrate stack 101, as shown in FIG. 37. At this time, the separation force and the drag of the support portions 1125b and 1155b balance with the warp amount of the bonded substrate stack 101. As separation processing further progresses, the bonded substrate stack 101 is completely separated in about 2 in after the start of separation processing.

When the bonded substrate stack 101 is held as it is capable of warping, the separation force can be efficiently applied, so separation processing can be efficiently performed. In addition, when the warp amount of the bonded substrate stack 101 is limited, the separated substrates can be prevented from excessively warping, and the bonded substrate stack 101 can be prevented from breaking.

To distribute stress acting on the bonded substrate stack 101, the entire surfaces of the support portions 1125b and 1155b are preferably formed from an elastic material. However, the entire surfaces of the support portions need not always be made of an elastic material. In addition, the substrate holding portion preferably has a diameter with which it can support the entire surface of the bonded substrate stack 101. When the diameter of the substrate holding portion is 2/3 that of the bonded substrate stack 101 or more, a satisfactory effect can be obtained. Modifications of the substrate holding portions 1125 and 1155 of this example will be listed below.

Figure 38:
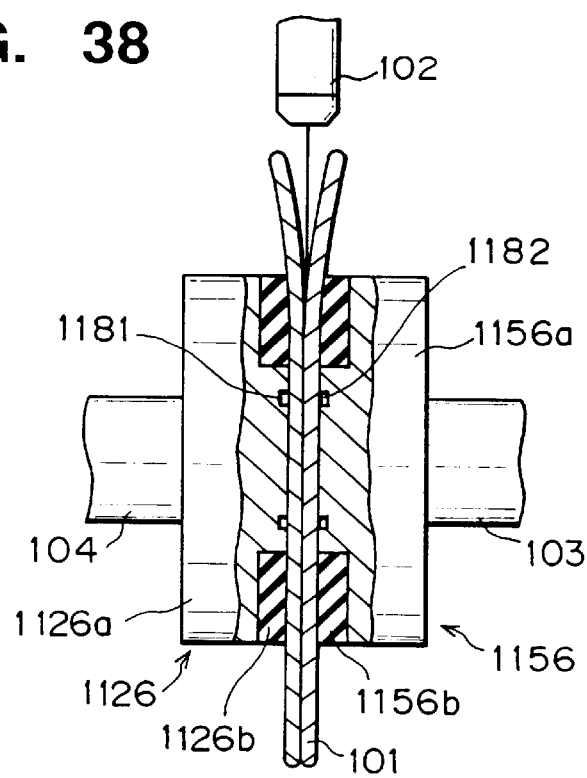
FIG. 38 is a sectional view showing still another modification of the substrate holding portions according to the second example of the second embodiment.
Figure 39:
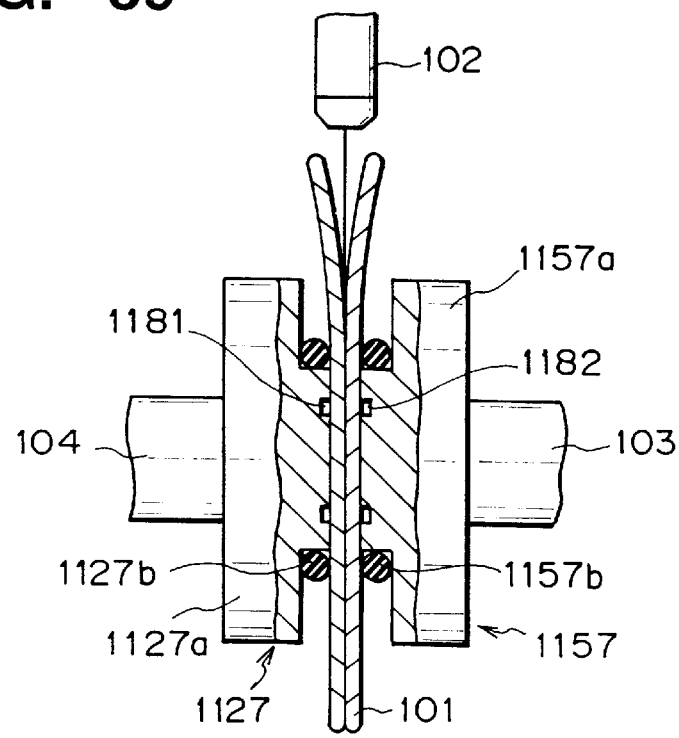
FIG. 39 is a sectional view showing still another modification of the substrate holding portions according to the second example of the second embodiment.
Figure 40:
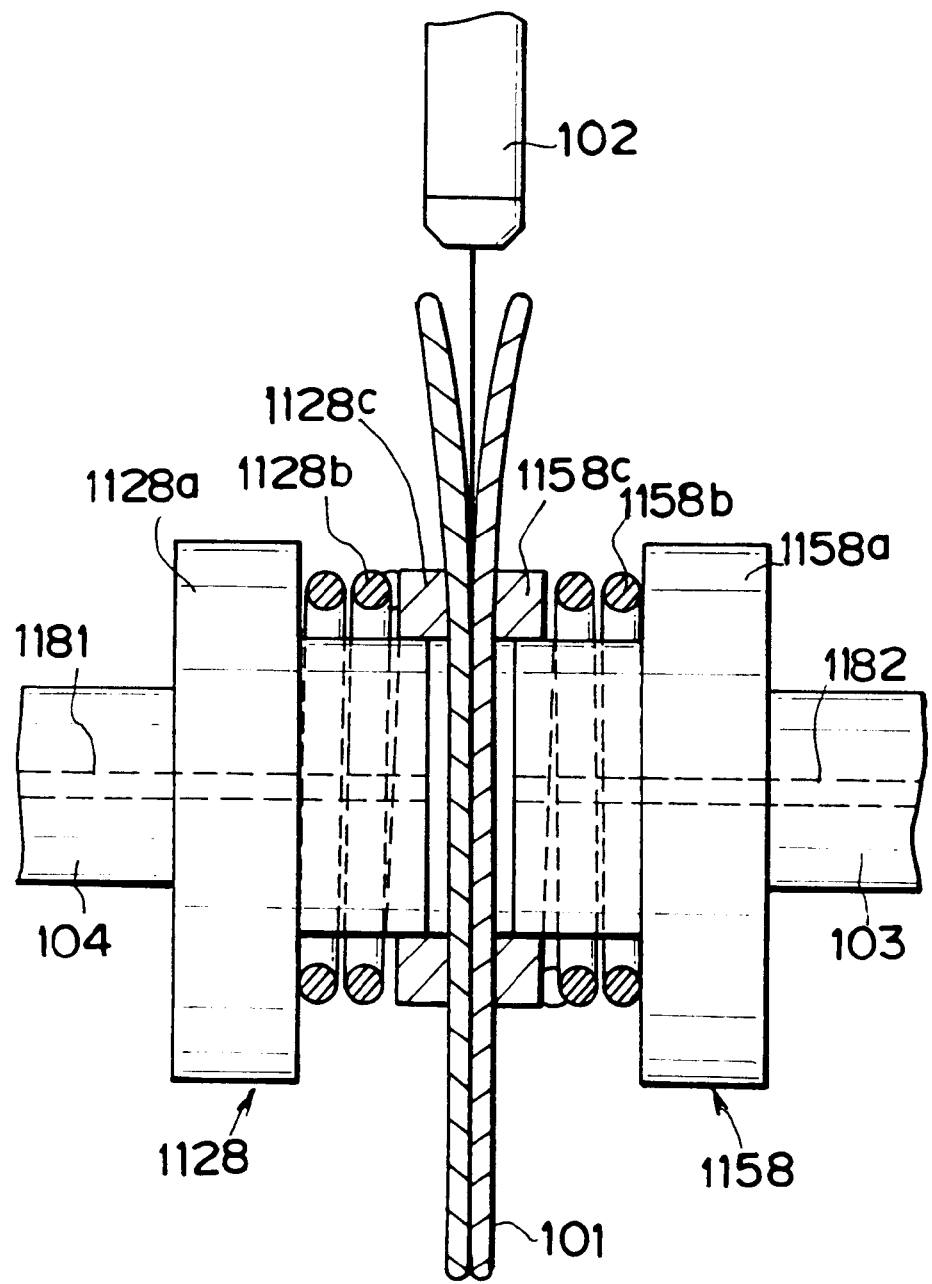
FIG. 40 is a sectional view showing still another modification of the substrate holding portions according to the second example of the second embodiment.

FIGS. 38 to 40 are sectional views showing modifications of the substrate holding portions 1125 and 1155. In substrate holding portions 1126 and 1156 shown in FIG. 38, annular second support portions 1126b and 1156b each consisting of an elastic material (e.g., a rubber) are fitted on disk-like first support portions 1126a and 1156a each having a convex section. In substrate holding portions 1127 and 1157 shown in FIG. 39, O-ring-like second support portions 1127b and 1157b each consisting of an elastic material (e.g., a rubber) are fitted on disk-like first support portions 1127a and 1157a each having a convex section. In substrate holding portions 1128 and 1158 shown in FIG. 40, coil springs 1128b and 1158b each having one end coupled to a corresponding one of main bodies 1128a and 1158a are fitted on the main bodies 1128a and 1158a each having a convex section, and annular support portions 1128c and 1158c each coupled to the other end of a corresponding one of the coil springs 1128b and 1158b are also fitted on the main bodies 1128a and 1158a.

The above separating apparatus can be used to separate not only a semiconductor substrate such as a bonded substrate stack but also various samples.

According to the preferred embodiment of the present invention, the efficiency of separation processing can be increased while preventing damages to the sample to be separated.

In addition, according to the preferred embodiment of the present invention, a satisfactory substrate can be manufactured.

Third Embodiment

When this separating apparatus is to be applied to manufacture a semiconductor substrate such as the above-described SOI substrate, pure water or ultrapure water with minimum impurity metals or particles is preferably used as a jet medium. However, if the substrate is to be cleaned after separation, water having low purity may be used as a jet medium.

The jet medium is not limited to water. It is possible to use an organic solvent such as an alcohol, an acid such as fluoric acid or nitric acid, an alkali such as potassium hydroxide, a gas such as air, nitrogen gas, carbonic acid gas, rare gas, or an etching gas, or a plasma.

In this separating apparatus, a jet is ejected to the porous layer (separation region) exposed to the side surface of the bonded substrate stack, thereby removing the porous layer from the peripheral portion to the central portion. With this process, the bonded substrate stack is separated into two substrates by removing only the separation region with low mechanical strength without damaging the main body. Even when the side surface of the bonded substrate stack is covered with some thin layer, and the porous layer is not exposed, the thin layer can be removed by the jet, so the bonded substrate stack can be separated by the above-described method.

At the outer peripheral portion of the bonded substrate stack, a V-shaped (concave) groove is preferably formed along the side surface. FIGS. 27A and 27B are views showing a force acting on the bonded substrate stack. FIG. 27A shows a bonded substrate stack having a V-shaped groove 22. FIG. 27B shows a bonded substrate stack having no V-shaped groove.

As shown in FIG. 27A, in the bonded substrate stack having the V-shaped groove 22, a force (to be referred to as a separation force hereinafter) is applied outward from the center of the bonded substrate stack, as indicated by an arrow 23. On the other hand, as shown in FIG. 27B, in the bonded substrate stack with a convex side surface, a force is applied inward from the side surface of the bonded substrate stack, as indicated by an arrow 24. In the bonded substrate stack having a convex side surface, the separation force does not act unless the side surface of a porous layer 12 as the separation region is removed by a jet 21.

Even when a thin film is formed on the side surface of the bonded substrate stack, the separation force acts on the bonded substrate stack as far as the bonded substrate stack has the V-shaped groove 22, as shown in FIG. 27A, so the thin layer can be easily broken.

To effectively use the jet, a width W1 of the shaped groove 22 is preferably equal to or larger than a diameter d of the jet 21. For example, assume that each of a first substrate (10) and a second substrate (20) has a thickness of about 1 mm, and the bonded substrate stack has a thickness of about 2 mm. Since the width W1 of the V-shaped groove 22 is normally around 1 mm, the diameter of the jet is preferably 1 mm or less.

Since a general water jet apparatus uses a jet with a diameter around 0.1 to 0.5 mm, such a general water jet apparatus (e.g., a water jet nozzle) can be used.

The nozzle for ejecting a jet can have not only a circular shape but any other shapes. For example, when a slit-like nozzle is employed to eject a jet having a long rectangular section, the jet can be efficiently injected into the separation region (inserted between the two substrates).

The jet ejection conditions are determined in accordance with the type of separation region (e.g., a porous layer) or the shape of the side surface of the bonded substrate stack. Important parameters as the jet ejection conditions are the pressure applied to the jet medium, the jet scanning speed, the width or diameter of the nozzle (the nozzle diameter is almost the same as the jet diameter), the nozzle shape, the distance between the nozzle and the separation region, and the flow rate of the jet medium.

The following techniques are used to separate the bonded substrate stack. 1) The jet is injected into the bonding interface parallel to the bonding interface while the nozzle is scanned along the bonding interface. 2) The jet is injected into the bonding interface parallel to the bonding interface while the bonded substrate stack is scanned. 3) The jet is injected into the bonding interface parallel to the bonding interface and simultaneously scanned in a fan shape at a pivot near the nozzle. 4) The jet is injected into the bonding interface parallel to the bonding interface while the bonded substrate stack is rotated about nearly the center of the bonded substrate stack (this technique is particularly effective when the bonded substrate stack has a disk shape). The jet need not always be ejected to be perfectly parallel to the bonding interface.

The bonded substrate stack is separated not only when the pore walls break by the cutting force, i.e., the impact force of the jet colliding against the pore walls in the porous layer but also when the pore walls break by the pressure of jet medium injected into the porous layer. To prevent damages to the substrate, the separation force acting in the axial direction of the bonded substrate stack is preferably set to be several hundred gf/cm$^2$.

To separate the bonded substrate stack using only the cutting force of jet, the jet must be ejected at a high pressure of 1,000 kg/cm$^2$ or more. If the bonded substrate stack is separated by such a high-pressure jet, the substrate may be damaged. The thickness of the bonded substrate stack is preferably about 0.5 to 1.0 mm. However, when such a thin bonded substrate stack is to be separated by a high-pressure jet, and the porous layer locally has portions with high strength, the jet pressure (separation force) may abruptly increase to break the substrate because the discharge path of the jet medium is not ensured.

Preferably, a jet with a low pressure of approximately 500 kgf/cm$^2$ is used, and the shortage of cutting force is compensated for by the separation force. With this method, damages to the substrate can be prevented at a relatively high ratio.

However, to prevent damages to the substrate, the shape or characteristics of the member to be separated is preferably taken into consideration. For example, when the bonded substrate stack is to be separated to the first substrate (10') side and the second substrate (10"+20) side, the bonded substrate stack holding method in separation processing is preferably optimized in consideration of the shape or characteristics (especially, the strength) of the substrates. More specifically, the first substrate (10) is formed through various processes (including high-temperature process) such as anodizing, formation of an epitaxial layer, and oxidation and therefore readily breaks as compared to the second substrate (20). If the substrate is used again as the first substrate (10) by removing the porous layer remaining on the surface of the first substrate after separation, the first substrate becomes thinner by about 30 μm every time an SOI substrate is manufactured. For this reason, as the number of times of reuse increases, the first substrate breaks during separation processing with higher probability.

In this embodiment, a separating apparatus is disclosed, in which the deflection amount by the separation force of the jet is made small for one of members to be separated, which has low strength and readily breaks, to prevent the member from breaking, and the deflection amount by the separation force of the jet is made large for a member which has high strength and hardly breaks to increase the efficiency of discharging the jet medium from the separation region (inside the member).

[Arrangement of Separating Apparatus]

A specific arrangement of the separating apparatus according to the third embodiment of the present invention will be described below with reference to FIGS. 42 to 44.

The separating apparatus of this embodiment is suitable to separate a bonded substrate stack having a porous layer or microcavity layer as an internal fragile structure. This separating apparatus can also be used to separate another member having an internal fragile structure. In this case, the building elements of the separating apparatus must obviously be appropriately modified in accordance with the shape of the member to be separated.

Figure 42:
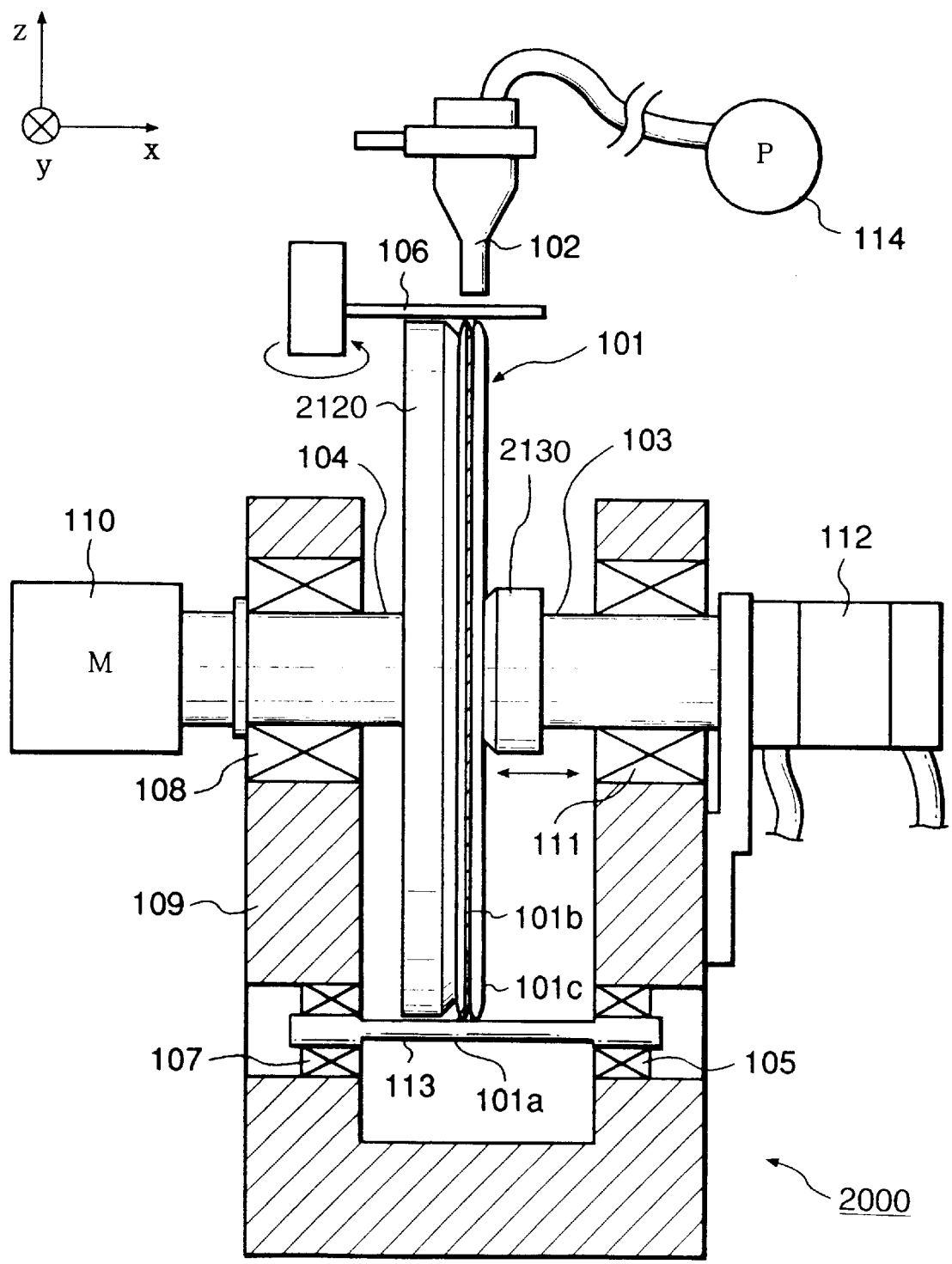
FIG. 42 is a view showing the schematic arrangement of a separating apparatus according to the third embodiment of the present invention.

FIG. 42 is a view schematically showing the arrangement of the separating apparatus according to the third embodiment of the present invention. FIG. 43 is a perspective view showing part of the separating apparatus shown in FIG. 42. FIG. 44 is a view schematically showing separation processing.

A separating apparatus 2000 has substrate holding portions 2120 and 2130 having vacuum chuck mechanisms. A bonded substrate stack 101 is sandwiched by the substrate holding portions 2120 and 2130 and held. The substrate holding portion 2120 comes into contact with the bonded substrate stack 101 in a large area. The substrate holding portion 2130 comes into contact with the bonded substrate stack 101 in a small area. With this structure, the deflection amount becomes small or no deflection occurs on one side of the bonded substrate stack 101 while the deflection amount in separation processing is made relatively large on the other side.

The bonded substrate stack 101 has a porous layer 101b as an internal fragile structure and is separated into a first substrate 101a and a second substrate 10c at the porous layer 101b by the separating apparatus 2000. The first substrate 101a corresponds to the above-described first substrate (10'), and the second substrate 101c corresponds to the above-described second substrate (10"+20).

As described above, the first substrate 101a is formed through various processes (including high-temperature process) such as anodizing, formation of an epitaxial layer, and oxidation and therefore readily breaks as compared to the second substrate 10c. Therefore, when the first substrate 101a of the bonded substrate stack 101 is held by the substrate holding portion 2120 having a large-area holding surface, deflection of the first substrate 101a can be limited during separation processing and prevented from breaking. The second substrate 101c has a strength higher than that of the first substrate 101a and can withstand relatively large deflection. When the second substrate 101c is held by the substrate holding portion 2130 having a small-area holding surface, the substrate 101c can deflect to some extent in separation processing. With this structure, the jet medium injected between the substrates 101a and 101c can be efficiently discharged, and consequently, separation processing can be efficiently performed.

The substrate holding portion 2120 is coupled to one end of a rotary shaft 104 which is rotatably axially supported by a support base 109 through a bearing 108. The other end of the rotary shaft 104 is coupled to the rotary shaft of a motor 110. The rotational force generated by the motor 110 rotates the bonded substrate stack 101. The motor 110 rotates the rotary shaft 104 at a designated rotation speed in accordance with an instruction from a controller (not shown).

The substrate holding portion 2130 is coupled to one end of a rotary shaft 103 which is rotatably and slidably axially supported by the support base 109 through a bearing 111. The other end of the rotary shaft 103 is coupled to an air cylinder 112 fixed on the support base 109. When the air cylinder 112 pushes the rotary shaft 103, the bonded substrate stack 101 is pressed by the substrate holding portion 2130.

To limit the deflection amount of the first substrate 101a to an amount as small as possible, the diameter of the chucking surface of the substrate holding portion 2120 is preferably made equal to or larger than the diameter of the bonded substrate stack 101, and additionally, the chucking surface is preferably made flat to support the entire surface of the first substrate 101a. However, the shape of the chucking surface of the substrate holding portion 2120 is not limited to this. The chucking surface may be a curved surface such as a spherical surface or have a smaller area than the bonded substrate stack 101. That is, the shape of the chucking surface of the substrate holding portion 2120 is determined in accordance with the allowable deflection amount of the first substrate 101a.

On the other hand, the shape of the chucking surface of the substrate holding portion 2130 is determined within the allowable deflection amount range of the second substrate 101*c* such that the deflection amount of the second substrate 101*c* becomes larger than that of the first substrate 101*a*.

The substrate holding portions 2120 and 2130 are present on the same rotary axis. The substrate holding portions 2120 and 2139 can be detached from the rotary shafts 104 and 103, respectively. The substrate holding portions 2120 and 2130 have vacuum chucking grooves on their holding surfaces, These grooves communicate with vacuum lines extending through the rotary shafts 104 and 103, respectively. These vacuum lines are coupled to external vacuum lines through, e.g., rotary vacuum joints. The external vacuum lines have solenoid valves. By controlling the solenoid valves, setting/removal of the substrate stack can be controlled.

Substrate separation processing using this separating apparatus 2000 will be described below.

To set the bonded substrate stack 101 in the separating apparatus 2000, first, the rotary shaft 103 is retracted by the air cylinder 112 to set a predetermined interval between the holding surfaces of the substrate holding portions 2120 and 2130. After the bonded substrate stack 101 is mounted on an alignment shaft 113, the air cylinder 112 pushes the rotary shaft 103, so the bonded substrate stack 101 is pressed and held (the state shown in FIG. 42). The alignment shaft 113 is rotatably axially supported through bearings 105 and 107.

In this embodiment, the bonded substrate stack 101 is held not by vacuum chucking but by the pressing force of the air cylinder 112. The pressing force is preferably about 100 to 2000 gf. The bonded substrate stack 101 may be vacuum-chucked, as a matter of course.

A jet medium (e.g., water) is sent from a pump 114 to a jet nozzle 102, and processing waits until the jet ejected from the jet nozzle 102 stabilizes. When the jet stabilizes, a shutter 106 is opened to inject the jet into the separation region of the bonded substrate stack 101, and at the same time, the bonded substrate stack 101 is rotated by the motor 110. At this time, the rotary shaft 104, substrate holding portion 2120, bonded substrate stack 101, substrate holding portion 2130, and rotary shaft 103 integrally rotate. The jet nozzle 102 is attached to a position adjustment mechanism (e.g., an X-Y stage), so the position from which the jet is injected into the bonded substrate stack 101 can be adjusted by the position adjustment mechanism.

When the jet is injected, a separation force due to the pressure of jet medium continuously injected into the porous layer 101*b* as a fragile structure acts on the bonded substrate stack 101 to break the porous layer 101*b* which connects the substrates 101*a* and 101*c*. At this time, the substrates 101*a* and 101*c* deflect in the allowable ranges of the substrate holding portions 2120 and 2130. In this separating apparatus 2000, the deflection amount of the substrate 101*a* is relatively small, and that of the substrate 101*c* is relatively large.

With this processing, the bonded substrate stack 101 is separated into two substrates in about 2 min.

When the bonded substrate stack 101 is separated into two substrates, the shutter 106 is closed, and the operation of pump 114 is stopped. By stopping rotation of the motor 110 and controlling the above-described electromagnetic valves, the separated substrates 101*a* and 110*c* are vacuum-chucked by the substrate holding portions 2120 and 2130.

When the air cylinder 112 retracts the rotary shaft 103, the surface tension of the jet medium (e.g., water) is cut off to split the two physically separated substrates 101*a* and 101*c* to both sides.

Modifications of the substrate holding portion of the separating apparatus 2000 will be described next.

[First Modification]

Figure 43:
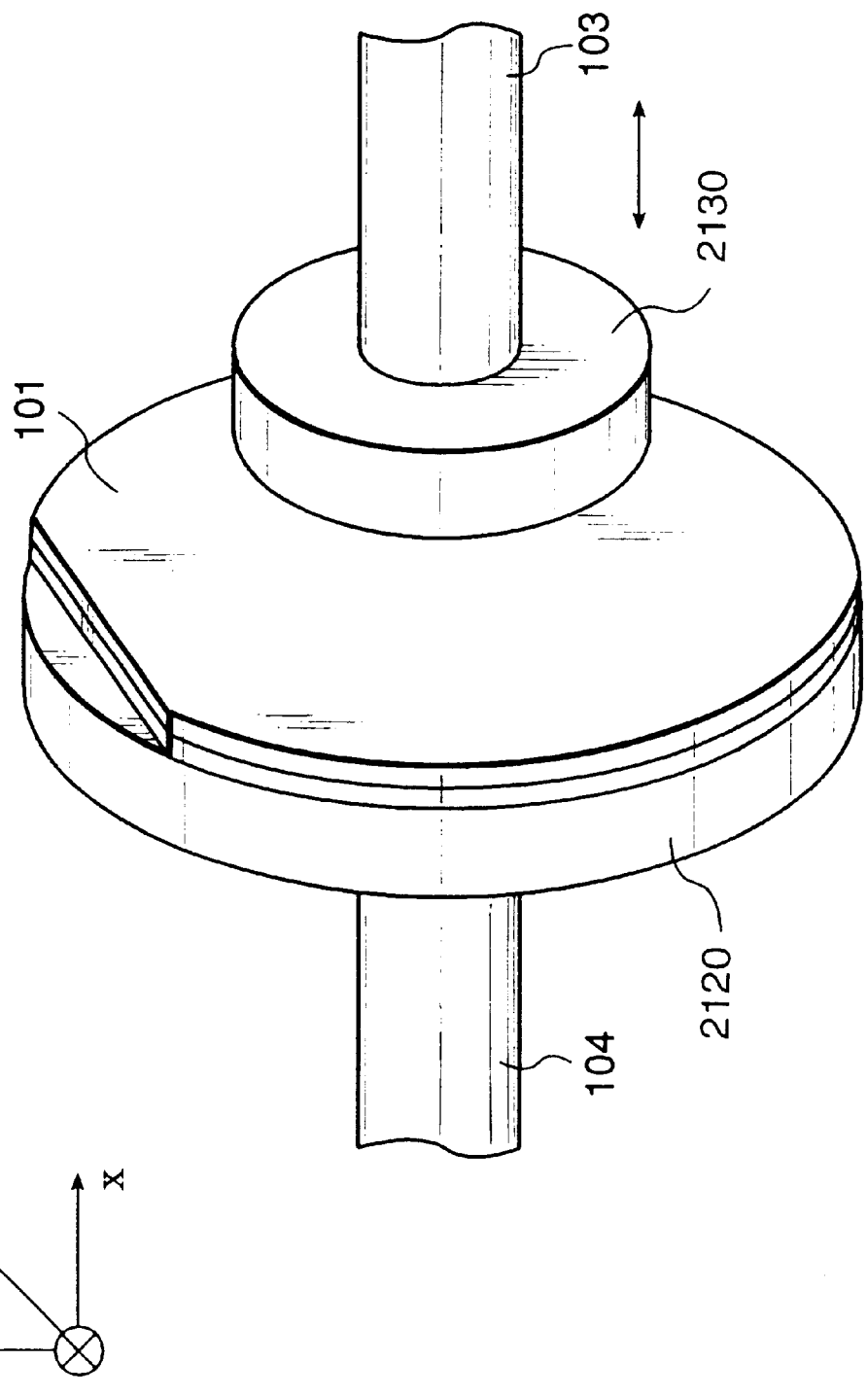
FIG. 43 is a perspective view of part of the separating apparatus shown in FIG. 42.
Figure 44:
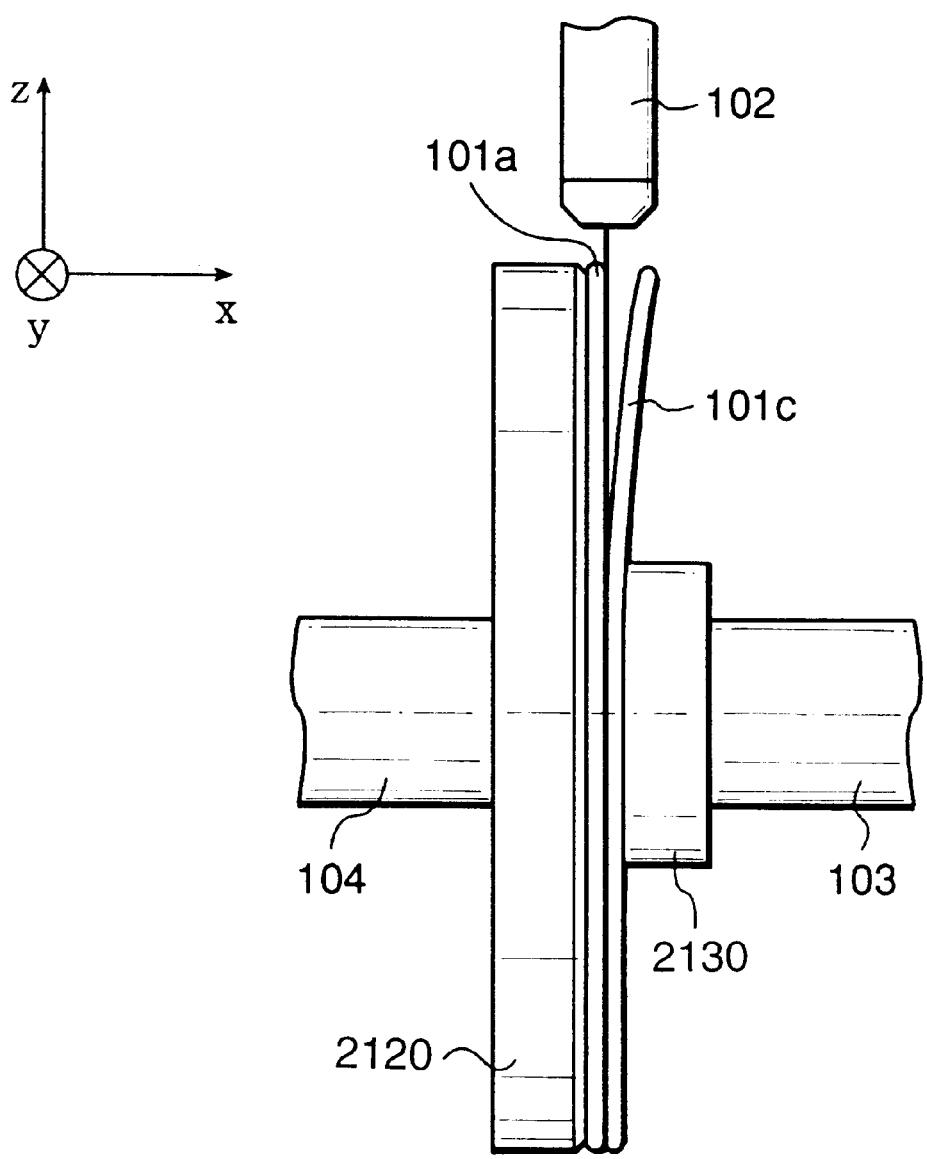
FIG. 44 is a view schematically showing separation processing.
Figure 45:
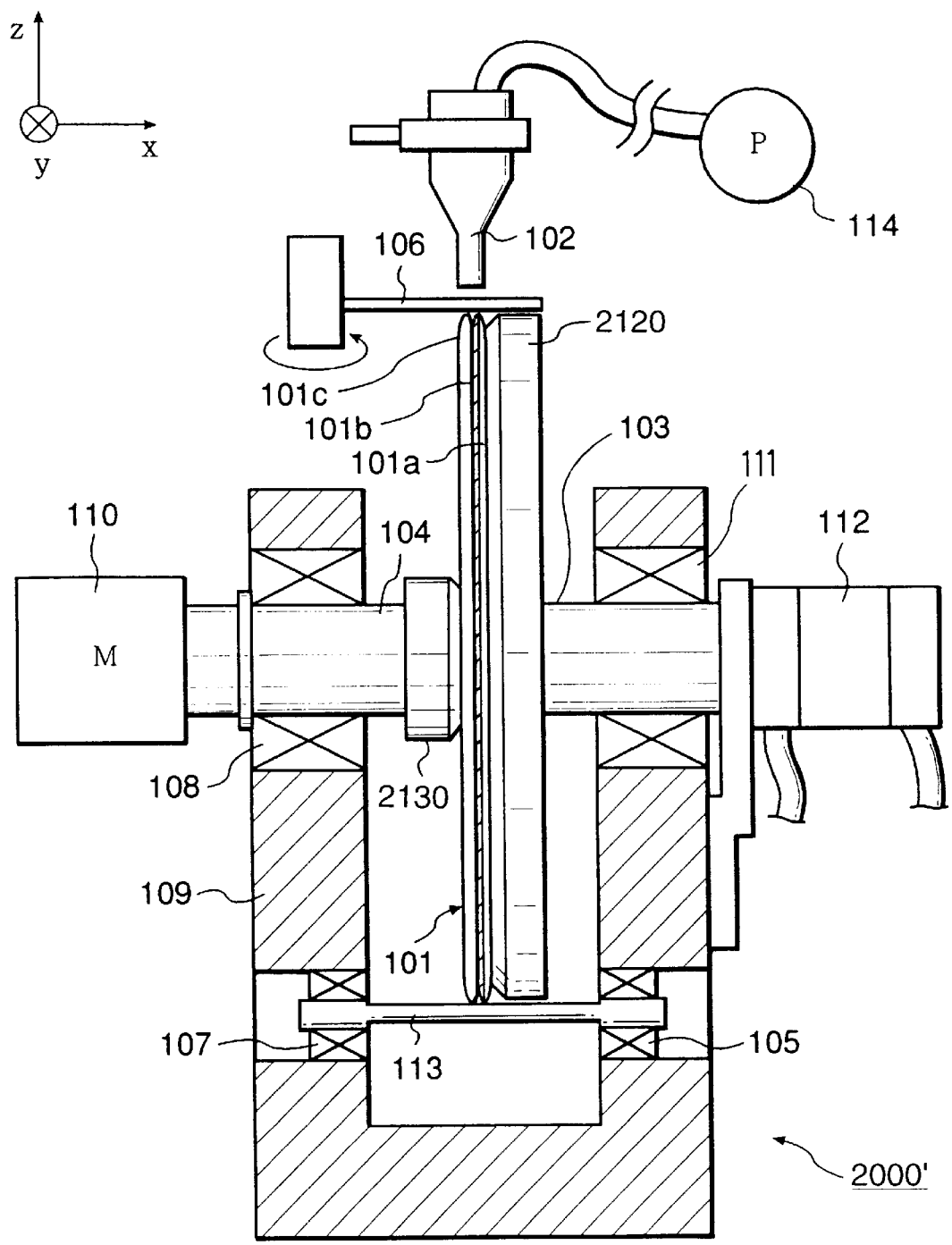
FIG. 45 is a view showing the schematic arrangement of a separating apparatus of the first modification.

In the separating apparatus of this modification, the substrate holding portions 2120 and 2130 of the separating apparatus 2000 shown in FIGS. 42 to 44 are replaced with each other. FIG. 45 is a view showing the schematic arrangement of a separating apparatus 2000' of this modification.

In this separating apparatus 2000', the substrate holding portion 2120 holds the first substrate 101*a* side of the bonded substrate stack 101, and the substrate holding portion 2130 holds the second substrate 101*c*. That is, in the separating apparatus 2000', the bonded substrate stack 101 is held such that the second substrate 101*c* is positioned on the side of the rotary shaft 104 whose horizontal position is fixed.

This separating apparatus 2000' is suitable to reuse the first substrate 101*a* after separation as the first substrate (10) by removing the porous layer 101*b* remaining on the surface of the substrate 101*a*. The reason for this is as follows.

When the first substrate 101*a* is to be reused, the first substrate 101*a* becomes thinner in accordance with the number of times of reuse. For this reason, when separation processing is to be efficiently and appropriately performed in the separating apparatus 2000 shown in FIG. 42, the jet nozzle 102 must be located immediately above the separation region of the bonded substrate stack 101 for every separation processing. If the position of the jet nozzle 102 is fixed, the jet may not be injected into the center of the porous layer 101*b* to damage the substrates 101*a* and 10*c*.

However, in the separating apparatus 2000' of this modification, as far as the bonded substrate stack 101 whose second substrate 101*c* has a predetermined thickness is to be processed, the positional relationship between the porous layer 101*b* and the jet nozzle 102 does not change even when the position of the jet nozzle 102 is fixed. This is because the position of the substrate holding portion 2130 is fixed, and the second substrate 101*c* held by the substrate holding portion 2130 has a predetermined thickness.

[Second Modification]

Figure 46:
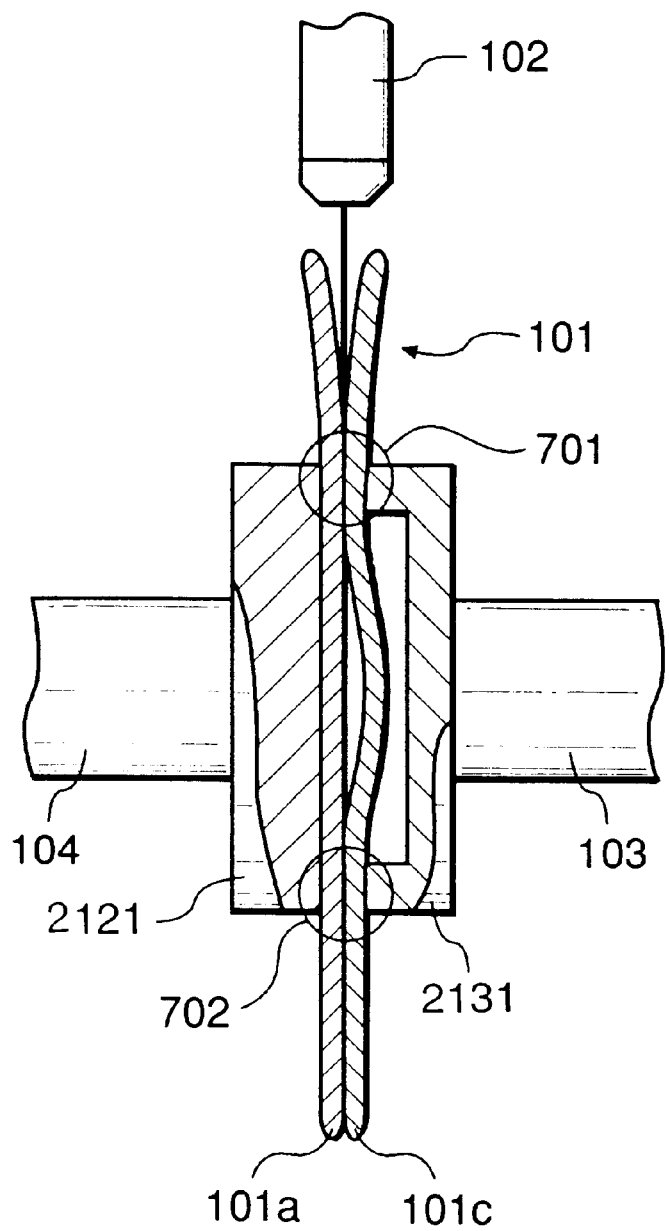
FIG. 46 is a view showing the schematic arrangement of substrate holding portions of a separating apparatus of the second modification.

In this modification, the structure of each substrate holding portion of the separating apparatus 2000 shown in FIGS. 42 to 44 is modified. FIG. 46 is a view showing the schematic arrangement of the substrate holding portions of the separating apparatus of this modification. In this separating apparatus, a substrate holding portion 2121 having an almost circular chucking surface holds the first substrate 101*a* side of the bonded substrate stack 101, and a substrate holding portion 2131 having an almost annular chucking surface holds the second substrate 101*c* side of the bonded substrate stack 101.

The substrate holding portions 2121 and 2131 of this modification limit the deflection amounts of the first substrate 101*a* and that of the second substrate 101*c* in the allowable deflection amount ranges, respectively, and increase the efficiency of separation processing while preventing damages to the substrates 101*a* and 101*c*.

Since the diameter of the substrate holding portion 2121 is smaller than the bonded substrate stack 101, the first substrate 101*a* deflects while warping at its outer peripheral portion in separation processing. The holding surface of the substrate holding portion 2121 may be a flat surface or a curved surface such as a spherical surface. On the other hand, since the substrate holding portion 2131 has an annular holding surface, the substrate 101*c* deflects while corrugating forming "nodes" near the chucking surface (701 and 702 in FIG. 46) and "antinodes" at the outer peripheral portion and central portion. When the substrate holding portions 2121 and 2131 with shapes allowing the second substrate 101c to deflect while corrugating are employed, the jet medium injected into the bonded substrate stack 101 can be efficiently discharged.

Separation processing was executed using this separating apparatus. After the jet was injected into the bonded substrate stack 101, the jet proceeded to the holding surface (701 in FIG. 46) of the substrate holding portion 2131 in about 30 sec. After this, the jet proceeded to the holding surface (702 in FIG. 46) on the opposite side after about 30 sec, and the substrate 101c deflected while corrugating, as shown in FIG. 46. The bonded substrate stack 101 was separated into two substrates in about 3 min.

In separation processing of the bonded substrate stack 101, the jet medium is hardly discharged at the central portion of bonded substrate stack. For this reason, the pressure of the jet medium readily increases, so the central portion is easily damaged as compared to the peripheral portion. Hence, when only the second substrate 101c with high strength is allowed to deflect while expanding to the substrate holding portion 2131 side at its central portion, as in the substrate holding portions of this modification, the discharge path of the jet medium can be ensured while preventing damages to the first substrate 101a with low strength.

[Third Modification]

In this modification, the structures of the substrate holding portions 2120 and 2130 of the separating apparatus 2000 shown in FIGS. 42 to 44 are modified. FIG. 47 is a view showing a modification of the substrate holding portion 2120 for holding the first substrate side. FIG. 48 is a view showing a modification of the substrate holding portion 2130 for holding the second substrate side.

As shown in FIG. 47, a substrate holding portion 2122 for holding the first substrate 101a side has a diameter slightly smaller than that of the bonded substrate stack 101 and a flat chucking surface. Therefore, the first substrate 101a deflects while warping at its outer peripheral portion in separation processing.

On the other hand, as shown in FIG. 48, a substrate holding portion 2132 has a plurality of projecting chuck portions 2132a. The second substrate 101c side of the bonded substrate stack 101 is held by the tips of the plurality of chuck portions 2132a. When the second substrate 101c side is held by the projecting suction portions 2132a, the substrate 101c can easily deflect, and the jet medium injected into the bonded substrate stack 101 can be efficiently discharged. To stably hold the bonded substrate stack 101, the number of projecting chuck portions 2132a is preferably three or more.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating a plate-like sample having an internal fragile layer at the fragile layer comprising:
   a jet unit for ejecting a fluid to the sample; and
   a pair of holding portions opposing each other to sandwich and hold the sample,
   wherein said pair of holding portions allow the sample to warp as the sample is divided into two parts by a pressure of the fluid ejected from said jet unit and injected into the sample and simultaneously limit a warp amount.

2. The apparatus according to claim 1, wherein at least one of said pair of holding portions has a smooth convex support surface, and the sample is held by said support surface.

3. The apparatus according to claim 2, wherein said support surface substantially comprises part of a spherical surface.

4. The apparatus according to claim 2, wherein said support surface comprises a surface formed by a cone with a convex vertex.

5. The apparatus according to claim 2, wherein said support surface substantially comprises a surface formed by a frustum of a cone.

6. The apparatus according to claim 2, wherein said support surface comprises a smooth convex surface formed by a stack of several frustums.

7. The apparatus according to claim 2, wherein said support surface comprises a convex surface formed by a stack of several columns.

8. The apparatus according to claim 1, wherein at least one of said pair of holding portions includes an elastic member and deforms due to a force inflicted by the sample.

9. The apparatus according to claim 1, wherein at least one of said holding portions has a support portion partially consisting of an elastic material, and the sample is held by said support portion.

10. The apparatus according to claim 1, wherein at least one of said holding portions has an elastic member at a portion which can contact the sample.

11. The apparatus according to claim 1, wherein at least one of said holding portions has an annular support portion consisting of an elastic member.

12. The apparatus according to claim 1, wherein at least one of said holding portions has a support portion coupled to a main body via an elastic member.

13. The apparatus according to claim 1, further comprising a rotary mechanism for rotating said holding portion about a shaft perpendicular to a surface of the sample.

14. The apparatus according to claim 1, further comprising an adjustment mechanism for adjusting an interval between said pair of holding portions.

15. The apparatus according to claim 14, wherein in separating the sample by the fluid, said adjustment mechanism presses the sample to adjust the interval between said pair of holding portions.

16. The apparatus according to claim 14, wherein in separating the sample by the fluid, said adjustment mechanism maintains a substantially constant interval between said pair of holding portions.

17. The apparatus according to claim 1, wherein each of said pair of holding portions has a chuck mechanism for vacuum-chucking the sample.

18. The apparatus according to claim 1, wherein the sample comprises a substrate having a porous layer as the fragile layer.

19. A support apparatus for supporting a sample, which is used in a separating apparatus for separating a plate-like sample having an internal fragile layer at the fragile layer comprising:
   a pair of holding portions for sandwiching and holding the sample,
   wherein said pair of holding portions allow the sample to warp as the sample is divided into two parts by a pressure of the fluid ejected from a jet unit arranged in said separating apparatus and injected into the sample and simultaneously limit a warp amount.

20. The apparatus according to claim 19, wherein at least one of said pair of holding portions has a smooth convex support surface, and the sample is held by said support surface.

21. The apparatus according to claim 20, wherein said support surface substantially comprises part of a spherical surface.

22. The apparatus according to claim 20, wherein said support surface comprises a surface formed by a cone with a convex vertex.

23. The apparatus according to claim 20, wherein said support surface substantially comprises a surface formed by a frustum of a cone.

24. The apparatus according to claim 20, wherein said support surface comprises a smooth convex surface formed by a stack of several frustums.

25. The apparatus according to claim 20, wherein said support surface comprises a convex surface formed by a stack of several columns.

26. The apparatus according to claim 19, wherein at least one of said pair of holding portions includes an elastic member and deforms due to a force inflicted by the sample.

27. The apparatus according to claim 19, wherein at least one of said holding portions has a support portion partially consisting of an elastic material, and the sample is held by said support portion.

28. The apparatus according to claim 19, wherein at least one of said holding portions has an elastic member at a portion which can contact the sample.

29. The apparatus according to claim 19, wherein at least one of said holding portions has an annular support portion consisting of an elastic member.

30. The apparatus according to claim 19, wherein at least one of said holding portions has a support portion coupled to a main body via an elastic member.

31. The apparatus according to claim 19, further comprising a rotary mechanism for rotating said holding portion about a shaft perpendicular to a surface of the sample.

32. The apparatus according to claim 19, further comprising an adjustment mechanism for adjusting an interval between said pair of holding portions.

33. The apparatus according to claim 32, wherein in separating the sample by the fluid, said adjustment mechanism presses the sample to adjust the interval between said pair of holding portions.

34. The apparatus according to claim 32, wherein in separating the sample by the fluid, said adjustment mechanism maintains a substantially constant interval between said pair of holding portions.

35. The apparatus according to claim 19, wherein each of said pair of holding portions has a chuck mechanism for vacuum-chucking the sample.

36. The apparatus according to claim 19, wherein the sample comprises a substrate having a porous layer as the fragile layer.

37. A separating method of separating a plate-like sample having an internal fragile layer at the fragile layer comprising the steps of:

transferring the sample to said separating apparatus of claim 1;

separating the sample at the fragile layer by said separating apparatus; and receiving the separated samples from said separating apparatus.

38. The method according to claim 37, wherein water is used as the fluid to be ejected from said jet unit.

39. A separating method of separating a substrate at a porous layer, the substrate being formed by bonding a non-porous layer side of a first substrate, in which the porous layer and the non-porous layer are sequentially formed on one surface, to a second substrate, wherein said separating apparatus of claim 1 is used for separation.

40. A substrate manufacturing method comprising the step of:

bonding a non-porous layer side of a first substrate, in which a porous layer and the non-porous layer are sequentially formed on one surface, to a second substrate; and separating the bonded substrates at the porous layer, wherein said separating apparatus of claim 1 is used in the separation step.

* * * * *

UNITED STATES PATENT AND TRADEMARK OFFICE
CERTIFICATE OF CORRECTION

PATENT NO.    : 6,521,078 B2                                                          Page 1 of 1
DATED         : February 18, 2003
INVENTOR(S)   : Kazutaka Yanagita et al.

It is certified that error appears in the above-identified patent and that said Letters Patent is hereby corrected as shown below:

Column 12,
Line 15, "12'is" should read -- 12' is --
Line 16, "101." should read -- 10'. --
Line 22, "removed with" should read -- removed. With --
Line 57, "single-crystal.Si" should read -- single-crystal Si --

Column 17,
Line 25, "115a" should read -- 151a --

Column 21,
Line 62, "111a" should read -- 101a --

Column 26,
Line 24, "the shaped" should read -- the V-shaped --

Column 28,
Line 15, "10c" should read -- 101c --
Line 24, "10c." should read -- 101c. --

Column 29,
Line 62, "110c" should read -- 101c --

Column 30,
Line 29, "10c." should read -- 101c. --

Signed and Sealed this

Twenty-eighth Day of October, 2003

JAMES E. ROGAN
*Director of the United States Patent and Trademark Office*